US011877080B2

(12) United States Patent
Liu et al.

(10) Patent No.: US 11,877,080 B2
(45) Date of Patent: *Jan. 16, 2024

(54) PIXEL SENSOR HAVING SHARED READOUT STRUCTURE

(71) Applicant: Meta Platforms Technologies, LLC, Menlo Park, CA (US)

(72) Inventors: Xinqiao Liu, Medina, WA (US); Song Chen, Redmond, WA (US); Tsung-Hsun Tsai, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/538,092

(22) Filed: Nov. 30, 2021

(65) Prior Publication Data

US 2022/0094872 A1 Mar. 24, 2022

Related U.S. Application Data

(63) Continuation of application No. 16/829,249, filed on Mar. 25, 2020, now Pat. No. 11,218,660.
(Continued)

(51) Int. Cl.
*H04N 25/75* (2023.01)
*H01L 27/146* (2006.01)
(Continued)

(52) U.S. Cl.
CPC ....... *H04N 25/75* (2023.01); *H01L 27/14643* (2013.01); *H04N 23/73* (2023.01);
(Continued)

(58) Field of Classification Search
CPC .... H04N 5/378; H04N 5/3745; H04N 5/2353; H01L 27/14643; G02B 27/0172; G02B 2027/0178
See application file for complete search history.

(56) References Cited

U.S. PATENT DOCUMENTS 5,844,512 A 12/1998 Gorin et al.
5,963,369 A 10/1999 Steinthal et al.
(Continued)

FOREIGN PATENT DOCUMENTS

CN 1490878 A 4/2004
CN 1728397 A 2/2006
(Continued)

OTHER PUBLICATIONS

Advisory Action dated Apr. 7, 2020 for U.S. Appl. No. 15/801,216, filed Nov. 1, 2019, 3 Pages.
(Continued)

*Primary Examiner* — Gevell V Selby
(74) *Attorney, Agent, or Firm* — Kilpatrick Townsend & Stockton LLP

(57) ABSTRACT

An apparatus comprises a first photodiode, a second photodiode, a quantizer, a memory, and a controller configured to: set a first exposure period in which the first photodiode generates a first charge; set a second exposure period in which the second photodiode generates a second charge, the second exposure period being set based on the first exposure period and at least one of: a first time associated with a read out operation of the memory to a second apparatus, or a second time associated with a quantization operation by the quantizer; perform, using the quantizer, the first quantization operation of the first charge to generate a first digital output; and perform, using the quantizer, a second quantization operation of the second charge to generate a second digital output.

20 Claims, 34 Drawing Sheets

Related U.S. Application Data

(60) Provisional application No. 62/824,301, filed on Mar. 26, 2019.

(51) Int. Cl.
  *H04N 23/73* (2023.01)
  *H04N 25/77* (2023.01)
  *G02B 27/01* (2006.01)

(52) U.S. Cl.
  CPC ......... *H04N 25/77* (2023.01); *G02B 27/0172* (2013.01); *G02B 2027/0178* (2013.01)

(56) References Cited

U.S. PATENT DOCUMENTS

| | | |
|---|---|---|
| 6,057,586 A | 5/2000 | Bawolek et al. |
| 6,384,905 B1 | 5/2002 | Barrows |
| 6,529,241 B1 | 3/2003 | Clark |
| 6,864,817 B1 | 3/2005 | Salvi et al. |
| 6,963,369 B1 | 11/2005 | Olding |
| 6,970,195 B1 | 11/2005 | Bidermann et al. |
| 6,972,791 B1 | 12/2005 | Yomeyama |
| 6,992,706 B2 | 1/2006 | Mabuchi et al. |
| 7,038,820 B1 | 5/2006 | Kindt et al. |
| 7,326,903 B2 | 2/2008 | Ackland |
| 7,362,365 B1 | 4/2008 | Reyneri et al. |
| 7,659,925 B2 | 2/2010 | Krymski |
| 7,830,292 B2 | 11/2010 | Kirsch |
| 7,956,914 B2 | 6/2011 | Xu |
| 8,144,227 B2 | 3/2012 | Kobayashi |
| 8,946,610 B2 | 2/2015 | Iwabuchi et al. |
| 9,001,251 B2 | 4/2015 | Smith et al. |
| 9,282,264 B2 | 3/2016 | Park et al. |
| 9,343,497 B2 | 5/2016 | Cho |
| 9,478,579 B2 | 10/2016 | Dai et al. |
| 9,832,370 B2 | 11/2017 | Cho et al. |
| 9,935,618 B1 | 4/2018 | Fenigstein |
| 9,955,091 B1 | 4/2018 | Dai et al. |
| 10,003,759 B2 | 6/2018 | Fan |
| 10,090,342 B1 | 10/2018 | Gambino et al. |
| 10,096,631 B2 | 10/2018 | Ishizu |
| 10,103,193 B1 | 10/2018 | Manabe et al. |
| 10,154,221 B2 | 12/2018 | Ogino et al. |
| 10,157,951 B2 | 12/2018 | Kim et al. |
| 10,321,081 B2 | 6/2019 | Watanabe et al. |
| 10,345,447 B1 | 7/2019 | Hicks |
| 10,594,974 B2 | 3/2020 | Ivarsson et al. |
| 10,726,627 B2 | 7/2020 | Liu |
| 10,834,344 B2 | 11/2020 | Chen et al. |
| 10,897,586 B2 | 1/2021 | Liu et al. |
| 10,903,260 B2 | 1/2021 | Chen et al. |
| 10,917,589 B2 | 2/2021 | Liu |
| 10,923,523 B2 | 2/2021 | Liu et al. |
| 10,931,884 B2 | 2/2021 | Liu et al. |
| 10,951,849 B2 | 3/2021 | Liu |
| 11,057,581 B2 | 7/2021 | Liu |
| 11,089,210 B2 | 8/2021 | Berkovich et al. |
| 11,089,241 B2 | 8/2021 | Chen et al. |
| 11,146,753 B2 | 10/2021 | Shimura et al. |
| 11,218,660 B1* | 1/2022 | Liu .................. H04N 5/37455 |
| 11,233,085 B2 | 1/2022 | Chen et al. |
| 11,393,867 B2 | 7/2022 | Chen et al. |
| 11,463,636 B2 | 10/2022 | Berkovich et al. |
| 11,595,602 B2 | 2/2023 | Gao et al. |
| 2002/0113886 A1 | 8/2002 | Hynecek |
| 2003/0001080 A1 | 1/2003 | Kummaraguntla et al. |
| 2003/0049925 A1 | 3/2003 | Layman et al. |
| 2004/0095495 A1 | 5/2004 | Inokuma et al. |
| 2004/0118994 A1 | 6/2004 | Mizuno |
| 2005/0046715 A1 | 3/2005 | Lim et al. |
| 2005/0206414 A1 | 9/2005 | Cottin et al. |
| 2005/0237380 A1 | 10/2005 | Kakii et al. |
| 2006/0023109 A1 | 2/2006 | Mabuchi et al. |
| 2006/0146159 A1 | 7/2006 | Farrier |
| 2007/0014019 A1 | 1/2007 | Mouli |
| 2007/0035653 A1 | 2/2007 | Hong et al. |
| 2007/0076109 A1 | 4/2007 | Krymski |
| 2007/0225560 A1 | 9/2007 | Avni et al. |
| 2008/0007731 A1 | 1/2008 | Botchway et al. |
| 2008/0042046 A1 | 2/2008 | Mabuchi |
| 2008/0042888 A1 | 2/2008 | Danesh |
| 2008/0088014 A1 | 4/2008 | Adkisson et al. |
| 2008/0226170 A1 | 9/2008 | Sonoda |
| 2009/0033588 A1 | 2/2009 | Kajita et al. |
| 2009/0040364 A1 | 2/2009 | Rubner |
| 2009/0066820 A1 | 3/2009 | Jiang et al. |
| 2009/0244328 A1 | 10/2009 | Yamashita |
| 2009/0244346 A1 | 10/2009 | Funaki |
| 2009/0245637 A1 | 10/2009 | Barman et al. |
| 2009/0303371 A1 | 12/2009 | Watanabe et al. |
| 2009/0321615 A1 | 12/2009 | Sugiyama et al. |
| 2010/0194956 A1 | 8/2010 | Yuan et al. |
| 2010/0232227 A1 | 9/2010 | Lee |
| 2010/0245647 A1 | 9/2010 | Honda et al. |
| 2010/0276572 A1 | 11/2010 | Iwabuchi et al. |
| 2011/0049589 A1 | 3/2011 | Chuang et al. |
| 2011/0122304 A1 | 5/2011 | Sedelnikov |
| 2011/0155892 A1 | 6/2011 | Neter et al. |
| 2011/0267533 A1 | 11/2011 | Hirose |
| 2011/0298074 A1 | 12/2011 | Funao |
| 2012/0016817 A1 | 1/2012 | Smith et al. |
| 2012/0068051 A1 | 3/2012 | Ahn et al. |
| 2012/0075511 A1 | 3/2012 | Tay |
| 2012/0105475 A1 | 5/2012 | Tseng |
| 2012/0105668 A1 | 5/2012 | Velarde et al. |
| 2012/0113119 A1 | 5/2012 | Massie |
| 2012/0200499 A1 | 8/2012 | Osterhout et al. |
| 2012/0212465 A1 | 8/2012 | White et al. |
| 2012/0273906 A1 | 11/2012 | Mackey et al. |
| 2012/0305751 A1 | 12/2012 | Kusuda |
| 2012/0327279 A1 | 12/2012 | Hashimoto et al. |
| 2013/0020466 A1 | 1/2013 | Ayers et al. |
| 2013/0068929 A1 | 3/2013 | Solhusvik et al. |
| 2013/0069787 A1 | 3/2013 | Petrou |
| 2013/0082313 A1 | 4/2013 | Manabe |
| 2013/0120615 A1 | 5/2013 | Hirooka et al. |
| 2013/0120625 A1 | 5/2013 | Ishii et al. |
| 2013/0148013 A1* | 6/2013 | Shiohara .............. H04N 23/672 348/362 |
| 2013/0187027 A1 | 7/2013 | Qiao et al. |
| 2013/0218728 A1 | 8/2013 | Hashop et al. |
| 2013/0221194 A1 | 8/2013 | Manabe |
| 2013/0248685 A1 | 9/2013 | Ahn |
| 2013/0300906 A1 | 11/2013 | Yan |
| 2014/0042582 A1 | 2/2014 | Kondo |
| 2014/0078336 A1 | 3/2014 | Beck et al. |
| 2014/0085523 A1 | 3/2014 | Hynecek |
| 2014/0247382 A1 | 9/2014 | Moldovan et al. |
| 2014/0313387 A1 | 10/2014 | Vogelsang et al. |
| 2014/0368687 A1 | 12/2014 | Yu et al. |
| 2015/0048427 A1 | 2/2015 | Hu et al. |
| 2015/0085134 A1 | 3/2015 | Novotny et al. |
| 2015/0097951 A1 | 4/2015 | Barrows |
| 2015/0201142 A1 | 7/2015 | Smith et al. |
| 2015/0309311 A1 | 10/2015 | Cho |
| 2015/0309316 A1 | 10/2015 | Osterhout et al. |
| 2015/0312461 A1 | 10/2015 | Kim et al. |
| 2015/0312557 A1 | 10/2015 | Kim |
| 2015/0358571 A1 | 12/2015 | Dominguez Castro et al. |
| 2015/0381911 A1 | 12/2015 | Shen et al. |
| 2016/0011422 A1 | 1/2016 | Thurber et al. |
| 2016/0018645 A1 | 1/2016 | Haddick et al. |
| 2016/0021302 A1 | 1/2016 | Cho et al. |
| 2016/0035770 A1 | 2/2016 | Ahn et al. |
| 2016/0037111 A1 | 2/2016 | Dai et al. |
| 2016/0078614 A1 | 3/2016 | Ryu et al. |
| 2016/0093659 A1 | 3/2016 | Nakamura et al. |
| 2016/0181298 A1 | 6/2016 | Wan et al. |
| 2016/0197117 A1 | 7/2016 | Nakata et al. |
| 2016/0198114 A1 | 7/2016 | Zhang et al. |
| 2016/0210785 A1 | 7/2016 | Balachandreswaran et al. |
| 2016/0225813 A1 | 8/2016 | Liao et al. |
| 2016/0255293 A1 | 9/2016 | Gesset |
| 2016/0276394 A1 | 9/2016 | Chou et al. |

(56) References Cited

U.S. PATENT DOCUMENTS

| | | | |
|---|---|---|---|
| 2017/0038504 A1* | 2/2017 | Tsai | H04N 23/673 |
| 2017/0039906 A1 | 2/2017 | Jepsen | |
| 2017/0041525 A1 | 2/2017 | Liu et al. | |
| 2017/0041571 A1 | 2/2017 | Tyrrell et al. | |
| 2017/0053962 A1 | 2/2017 | Oh et al. | |
| 2017/0059399 A1 | 3/2017 | Suh et al. | |
| 2017/0070691 A1 | 3/2017 | Nishikido | |
| 2017/0104946 A1 | 4/2017 | Hong | |
| 2017/0110493 A1 | 4/2017 | Yokogawa | |
| 2017/0154909 A1 | 6/2017 | Ishizu | |
| 2017/0163924 A1 | 6/2017 | Wan | |
| 2017/0201693 A1 | 7/2017 | Sugizaki et al. | |
| 2017/0228345 A1 | 8/2017 | Gupta et al. | |
| 2017/0264364 A1* | 9/2017 | Aoyama | H04B 10/1141 |
| 2017/0270664 A1 | 9/2017 | Hoogi et al. | |
| 2017/0272667 A1 | 9/2017 | Hynecek | |
| 2017/0272768 A1 | 9/2017 | Tall et al. | |
| 2017/0280031 A1 | 9/2017 | Price et al. | |
| 2017/0293799 A1 | 10/2017 | Skogo et al. | |
| 2017/0295338 A1 | 10/2017 | Geurts | |
| 2017/0310910 A1 | 10/2017 | Smith et al. | |
| 2017/0324917 A1 | 11/2017 | Mlinar et al. | |
| 2017/0338262 A1 | 11/2017 | Hirata | |
| 2017/0339327 A1 | 11/2017 | Koshkin et al. | |
| 2017/0350755 A1 | 12/2017 | Geurts | |
| 2018/0084164 A1 | 3/2018 | Hynecek et al. | |
| 2018/0115725 A1 | 4/2018 | Zhang et al. | |
| 2018/0115730 A1 | 4/2018 | Velichko | |
| 2018/0136471 A1 | 5/2018 | Miller et al. | |
| 2018/0143701 A1 | 5/2018 | Suh et al. | |
| 2018/0152650 A1 | 5/2018 | Sakakibara et al. | |
| 2018/0167575 A1 | 6/2018 | Watanabe et al. | |
| 2018/0176545 A1 | 6/2018 | Aflaki Beni | |
| 2018/0204867 A1 | 7/2018 | Kim et al. | |
| 2018/0213205 A1 | 7/2018 | Oh | |
| 2018/0224658 A1 | 8/2018 | Teller | |
| 2018/0227516 A1 | 8/2018 | Mo et al. | |
| 2018/0241953 A1 | 8/2018 | Johnson | |
| 2018/0270436 A1 | 9/2018 | Ivarsson et al. | |
| 2018/0276841 A1 | 9/2018 | Krishnaswamy et al. | |
| 2018/0278865 A1 | 9/2018 | Takado et al. | |
| 2018/0286896 A1 | 10/2018 | Kim et al. | |
| 2018/0348494 A1* | 12/2018 | Isono | G02B 21/02 |
| 2018/0376046 A1 | 12/2018 | Liu | |
| 2018/0376090 A1 | 12/2018 | Liu | |
| 2019/0035154 A1 | 1/2019 | Liu | |
| 2019/0043903 A1 | 2/2019 | Gambino et al. | |
| 2019/0046044 A1 | 2/2019 | Tzvieli et al. | |
| 2019/0052788 A1 | 2/2019 | Liu | |
| 2019/0056264 A1 | 2/2019 | Liu | |
| 2019/0057995 A1 | 2/2019 | Liu | |
| 2019/0058058 A1 | 2/2019 | Liu | |
| 2019/0098232 A1 | 3/2019 | Mori et al. | |
| 2019/0104283 A1 | 4/2019 | Wakeyama et al. | |
| 2019/0110039 A1 | 4/2019 | Linde et al. | |
| 2019/0123088 A1 | 4/2019 | Kwon | |
| 2019/0124285 A1 | 4/2019 | Otaka | |
| 2019/0141270 A1 | 5/2019 | Otaka et al. | |
| 2019/0149751 A1 | 5/2019 | Wise | |
| 2019/0172227 A1 | 6/2019 | Kasahara | |
| 2019/0191116 A1 | 6/2019 | Madurawe | |
| 2019/0246036 A1 | 8/2019 | Wu et al. | |
| 2019/0253650 A1 | 8/2019 | Kim | |
| 2019/0327439 A1 | 10/2019 | Chen et al. | |
| 2019/0331914 A1 | 10/2019 | Lee et al. | |
| 2019/0363118 A1 | 11/2019 | Berkovich et al. | |
| 2019/0379846 A1 | 12/2019 | Chen et al. | |
| 2020/0053299 A1 | 2/2020 | Zhang et al. | |
| 2020/0059589 A1 | 2/2020 | Liu et al. | |
| 2020/0186731 A1 | 6/2020 | Chen et al. | |
| 2020/0195875 A1 | 6/2020 | Berkovich et al. | |
| 2020/0217714 A1 | 7/2020 | Liu | |
| 2020/0228745 A1 | 7/2020 | Otaka | |
| 2020/0374475 A1 | 11/2020 | Fukuoka et al. | |
| 2020/0396399 A1 | 12/2020 | Tsai et al. | |
| 2021/0026796 A1 | 1/2021 | Graif et al. | |
| 2021/0099659 A1 | 4/2021 | Miyauchi et al. | |
| 2021/0144330 A1 | 5/2021 | Otaka | |
| 2021/0185264 A1 | 6/2021 | Wong et al. | |
| 2021/0227159 A1 | 7/2021 | Sambonsugi | |
| 2021/0368124 A1 | 11/2021 | Berkovich et al. | |

FOREIGN PATENT DOCUMENTS

| | | |
|---|---|---|
| CN | 1812506 A | 8/2006 |
| CN | 103207716 A | 7/2013 |
| CN | 103730455 A | 4/2014 |
| CN | 104125418 A | 10/2014 |
| CN | 104204904 A | 12/2014 |
| CN | 104469195 A | 3/2015 |
| CN | 104704812 A | 6/2015 |
| CN | 104733485 A | 6/2015 |
| CN | 104754255 A | 7/2015 |
| CN | 105706439 A | 6/2016 |
| CN | 106255978 A | 12/2016 |
| CN | 106791504 A | 5/2017 |
| CN | 207184624 U | 4/2018 |
| CN | 109298528 A | 2/2019 |
| EP | 1788802 A1 | 5/2007 |
| EP | 2037505 A1 | 3/2009 |
| EP | 2538664 A2 | 12/2012 |
| EP | 2804074 A2 | 11/2014 |
| EP | 2833619 A1 | 2/2015 |
| EP | 3229457 A1 | 10/2017 |
| EP | 3425352 A1 | 1/2019 |
| EP | 3425353 | 1/2019 |
| EP | 3439039 A1 | 2/2019 |
| EP | 3744085 A2 | 12/2020 |
| JP | 2002199292 A | 7/2002 |
| JP | 2002314875 A | 10/2002 |
| JP | 2003319262 A | 11/2003 |
| JP | 2005328493 A | 11/2005 |
| JP | 2006203736 A | 8/2006 |
| JP | 2007074447 A | 3/2007 |
| JP | 2010239337 A | 10/2010 |
| JP | 2010283525 A | 12/2010 |
| JP | 2011216966 A | 10/2011 |
| JP | 2012095349 A | 5/2012 |
| JP | 2013009087 A | 1/2013 |
| JP | 2013090127 A | 5/2013 |
| JP | 2013172203 A | 9/2013 |
| JP | 2014165733 A | 9/2014 |
| JP | 2015103998 A | 6/2015 |
| JP | 2016092661 A | 5/2016 |
| JP | 2017139820 A | 8/2017 |
| JP | 2017227686 A | 12/2017 |
| JP | 2017536780 A | 12/2017 |
| JP | 2018082261 A | 5/2018 |
| KR | 20120058337 A | 6/2012 |
| KR | 20140041492 A | 4/2014 |
| KR | 20160008267 A | 1/2016 |
| TW | 548962 B | 8/2003 |
| TW | 201106691 A | 2/2011 |
| TW | 201242353 A | 10/2012 |
| TW | 201705755 A | 2/2017 |
| TW | 201717381 A | 5/2017 |
| TW | 201720138 A | 6/2017 |
| TW | 201737696 A | 10/2017 |
| TW | 201921660 A | 6/2019 |
| TW | 774803 | 8/2022 |
| WO | WO-2006124592 A2 | 11/2006 |
| WO | 2013145753 A1 | 10/2013 |
| WO | WO-2014055391 A2 | 4/2014 |
| WO | WO-2016095057 A1 | 6/2016 |
| WO | WO-2017003477 A1 | 1/2017 |
| WO | WO-2017013806 A1 | 1/2017 |
| WO | 2017018215 A1 | 2/2017 |
| WO | WO-2017047010 A1 | 3/2017 |
| WO | WO-2017169446 A1 | 10/2017 |
| WO | WO-2019018084 A1 | 1/2019 |

(56) References Cited

FOREIGN PATENT DOCUMENTS

| | | |
|---|---|---|
| WO | WO-2019111528 A1 | 6/2019 |
| WO | WO-2019145578 A1 | 8/2019 |

OTHER PUBLICATIONS

Amir M.F., et al., "3-D Stacked Image Sensor With Deep Neural Network Computation," IEEE Sensors Journal, IEEE Service Center, New York, NY, US, May 15, 2018, vol. 18 (10), pp. 4187-4199, XP011681876.

Chuxi L., et al., "A Memristor-Based Processing-in-Memory Architechture for Deep Convolutional Neural Networks Approximate Computation," Journal of Computer Research and Development, Jun. 30, 2017, vol. 54 (6), pp. 1367-1380.

Communication Pursuant Article 94(3) dated Dec. 23, 2021 for European Application No. 19744961.4, filed Jun. 28, 2019, 8 pages.

Communication Pursuant Article 94(3) dated Jan. 5, 2022 for European Application No. 19740456.9, filed Jun. 27, 2019, 12 pages.

Corrected Notice of Allowability dated Feb. 3, 2021 for U.S. Appl. No. 16/566,583, filed Sep. 10, 2019, 2 Pages.

Corrected Notice of Allowability dated Apr. 9, 2021 for U.S. Appl. No. 16/255,528, filed Jan. 23, 2019, 5 Pages.

Corrected Notice of Allowability dated Dec. 11, 2020 for U.S. Appl. No. 16/566,583, filed Sep. 10, 2019, 2 Pages.

Corrected Notice of Allowability dated Jul. 26, 2021 for U.S. Appl. No. 16/707,988, filed Dec. 9, 2019, 2 Pages.

Extended European Search Report for European Application No. 19743908.6, dated Sep. 30, 2020, 9 Pages.

Final Office Action dated Dec. 3, 2021 for U.S. Appl. No. 17/072,840, filed Oct. 16, 2020, 23 pages.

Final Office Action dated Jul. 12, 2021 for U.S. Appl. No. 16/435,451, filed Jun. 7, 2019, 13 Pages.

Final Office Action dated Oct. 18, 2021 for U.S. Appl. No. 16/716,050, filed Dec. 16, 2019, 18 Pages.

Final Office Action dated Oct. 21, 2021 for U.S. Appl. No. 16/421,441, filed May 23, 2019, 23 Pages.

Final Office Action dated Dec. 26, 2019 for U.S. Appl. No. 15/801,216, filed Nov. 1, 2017, 5 Pages.

Final Office Action dated Jan. 27, 2021 for U.S. Appl. No. 16/255,528, filed Jan. 23, 2019, 31 Pages.

Final Office Action dated Jul. 28, 2021 for U.S. Appl. No. 17/083,920, filed Oct. 29, 2020, 19 Pages.

International Search Report and Written Opinion for International Application No. PCT/US2019/014044, dated May 8, 2019, 9 Pages.

International Search Report and Written Opinion for International Application No. PCT/US2019/014904, dated Aug. 5, 2019, 7 Pages.

International Search Report and Written Opinion for International Application No. PCT/US2019/019765, dated Jun. 14, 2019, 9 Pages.

International Search Report and Written Opinion for International Application No. PCT/US2019/034007, dated Oct. 28, 2019, 18 Pages.

International Search Report and Written Opinion for International Application No. PCT/US2019/039410, dated Sep. 30, 2019, 10 Pages.

International Search Report and Written Opinion for International Application No. PCT/US2019/048241, dated Jan. 28, 2020, 16 Pages.

International Search Report and Written Opinion for International Application No. PCT/US2019/066805, dated Mar. 6, 2020, 9 Pages.

International Search Report and Written Opinion for International Application No. PCT/US2019/066831, dated Feb. 27, 2020, 11 Pages.

International Search Report and Written Opinion for International Application No. PCT/US2020/044807, dated Sep. 30, 2020, 12 Pages.

International Search Report and Written Opinion for International Application No. PCT/US2020/058097, dated Feb. 12, 2021, 09 Pages.

International Search Report and Written Opinion for International Application No. PCT/US2020/059636, dated Feb. 11, 2021, 18 Pages.

International Search Report and Written Opinion for International Application No. PCT/US2021/031201, dated Aug. 2, 2021, 13 Pages.

International Search Report and Written Opinion for International Application No. PCT/US2021/033321, dated Sep. 6, 2021, 11 pages.

International Search Report and Written Opinion for International Application No. PCT/US2021/041775, dated Nov. 29, 2021, 14 pages.

Millet L., et al., "A 5500-Frames/s 85-GOPS/W 3-D Stacked BSI Vision Chip Based on Parallel In-Focal-Plane Acquisition and Processing," IEEE Journal of Solid-State Circuits, USA, Apr. 1, 2019, vol. 54 (4), pp. 1096-1105, XP011716786.

Non-Final Office Action dated Feb. 1, 2021 for U.S. Appl. No. 16/435,451, filed Jun. 7, 2019, 14 Pages.

Non-Final Office Action dated Jan. 1, 2021 for U.S. Appl. No. 16/715,792, filed Dec. 16, 2019, 15 Pages.

Non-Final Office Action dated Jul. 2, 2021 for U.S. Appl. No. 16/820,594, filed Mar. 16, 2020, 8 Pages.

Non-Final Office Action dated Sep. 2, 2021 for U.S. Appl. No. 16/910,844, filed Jun. 24, 2020, 7 Pages.

Non-Final Office Action dated Dec. 4, 2020 for U.S. Appl. No. 16/436,137, filed Jun. 10, 2019, 12 Pages.

Non-Final Office Action dated May 7, 2021 for U.S. Appl. No. 16/421,441, filed May 23, 2019, 17 Pages.

Non-Final Office Action dated Jun. 8, 2021 for U.S. Appl. No. 17/072,840, filed Oct. 16, 2020, 7 Pages.

Non-Final Office Action dated Jul. 10, 2020 for U.S. Appl. No. 16/255,528, filed Jan. 23, 2019, 27 Pages.

Non-Final Office Action dated May 14, 2021 for U.S. Appl. No. 16/716,050, filed Dec. 16, 2019, 16 Pages.

Non-Final Office Action dated Mar. 15, 2021 for U.S. Appl. No. 16/896,130, filed Jun. 8, 2020, 16 Pages.

Non-Final Office Action dated Apr. 21, 2021 for U.S. Appl. No. 16/453,538, filed Jun. 26, 2019, 16 Pages.

Non-Final Office Action dated Apr. 21, 2021 for U.S. Appl. No. 17/083,920, filed Oct. 29, 2020, 17 Pages.

Non-Final Office Action dated Oct. 21, 2021 for U.S. Appl. No. 17/083,920, filed Oct. 29, 2020, 19 Pages.

Non-Final Office Action dated Jul. 25, 2019 for U.S. Appl. No. 15/909,162, filed Mar. 1, 2018, 20 Pages.

Non-Final Office Action dated Apr. 27, 2021 for U.S. Appl. No. 16/829,249, filed Mar. 25, 2020, 9 Pages.

Non-Final Office Action dated Jun. 27, 2019 for U.S. Appl. No. 15/801,216, filed Nov. 1, 2017, 13 Pages.

Notice of Allowance dated Apr. 1, 2021 for U.S. Appl. No. 16/255,528, filed Jan. 23, 2019, 7 Pages.

Notice of Allowance dated Nov. 2, 2021 for U.S. Appl. No. 16/453,538, filed Jun. 26, 2019, 8 Pages.

Notice of Allowance dated May 5, 2021 for U.S. Appl. No. 16/707,988, filed Dec. 9, 2019, 14 Pages.

Notice of Allowance dated Jan. 7, 2022 for U.S. Appl. No. 16/899,908, filed Jun. 12, 2020, 10 pages.

Notice of Allowance dated Dec. 8, 2021 for U.S. Appl. No. 16/829,249, filed Mar. 25, 2020, 6 pages.

Notice of Allowance dated Jul. 8, 2021 for U.S. Appl. No. 17/150,925, filed Jan. 15, 2021, 10 Pages.

Notice of Allowance dated Jul. 13, 2021 for U.S. Appl. No. 16/896,130, filed Jun. 8, 2020, 8 Pages.

Notice of Allowance dated Oct. 15, 2020 for U.S. Appl. No. 16/544,136, filed Aug. 19, 2019, 11 Pages.

Notice of Allowance dated Apr. 16, 2021 for U.S. Appl. No. 16/715,792, filed Dec. 16, 2019, 10 Pages.

Notice of Allowance dated Nov. 17, 2021 for U.S. Appl. No. 16/899,908, filed Jun. 12, 2020, 7 Pages.

Notice of Allowance dated Sep. 17, 2021 for U.S. Appl. No. 16/899,908, filed Jun. 12, 2020, 11 Pages.

(56) References Cited

OTHER PUBLICATIONS

Notice of Allowance dated Mar. 18, 2020 for U.S. Appl. No. 15/909,162, filed Mar. 1, 2018, 9 Pages.
Notice of Allowance dated Dec. 21, 2021 for U.S. Appl. No. 16/550,851, filed Aug. 26, 2019, 10 pages.
Notice of Allowance dated Dec. 22, 2021 for U.S. Appl. No. 16/910,844, filed Jun. 24, 2020, 7 pages.
Notice of Allowance dated Jan. 22, 2021 for U.S. Appl. No. 16/369,763, filed Mar. 29, 2019, 8 Pages.
Notice of Allowance dated Nov. 22, 2021 for U.S. Appl. No. 16/820,594, filed Mar. 16, 2020, 18 pages.
Notice of Allowance dated Nov. 22, 2021 for U.S. Appl. No. 16/820,594, filed Mar. 16, 2020, 8 pages.
Notice of Allowance dated Jun. 23, 2020 for U.S. Appl. No. 15/801,216, filed Nov. 1, 2017, 5 Pages.
Notice of Allowance dated Nov. 24, 2021 for U.S. Appl. No. 16/910,844, filed Jun. 24, 2020, 8 pages.
Notice of Allowance dated Aug. 25, 2021 for U.S. Appl. No. 16/715,792, filed Dec. 16, 2019, 9 Pages.
Notice of Allowance dated Oct. 25, 2021 for U.S. Appl. No. 16/435,451, filed Jun. 7, 2019, 8 Pages.
Notice of Allowance dated Oct. 26, 2021 for U.S. Appl. No. 16/896,130, filed Jun. 8, 2020, 8 Pages.
Notice of Allowance dated Aug. 30, 2021 for U.S. Appl. No. 16/829,249, filed Mar. 25, 2020, 8 pages.
Notice of Reason for Rejection dated Nov. 16, 2021 for Japanese Application No. 2019-571699, filed Jun. 25, 2018, 13 pages.
Office Action dated Jul. 3, 2020 for Chinese Application No. 201810821296, filed Jul. 24, 2018, 17 Pages.
Office Action dated Jul. 7, 2021 for European Application No. 19723902.3, filed Apr. 1, 2019, 3 Pages.
Office Action dated Jul. 7, 2021 for European Application No. 19737299.8, filed Jun. 11, 2019, 5 Pages.
Office Action dated Mar. 9, 2021 for Chinese Application No. 201810821296, filed Jul. 24, 2018, 10 Pages.
Office Action dated Dec. 14, 2021 for Japanese Application No. 2019571598, filed Jun. 26, 2018, 12 pages.
Office Action dated Jun. 28, 2020 for Chinese Application No. 201810821296, filed Jul. 24, 2018, 2 Pages.
Office Action dated Sep. 30, 2021 for Taiwan Application No. 107124385, 17 Pages.
Partial International Search Report and Provisional Opinion for International Application No. PCT/US2021/041775, dated Oct. 8, 2021, 12 pages.
Restriction Requirement dated Feb. 2, 2021 for U.S. Appl. No. 16/716,050, filed Dec. 16, 2019, 7 Pages.
Sebastian A., et al., "Memory Devices and Applications for In-memory Computing," Nature Nanotechnology, Nature Publication Group, Inc, London, Mar. 30, 2020, vol. 15 (7), pp. 529-544, XP037194929.
Shi C., et al., "A 1000fps Vision Chip Based on a Dynamically Reconfigurable Hybrid Architecture Comprising a PE Array and Self-Organizing Map Neural Network," International Solid-State Circuits Conference, Session 7, Image Sensors, Feb. 10, 2014, pp. 128-130, XP055826878.
Snoeij M.F., et al., "A low Power Column-Parallel 12-bit ADC for CMOS Imagers," XP007908033, Jun. 1, 2005, pp. 169-172.
Advisory Action dated Oct. 1, 2021 for U.S. Appl. No. 17/083,920, filed Oct. 29, 2020, 4 pages.
Corrected Notice of Allowability dated Dec. 1, 2021 for U.S. Appl. No. 16/210,748, filed Dec. 5, 2018, 3 pages.
Corrected Notice of Allowability dated Dec. 7, 2021 for U.S. Appl. No. 16/210,748, filed Dec. 5, 2018, 3 pages.
Corrected Notice of Allowability dated Jan. 25, 2021 for U.S. Appl. No. 16/384,720, filed Apr. 15, 2019, 4 Pages.
Corrected Notice of Allowability dated Jan. 29, 2021 for U.S. Appl. No. 16/544,136, filed Aug. 19, 2019, 2 Pages.
Corrected Notice of Allowance dated Mar. 7, 2022 for U.S. Appl. No. 17/150,925, filed Jan. 15, 2021, 2 Pages.

Extended European Search Report for European Application No. 18886564.6, dated Jan. 26, 2021, 6 Pages.
Final Office Action dated Nov. 3, 2021 for U.S. Appl. No. 16/560,665, filed Sep. 4, 2019, 19 Pages.
Final Office Action dated Jul. 8, 2021 for U.S. Appl. No. 16/672,427, filed Nov. 1, 2019, 10 Pages.
International Preliminary Report on Patentability for International Application No. PCT/US2019/027727, dated Oct. 29, 2020, 8 Pages.
International Preliminary Report on Patentability for International Application No. PCT/US2020/044807, dated Feb. 17, 2022, 10 pages.
International Search Report and Written Opinion for International Application No. PCT/US2021/054327, dated Feb. 14, 2022, 8 pages.
International Search Report and Written Opinion for International Application No. PCT/US2021/057966, dated Feb. 22, 2022, 15 pages.
Non-Final Office Action dated Aug. 1, 2022 for U.S. Appl. No. 16/550,851, filed Aug. 26, 2019, 7 pages.
Non-Final Office Action dated Feb. 2, 2021 for U.S. Appl. No. 16/210,748, filed Dec. 5, 2018, 8 Pages.
Non-Final Office Action dated Mar. 2, 2022 for U.S. Appl. No. 17/127,670, filed Dec. 18, 2020, 18 pages.
Non-Final Office Action dated Dec. 7, 2020 for U.S. Appl. No. 16/672,427, filed Nov. 1, 2019, 9 Pages.
Non-Final Office Action dated Jan. 8, 2020 for U.S. Appl. No. 16/285,873, filed Feb. 26, 2019, 14 Pages.
Non-Final Office Action dated Feb. 11, 2022 for U.S. Appl. No. 16/672,427, filed Nov. 1, 2019, 9 pages.
Non-Final Office Action dated Sep. 14, 2022 for U.S. Appl. No. 17/364,763, filed Jun. 30, 2021, 13 pages.
Non-Final Office Action dated Dec. 24, 2020 for U.S. Appl. No. 16/407,072, filed May 8, 2019, 15 Pages.
Non-Final Office Action dated Apr. 29, 2021 for U.S. Appl. No. 16/560,665, filed Sep. 4, 2019, 17 Pages.
Notice of Allowance dated Apr. 1, 2021 for U.S. Appl. No. 16/436,049, filed Jun. 10, 2019, 8 Pages.
Notice of Allowance dated Dec. 1, 2021 for U.S. Appl. No. 16/210,748, filed Dec. 5, 2018, 11 pages.
Notice of Allowance dated Jun. 1, 2021 for U.S. Appl. No. 16/407,072, filed May 8, 2019, 11 Pages.
Notice of Allowance dated Mar. 2, 2022 for U.S. Appl. No. 16/453,538, filed Jun. 26, 2019, 8 pages.
Notice of Allowance dated Dec. 7, 2021 for U.S. Appl. No. 16/210,748, filed Dec. 5, 2018, 11 pages.
Notice of Allowance dated Mar. 7, 2022 for U.S. Appl. No. 16/421,441, filed May 23, 2019, 18 pages.
Notice of Allowance dated Jul. 9, 2021 for U.S. Appl. No. 16/210,748, filed Dec. 5, 2018, 6 Pages.
Notice of Allowance dated Nov. 10, 2021 for U.S. Appl. No. 16/672,427, filed Nov. 1, 2019, 6 Pages.
Notice of Allowance dated Mar. 11, 2022 for U.S. Appl. No. 16/716,050, filed Dec. 16, 2019, 13 pages.
Notice of Allowance dated Sep. 13, 2021 for U.S. Appl. No. 16/407,072, filed May 8, 2019, 10 Pages.
Notice of Allowance dated Feb. 14, 2022 for U.S. Appl. No. 16/715,792, filed Dec. 16, 2019, 9 pages.
Notice of Allowance dated Jun. 14, 2022 for U.S. Appl. No. 16/453,538, filed Jun. 26, 2019, 8 pages.
Notice of Allowance dated Aug. 16, 2022 for U.S. Appl. No. 16/453,538, filed Jun. 26, 2019, 2 pages.
Notice of Allowance dated Dec. 16, 2021 for U.S. Appl. No. 16/407,072, filed May 8, 2019, 2 pages.
Notice of Allowance dated Feb. 16, 2022 for U.S. Appl. No. 17/150,925, filed Jan. 15, 2021, 9 pages.
Notice of Allowance dated Jun. 18, 2020 for U.S. Appl. No. 16/285,873, filed Feb. 26, 2019, 10 Pages.
Notice of Allowance dated Apr. 19, 2022 for U.S. Appl. No. 16/550,851, filed Aug. 26, 2019, 08 pages.
Notice of Allowance dated Feb. 22, 2022 for U.S. Appl. No. 17/083,920, filed Oct. 29, 2020, 10 pages.

(56) References Cited

OTHER PUBLICATIONS

Notice of Allowance dated Sep. 24, 2020 for U.S. Appl. No. 15/668,241, filed Aug. 3, 2017, 13 Pages.
Notice of Allowance dated Aug. 26, 2022 for U.S. Appl. No. 16/672,427, filed Nov. 1, 2019, 3 pages.
Notice of Allowance dated Oct. 27, 2021 for U.S. Appl. No. 16/210,748, filed Dec. 5, 2018, 6 Pages.
Notice of Allowance dated Jun. 29, 2022 for U.S. Appl. No. 16/672,427, filed Nov. 1, 2019, 8 pages.
Notice of Allowance dated Oct. 29, 2021 for U.S. Appl. No. 16/672,427, filed Nov. 1, 2019, 9 Pages.
Notice of Allowance dated Aug. 31, 2022 for U.S. Appl. No. 16/453,538, filed Jun. 26, 2019, 2 pages.
Notice of Allowance dated Oct. 5, 2022 for U.S. Appl. No. 16/672,427, filed Nov. 1, 2019, 13 pages.
Notification of the First Office Action dated Oct. 28, 2021 for Chinese Application No. 2019800218483, filed Jan. 24, 2019, 17 pages.
Office Action dated May 10, 2022 for Taiwan Application No. 108122610, 19 pages.
Office Action dated Oct. 20, 2022 for European Application No. 19740456.9, filed Jun. 27, 2019, 6 pages.
Office Action dated Jul. 6, 2022 for Chinese Application No. 201980024435.0, filed Apr. 1, 2019, 16 pages.
Supplemental Notice of Allowability dated Jul. 8, 2021 for U.S. Appl. No. 16/436,049, filed Jun. 10, 2019, 2 Pages.
International Search Report and Written Opinion for International Application No. PCT/US2022/044519, dated Dec. 8, 2022, 12 pages.
Office Action dated Oct. 26, 2022 for Taiwan Application No. 108122610, 9 pages.
Non-Final Office Action dated May 3, 2023 for U.S. Appl. No. 16/550,851, filed Aug. 26, 2019, 7 pages.
Non-Final Office Action dated Jan. 10, 2023 for U.S. Appl. No. 17/591,300, filed Feb. 2, 2022, 15 pages.
Non-Final Office Action dated Jan. 11, 2023 for U.S. Appl. No. 17/180,207, filed Feb. 19, 2021, 19 pages.
Notice of Allowance dated Jan. 12, 2023 for U.S. Appl. No. 16/550,851, filed Aug. 26, 2019, 7 pages.
Notice of Allowance dated Feb. 15, 2023 for U.S. Appl. No. 17/364,763, filed Jun. 30, 2021, 9 pages.
Office Action dated Jan. 13, 2023 for Taiwan Application No. 108111979, filed Apr. 3, 2019, 38 pages.
Office Action dated Feb. 14, 2023 for Japanese Patent Application No. 2020-547367, filed Apr. 1, 2019, 12 pages.
Office Action dated Jan. 17, 2023 for Taiwan Patent Application No. 108129677, filed Aug. 20, 2019, 12 pages.
Office Action dated Dec. 19, 2022 for Taiwan Patent Application No. 108130644, filed Aug. 27, 2019, 23 pages.
Advisory Action dated Feb. 8, 2022 for U.S. Appl. No. 16/560,665, filed Sep. 4, 2019, 3 pages.
Corrected Notice of Allowance dated Aug. 1, 2023 for U.S. Appl. No. 17/364,763, filed Jun. 30, 2021, 2 pages.
Final Office Action dated Oct. 12, 2022 for U.S. Appl. No. 16/560,665, filed Sep. 4, 2019, 17 pages.
Non-Final Office Action dated May 4, 2023 for U.S. Appl. No. 17/849,264, filed Jun. 24, 2022, 9 pages.
Non-Final Office Action dated Mar. 16, 2022 for U.S. Appl. No. 16/560,665, filed Sep. 4, 2019, 19 pages.
Non-Final Office Action dated Apr. 26, 2023 for U.S. Appl. No. 16/560,665, filed Sep. 4, 2019, 22 pages.
Notice of Allowance dated Jul. 6, 2023 for U.S. Appl. No. 17/591,300, filed Feb. 2, 2022, 8 pages.
Notice of Allowance dated Mar. 16, 2022 for U.S. Appl. No. 16/210,748, filed Dec. 5, 2018, 6 pages.
Notice of Allowance dated Jun. 26, 2023 for U.S. Appl. No. 17/364,763, filed Jun. 30, 2021, 8 pages.
Office Action dated Jul. 4, 2023 for Japanese Patent Application No. 2020-569903, filed on Dec. 14, 2020, 05 pages.
Office Action dated Aug. 8, 2023 for Japanese Patent Application No. 2020-547367, filed on Apr. 1, 2019, 6 pages.
Office Action dated Jun. 20, 2023 for Japanese Patent Application No. 2020-569765, filed on Dec. 14, 2020, 10 pages.
Office Action dated May 9, 2023 for Japanese Patent Application No. 2020-564441, filed on Nov. 16, 2020, 13 pages.
Non-Final Office Action dated Oct. 5, 2023 for U.S. Appl. No. 17/236,433, filed Apr. 21, 2021, 14 pages.
Notice of Allowance dated Oct. 12, 2023 for U.S. Appl. No. 17/364,763, filed Jun. 30, 2021, 8 pages.
Notice of Allowance dated Sep. 13, 2023 for U.S. Appl. No. 17/591,300, filed Feb. 2, 2022, 8 pages.
Notice of Allowance dated Aug. 23, 2023 for U.S. Appl. No. 17/180,207, filed Feb. 19, 2021, 11 pages.

* cited by examiner

PIXEL SENSOR HAVING SHARED READOUT STRUCTURE

RELATED APPLICATION

This patent application is a continuation of U.S. Non-Provisional application Ser. No. 16/829,249, filed Mar. 25, 2020, entitled "PIXEL SENSOR HAVING SHARED READOUT STRUCTURE," which claims priority to U.S. Provisional Patent Application No. 62/824,301, filed Mar. 26, 2019, entitled "PIXEL SENSOR HAVING SHARED READOUT STRUCTURE," and which are assigned to the assignee hereof and are incorporated herein by reference in their entirety for all purposes.

BACKGROUND

The disclosure relates generally to image sensors, and more specifically to pixel cell structure including interfacing circuitries for determining light intensity for image generation.

A typical pixel in an image sensor includes a photodiode to sense incident light by converting photons into charge (e.g., electrons or holes). The incident light can include components of different wavelength ranges for different applications, such as 2D and 3D sensing. Moreover, to reduce image distortion, a global shutter operation can be performed in which each photodiode of the array of photodiodes senses the incident light simultaneously in a global exposure period to generate the charge. The charge can be converted by a charge sensing unit (e.g., a floating diffusion) to convert to a voltage. The array of pixel cells can measure different components of the incident light based on the voltages converted by the charge sensing unit and provide the measurement results for generation of 2D and 3D images of a scene.

SUMMARY

The present disclosure relates to image sensors. More specifically, and without limitation, this disclosure relates to a pixel cell. This disclosure also relates to operating the circuitries of pixel cells to generate a digital representation of the intensity of incident light.

In one example, an apparatus comprises: a first photodiode, a second photodiode, a charge sensing unit, a quantizer, a memory, and a controller. The controller is configured to: set a first exposure period in which the first photodiode generates a first charge; set a second exposure period in which the second photodiode generates a second charge, the second exposure period being set based on the first exposure period and at least one of: a first time associated with a read out operation of the memory to a second apparatus, or a second time associated with a quantization operation by the quantizer; generate, using the charge sensing unit, a first voltage and a second voltage based on, respectively, the first charge and the second charge; perform, using the quantizer, a first quantization operation of the first charge to generate a first digital output based on quantizing the first voltage; store the first digital output in the memory; after storing the first digital output in the memory, perform, using the quantizer, a second quantization operation of the second charge to generate a second digital output based on quantizing the second voltage; and store the second digital output in the memory.

In some aspects, the memory includes sufficient capacity to store both the first digital output and the second digital output simultaneously. The controller is configured to set an end time of the second exposure period to lag behind an end time of the first exposure period by a delay based on the first time.

In some aspects, the controller is configured to set a start time of the second exposure period to lag behind a start time of the first exposure period by a delay based on the first time.

In some aspects, the controller is configured to: set a start time of the second exposure period to lead a start time of the first exposure period by a duration based on the first time; and set an end time of the second exposure period to lag behind an end time of the first exposure period by a delay based on the first time.

In some aspects, a center of the first exposure period aligns with a center of the second exposure period.

In some aspects, the apparatus further includes a sampling capacitor coupled between the charge sensing unit and the quantizer. The controller is configured to: after the second exposure period ends, control the sampling capacitor to sample the second voltage; and perform, using the quantizer, the second quantization operation of the second charge to generate the second digital output based on quantizing the second voltage sampled by the sampling capacitor.

In some aspects, the sampling capacitor is implemented as a metal-to-metal capacitor stacked between a first semiconductor substrate and a second semiconductor substrate. The first semiconductor substrate includes the first photodiode and the second photodiode. The second semiconductor substrate includes the quantizer and the memory.

In some aspects, the controller is configured to set an end time of the second exposure period to lag behind an end time of the first exposure period by a delay based on the first time.

In some aspects, the memory does not sufficient capacity to store both the first digital output and the second digital output simultaneously.

In some aspects, the controller is configured to perform the second quantization operation after a read out operation of the memory for the first digital output completes.

In some aspects, the memory does not sufficient capacity to store both the first digital output and the second digital output simultaneously. The controller is configured to set an end time of the second exposure period to lag behind an end time of the first exposure period by a delay based on a sum of the first time and the second time.

In some aspects, the read out operation comprises transferring data stored in the memory to a second apparatus.

In some aspects, the controller is configured to set a start time of the second exposure period to lag a start time of the first exposure period by a delay based on the sum of the first time and the second time.

In some aspects, the apparatus further includes a third photodiode and a fourth photodiode. The controller is configured to: set a start time of the first exposure period and the second exposure period at a third time; set an end time of the second exposure period, the end time of the second exposure period being delayed from end time of the first exposure period by duration based on the second time; set a start time of a third exposure period in which the third photodiode generates a third charge and a fourth exposure period in which the fourth photodiode generates a fourth charge at a fourth time, the fourth time being delayed from the third time based on a sum of the first time and the second time; and set an end time of the fourth exposure period, the end time of the fourth exposure period being delayed from end time of the third exposure period by the duration.

In some aspects, the apparatus further includes a third photodiode and a fourth photodiode. The controller is configured to: set a start time and end time of the second exposure period to be delayed from, respectively, a start time and an end time of the first exposure period by a duration based on a sum of the first time and the second time; set a start time and end time of a third exposure period in which the third photodiode generates a third charge to be delayed from, respectively, a start time and an end time of the second exposure period by the duration; and set a start time and end time of a fourth exposure period in which the fourth photodiode generates a fourth charge to be delayed from, respectively, a start time and an end time of the third exposure period by the duration.

In some aspects, the first photodiode is configured to, within the first exposure period, accumulate at least a first part of the first charge as first residual charge and transfer a second part of the second charge as first overflow charge to the charge sensing unit after the first photodiode saturates. The second photodiode is configured to, within the second exposure period, accumulate the second charge as second residual charge. The controller is configured to: generate, using the quantizer, a first quantization result based on quantizing the overflow charge stored in the charge sensing unit; control the first photodiode to transfer the first residual charge to the charge sensing unit; generate, using the quantizer, a second quantization result based on quantizing the first residual charge stored in the charge sensing unit; store one of the first quantization result or the second quantization result into the memory as the first digital output based on whether the first photodiode saturates within the first exposure period; control the second photodiode to transfer the second residual charge to the charge sensing unit; generate, using the quantizer, the second digital output based on quantizing the second residual charge stored in the charge sensing unit; and store the second digital output into the memory.

In some aspects, the charge sensing unit comprises a capacitor configured to store the first overflow charge. The controller is further configured to, within the first exposure period and using the quantizer, determine a time when a quantity of the first overflow charge exceeds a saturation limit of the capacitor.

In some aspects, the first photodiode and the second photodiode are part of a pixel cell. The first photodiode is configured to detect light of a first wavelength range from a spot of a scene. The second photodiode is configured to detect light of a second wavelength range from the same spot. The first digital output of the first photodiode and the second digital output of the second photodiode form the same pixel of a first image frame and a second image frame, the first image frame being associated with the first wavelength range and the second image frame being associated with the second wavelength range.

In some embodiments, a method comprises: setting a first exposure period in which a first photodiode generates a first charge; setting a second exposure period in which a second photodiode generates a second charge, the second exposure period being set based on the first exposure period and at least one of: a first time associated with a read out operation of a memory, or a second time associated with a quantization operation of a quantizer; performing, using the quantizer, a first quantization operation of the first charge to generate a first digital output; storing the first digital output in the memory; performing, using the quantizer, a second quantization operation of the second charge to generate a second digital output; and storing the second digital output in the memory.

In some aspects, the memory includes sufficient capacity to store both the first digital output and the second digital output simultaneously. An end time of the second exposure period is set to lag behind an end time of the first exposure period by a duration based on the first time. A start time of the second exposure period is set to lead a start time of the first exposure period by a duration based on the first time.

BRIEF DESCRIPTION OF THE DRAWINGS

Illustrative examples are described with reference to the following figures.

Figure 1A:
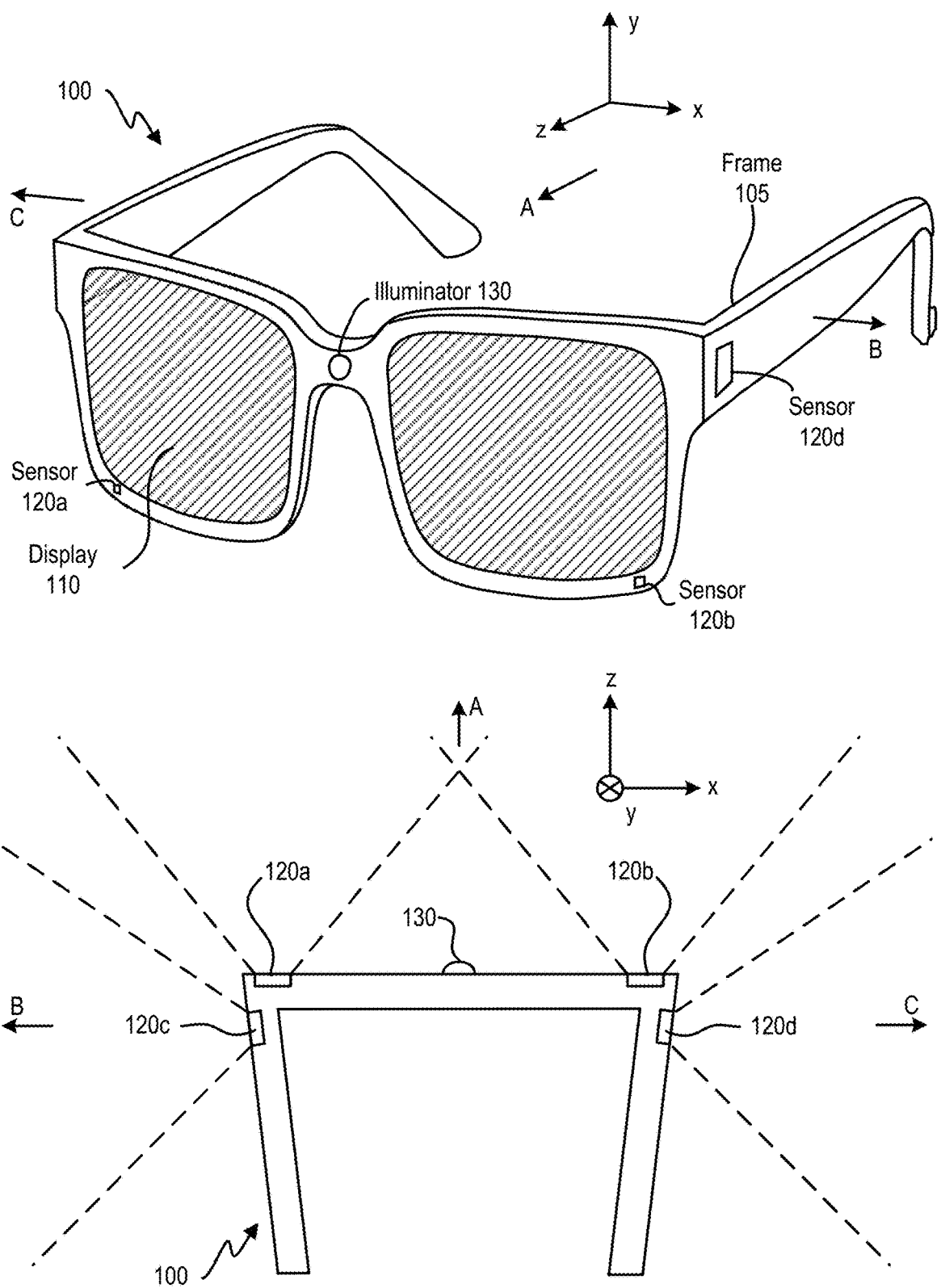
FIG. 1A and FIG. 1B are diagrams of an example of a near-eye display.

The figures depict examples of the present disclosure for purposes of illustration only. One skilled in the art will readily recognize from the following description that alternative examples of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive examples.

However, it will be apparent that various examples may be practiced without these specific details. The figures and description are not intended to be restrictive.

A typical image sensor includes an array of pixel cells. Each pixel cell includes a photodiode to measure the intensity incident light by converting photons into charge (e.g., electrons or holes). The charge generated by the photodiode can be converted to a voltage by a charge sensing unit, which can include a floating drain node. The voltage can be quantized by an analog-to-digital converter (ADC) into a digital value. The digital value can represent an intensity of light received by the pixel cell and can form a pixel, which can correspond to light received from a spot of a scene. An image comprising an array of pixels can be derived from the digital outputs of the array of pixel cells.

An image sensor can be used to perform different modes of imaging, such as 2D and 3D sensing. The 2D and 3D sensing can be performed based on light of different wavelength ranges. For example, visible light can be used for 2D sensing, whereas invisible light (e.g., infra-red light) can be used for 3D sensing. An image sensor may include an optical filter array to allow visible light of different optical wavelength ranges and colors (e.g., red, green, blue, monochrome, etc.) to a first set of pixel cells assigned for 2D sensing, and invisible light to a second set of pixel cells assigned for 3D sensing.

To perform 2D sensing, a photodiode at a pixel cell can generate charge at a rate that is proportional to an intensity of visible light component (e.g., red, green, blue, monochrome, etc.) incident upon the pixel cell, and the quantity of charge accumulated in an exposure period can be used to represent the intensity of visible light (or a certain color component of the visible light). The charge can be stored temporarily at the photodiode and then transferred to a capacitor (e.g., a floating diffusion) to develop a voltage. The voltage can be sampled and quantized by an analog-to-digital converter (ADC) to generate an output corresponding to the intensity of visible light. An image pixel value can be generated based on the outputs from multiple pixel cells configured to sense different color components of the visible light (e.g., red, green, and blue colors).

Moreover, to perform 3D sensing, light of a different wavelength range (e.g., infra-red light) can be projected onto an object, and the reflected light can be detected by the pixel cells. The light can include structured light, light pulses, etc. The pixel cells outputs can be used to perform depth sensing operations based on, for example, detecting patterns of the reflected structured light, measuring a time-of-flight of the light pulse, etc. To detect patterns of the reflected structured light, a distribution of quantities of charge generated by the pixel cells during the exposure time can be determined, and pixel values can be generated based on the voltages corresponding to the quantities of charge. For time-of-flight measurement, the timing of generation of the charge at the photodiodes of the pixel cells can be determined to represent the times when the reflected light pulses are received at the pixel cells. Time differences between when the light pulses are projected to the object and when the reflected light pulses are received at the pixel cells can be used to provide the time-of-flight measurement.

A pixel cell array can be used to generate information of a scene. In some examples, each pixel cell (or at least some of the pixel cells) of the pixel cell array can be used to perform collocated 2D and 3D sensing at the same time. For example, a pixel cell may include multiple photodiodes each configured to convert a different spectral component of light to charge. For 2D sensing, a photodiode can be configured to convert visible light (e.g., monochrome, or for a color of a particular frequency range) to charge, whereas another photodiode can be configured to convert infra-red light to charge for 3D sensing. Having the same set of pixel cells to perform sensing of different spectral components of light can facilitate the correspondence between 2D and 3D images of different spectral components of light generated by the pixel cells. Moreover, given that every pixel cell of a pixel cell array can be used to generate the image, the full spatial resolution of the pixel cell array can be utilized for the imaging.

The 2D and 3D imaging data can be fused for various applications that provide virtual-reality (VR), augmented-reality (AR) and/or mixed reality (MR) experiences. For example, a wearable VR/AR/MR system may perform a scene reconstruction of an environment in which the user of the system is located. Based on the reconstructed scene, the VR/AR/MR can generate display effects to provide an interactive experience. To reconstruct a scene, the 3D image data can be used to determine the distances between physical objects in the scene and the user. Moreover, 2D image data can capture visual attributes including textures, colors, and reflectivity of these physical objects. The 2D and 3D image data of the scene can then be merged to create, for example, a 3D model of the scene including the visual attributes of the objects. As another example, a wearable VR/AR/MR system can also perform a head tracking operation based on a fusion of 2D and 3D image data. For example, based on the 2D image data, the VR/AR/AR system can extract certain image features to identify an object. Based on the 3D image data, the VR/AR/AR system can track a location of the identified object relative to the wearable device worn by the user. The VR/AR/AR system can track the head movement based on, for example, tracking the change in the location of the identified object relative to the wearable device as the user's head moves.

One major challenge of including multiple photodiodes in a pixel cell is how to reduce the size and power consumption of the pixel cell, which can impact a number of pixel cells that can be fit into a pixel cell array. The number of pixel cells in a pixel cell array can dominate the available resolution of the imaging. Specifically, in addition to the photodiodes, a pixel cell may include processing circuits to support measurement of the charge generated by each photodiode and to support the generation of a pixel value based on the measurements. Moreover, each pixel cell may also include memory devices (e.g., static random-access memory (SRAM)) to store the measurement results while waiting to forward the measurement results to the VR/AR/AR application for processing.

The processing circuits and memory devices typically have considerable footprints and consume considerable amounts of power. For example, a pixel cell may include a charge sensing unit, which includes one or more charge storage devices (e.g., a floating drain node, a capacitor, etc.) to store the charge generated by a photodiode and to convert the charge to a voltage, and a buffer to buffer the voltage. Moreover, the processing circuits may include a quantizer to quantize the voltage to a digital value. The quantizer typically includes a comparator which includes analog circuits (e.g., differential pair, output stage, current source, etc.), which have large footprints and consume lots of power. Further, the memory devices typically include multiple memory banks (e.g., SRAM cells) to store the bits of the measurement result. The memory devices have significant footprints and can consume lots of power, especially if the memory devices are constructed using high bandwidth transistor devices to improve operation speed. In a case where a photodiode includes multiple photodiodes, if a separate set of processing circuits and memory devices is provided for each photodiode, both the footprint and the power consumption of the pixel cell can be substantially increased, which may render the pixel cells unsuitable for applications where space and power are at a premium, such as applications at mobile devices and wearable devices.

The present disclosure relates to an image sensor that can address at least some of the issues above. The image sensor may include a plurality of photodiodes including a first photodiode and a second photodiode, a charge sensing unit, a quantizer, a memory, and a controller. The first photodiode and the second photodiode can be part of a pixel cell, or can belong to different pixel cells. The first and second photodiodes can convert, respectively, a first component and a second component of incident to charge. The first and second components can be of different wavelength ranges. For example, the first component can be of visible light, while the second component can be an infra-red component. Each pixel cell may include a charge sensing unit shared between the plurality of photodiodes. The charge sensing unit may include a charge storage device (e.g., a floating drain node, a capacitor, etc.) to temporarily store the charge generated by the photodiodes and convert the charge to voltages. The quantizer can perform one or more quantization operations to quantize the charge generated by each photodiode, based on the voltages output by the charge sensing unit, to a digital output, whereas the memory can store the digital outputs for the first photodiode and the second photodiode. In one example, the memory has sufficient capacity to store the digital outputs of the first photodiode and of the second photodiode concurrently. In another example, the memory can only store the digital output of one of the first photodiode or the second photodiode at a given time.

The controller can control the timing of operations of the photodiodes, the charge sensing unit, the quantizer, and a memory to support generation of images based on the digital outputs. Specifically, the controller can set a first exposure period in which the first photodiode generates a first charge, and set a second exposure period in which the second photodiode generates a second charge. The controller can set the second exposure period based on at least one of: a first time associated with the one or more quantization operations of the first charge, or a second time associated with a read out operation of the memory.

Within the first exposure period, the controller can connect the charge sensing unit to the first photodiode to convert at least some of the first charge to a first voltage, while disconnecting the second photodiode from the charge sensing unit. During the first exposure period the first photodiode can accumulate a first part of the first charge as first residual charge until the first photodiode saturates. After the first photodiode saturates, the remaining of the first charge can be transferred to the charge sensing unit as overflow charge. The charge sensing unit can include a capacitor (e.g., a floating drain node) to store the overflow charge during and after the first exposure period to support the one or more quantization operations. The capacitor can also store the first residual charge after the first exposure period ends to support the one or more quantization operations.

The controller can control the quantizer to perform the one or more quantization operations, during and after the first exposure period, to quantize the first charge. Specifically, the controller can control the quantizer to perform a time-to-saturation (TTS) operation to detect whether a quantity of the first overflow charge stored in the charge sensing unit (if any) exceeds a saturation limit of the capacitor, and if it does, the time it takes to reach the saturation limit. The TTS measurement can be inversely proportional to the intensity of the first component of light and can be used to measure light of a high intensity range. After the TTS operation, the controller can control the quantizer to perform an FD ADC operation to measure a quantity of the overflow charge, and a PD ADC operation to measure a quantity of the residual charge.

In some examples, the controller can control the quantizer to perform the FD ADC operation within the first exposure period to generate a FD ADC measurement result. The FD ADC operation can be used to measure light of a medium intensity range. After the first exposure period ends, the controller can reset the capacitor, transfer the residual charge from the first photodiode to the charge sensing unit, and control the quantizer to perform the PD ADC operation to generate a PD ADC measurement result. The PD ADC operation can be used to measure light of a low intensity range. In some examples, the controller can control the quantizer to perform only the TTS operation within the first exposure period, followed by the PD ADC operation and the FD ADC operation. Depending on the intensity range of the first component, as indicated by whether the capacitor reaches the saturation limit and whether the first photodiode is saturated by the first residual charge, one of the TTS measurement result, the FD ADC measurement result, or the PD ADC measurement result can be stored in the memory as a first digital output.

As described above, during the time when the charge sensing unit and the quantizer process the first charge from the first photodiode, the second photodiode is disconnected from the charge sensing unit and the quantizer, but it is desirable that the second photodiode continues generating the second charge, and charge converted from photon continues to be stored at the floating drain of the charge storage device, to mitigate the effect of dark current. The controller can extend the second exposure period beyond the end of the first exposure period, and until the second photodiode is granted access to the charge sensing unit and the quantizer. The end of the second exposure period, relative to the end of the first exposure period, can be set based on a first time of the one or more quantization operations of the first charge and/or a second time of the read out operation, depending on whether the memory has sufficient capacity to store the digital outputs for the first photodiode and the second photodiode concurrently.

Specifically, in a case where the memory has sufficient capacity to store the digital outputs for the first photodiode and the second photodiode concurrently, the controller can allow the second photodiode access to the charge sensing unit and to the quantizer after the one or more quantization operations for the first photodiode complete, and the first digital output is stored into the one or more devices, both of which are to complete within the first time. In some examples, the pixel cell may include an additional sampling capacitor to sample and hold at least part of the second charge (e.g., second overflow charge from the second photodiode after the second photodiode is saturated by the residual charge) beyond the end of the second exposure period. In such a case, the controller can also allow the second photodiode access to the charge sensing unit and to the quantizer after the quantization operations for the first photodiode complete, and before the read out of the first digital output from the memory, as the sampling capacitor can act as a second memory to store information related to the second charge. In both cases, the end of the second exposure period can be delayed from the end of the first exposure period by the first time.

In some examples, the memory only has sufficient capacity to store the digital output of one of the first photodiode or the second photodiode, and the pixel cell does not include a sampling capacitor (or the sampling capacitor is used to store the charge generated by other photodiodes). Such configurations can be adopted to further shrink the size and power of the pixel cell. But in such a case, a readout of the first digital output from the memory may need to complete before the memory is overwritten with the second digital output of the second photodiode, which accounts for the second completion time. Accordingly, the controller can delay the end of the second exposure period, relative to the end of the first exposure period, by a sum of the first completion time and the second completion time relative to the end of the first exposure period, as the controller allows the second photodiode access to charge sensing unit and to the quantizer only after the quantization operations for the first photodiode complete and the read out of the first digital output from the memory also completes.

In some examples, delaying the end the second exposure period to accommodate for the quantization operations of the first charge and/or read out of the first digital output from the memory may cause the two exposure periods to have different durations, such as in a case where the first exposure period and the second exposure period start at the same time. The duration difference between the exposure periods can degrade the global shutter operation of the photodiodes within the pixel cell. Specifically, the duration difference between the exposure periods can introduce an offset between the first and second digital outputs, since each photodiode is provided with different durations of time to be exposed to light and to generate charge. As a result, the total charge generated by each photodiode can be different even if the first component and the second component of the incident light have the same intensity. In addition, motion artifacts and distortions may appear in an image frame of a high-speed moving object. As different photodiodes can capture light at different times, while the object is moving between different physical locations at a high speed, different photodiodes may capture different images of the object at the different physical locations for an image frame, which can introduce motion artifacts and distortions.

Various techniques are proposed to improve the global shutter operation of the photodiodes within the pixel cell. In one example, the offset in the digital outputs caused by the different durations between the exposure periods can be reduced. Specifically, the start of the second exposure period can be delayed with respect to the start of the first exposure period. The amount of delay between the start times of the two exposure periods can be the same as the amount of delay between the end times of the two exposure periods, such that the two exposure periods have the same duration. As the exposure periods have the same duration, the offset in the digital outputs caused by the different durations between the exposure periods can be reduced or even eliminated. As another example, the second photodiode may have a lower quantum efficiency than the first photodiode, such that the second photodiode generate less charge than the first photodiode even if they are exposed to the same intensity of light within the same duration of exposure period. The quantum efficiency can be based on the wavelength of the light components to be measured by each photodiode. The reduced quantum efficiency of the second photodiode can also compensate for the offset introduced by the longer second exposure period. As yet another example, both the first photodiode and the second photodiode can be configured to detect different components of visible light, and the digital outputs from the photodiodes can be combined into a pixel in a demosaicing operation. As part of the demosaicing operation, the digital outputs from the photodiodes can be scaled based on the durations of the exposure periods of the photodiodes, to eliminate or reduce the effect of the offset.

In another example, to reduce the motion artifacts caused by imaging high-speed moving objects, but the start time of the second exposure period can be set as earlier than the start time of the first exposure period, such that the center of the first exposure period is aligned with the center of the second exposure period. Aligning the centers of the exposure periods can reduce the motion artifacts. This is because the charge generated from an exposure period can represent an average intensity of light received by a photodiode within the exposure period. By aligning the centers of the exposure periods, it becomes more likely that the digital outputs represent the intensities of light captured by the photodiodes at the same time that corresponds to the centers of the exposure periods, rather than the intensities of light captured at different times. As a result, the motion artifacts caused by the different durations of exposure periods can be reduced or at least mitigated.

With examples of the present disclosure, a pixel cell can perform collocated imaging for different components of incident light, which can facilitate correspondence between images of different components generated by the pixel cells and can improve fusion of 2D and 3D imaging data. Moreover, as each pixel cell is used to perform imaging, the spatial resolutions of the images can also be improved. Meanwhile, by having two photodiodes (or more) sharing a charge sensing unit, a quantizer, and a memory, the size and power consumption of a pixel cell can be reduced. Moreover, for photodiodes that share a charge sensing unit, a pair of charge draining transistor and charge transfer transistor can be provided for each photodiode to control a flow direction of charge from the photodiode. The flow directions can be adapted for different operation modes, such as charge binning between the photodiodes, and separate read out of charge from each photodiode. Further, a sampling switch and a sampling capacitor can be provided to sample and hold the output of a charge sensing unit while the output awaits to be quantized, to reduce the effect of dark charge. All these can improve flexibility of operation of the pixel cell as well as the accuracy of measurement of different frequency components of light by the pixel cell.

The disclosed techniques may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some examples, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an example of a near-eye display 100. Near-eye display 100 presents media to a user. Examples of media presented by near-eye display 100 include one or more images, video, and/or audio. In some examples, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some examples, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some examples, display 110 comprises a waveguide display assembly for directing light from one or more images to an eye of the user.

Near-eye display 100 further includes image sensors 120a, 120b, 120c, and 120d. Each of image sensors 120a, 120b, 120c, and 120d may include a pixel array configured to generate image data representing different fields of views along different directions. For example, sensors 120a and 120b may be configured to provide image data representing two fields of view towards a direction A along the Z axis, whereas sensor 120c may be configured to provide image data representing a field of view towards a direction B along the X axis, and sensor 120d may be configured to provide image data representing a field of view towards a direction C along the X axis.

In some examples, sensors 120a-120d can be configured as input devices to control or influence the display content of the near-eye display 100, to provide an interactive VR/AR/MR experience to a user who wears near-eye display 100. For example, sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some examples, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120a-120d can provide the location tracking system a more holistic view of the physical environment, which can lead to more objects to be included in the construction and updating of the map. With such an arrangement, the accuracy and robustness of tracking a location of the user within the physical environment can be improved.

In some examples, near-eye display 100 may further include one or more active illuminators 130 to project light into the physical environment. The light projected can be associated with different frequency spectrums (e.g., visible light, infra-red light, ultra-violet light, etc.), and can serve various purposes. For example, illuminator 130 may project light in a dark environment (or in an environment with low intensity of infra-red light, ultra-violet light, etc.) to assist sensors 120a-120d in capturing images of different objects within the dark environment to, for example, enable location tracking of the user. Illuminator 130 may project certain markers onto the objects within the environment, to assist the location tracking system in identifying the objects for map construction/updating.

In some examples, illuminator 130 may also enable stereoscopic imaging. For example, one or more of sensors 120a or 120b can include both a first pixel array for visible light sensing and a second pixel array for infra-red (IR) light sensing. The first pixel array can be overlaid with a color filter (e.g., a Bayer filter), with each pixel of the first pixel array being configured to measure intensity of light associated with a particular color (e.g., one of red, green or blue colors). The second pixel array (for IR light sensing) can also be overlaid with a filter that allows only IR light through, with each pixel of the second pixel array being configured to measure intensity of IR lights. The pixel arrays can generate an RGB image and an IR image of an object, with each pixel of the IR image being mapped to each pixel of the RGB image. Illuminator 130 may project a set of IR markers on the object, the images of which can be captured by the IR pixel array. Based on a distribution of the IR markers of the object as shown in the image, the system can estimate a distance of different parts of the object from the IR pixel array, and generate a stereoscopic image of the object based on the distances. Based on the stereoscopic image of the object, the system can determine, for example, a relative position of the object with respect to the user, and can update the image data provided to display 100 based on the relative position information to provide the interactive experience.

As discussed above, near-eye display 100 may be operated in environments associated with a very wide range of light intensities. For example, near-eye display 100 may be operated in an indoor environment or in an outdoor environment, and/or at different times of the day. Near-eye display 100 may also operate with or without active illuminator 130 being turned on. As a result, image sensors 120a-120d may need to have a wide dynamic range to be able to operate properly (e.g., to generate an output that correlates with the intensity of incident light) across a very wide range of light intensities associated with different operating environments for near-eye display 100.

Figure 1B:
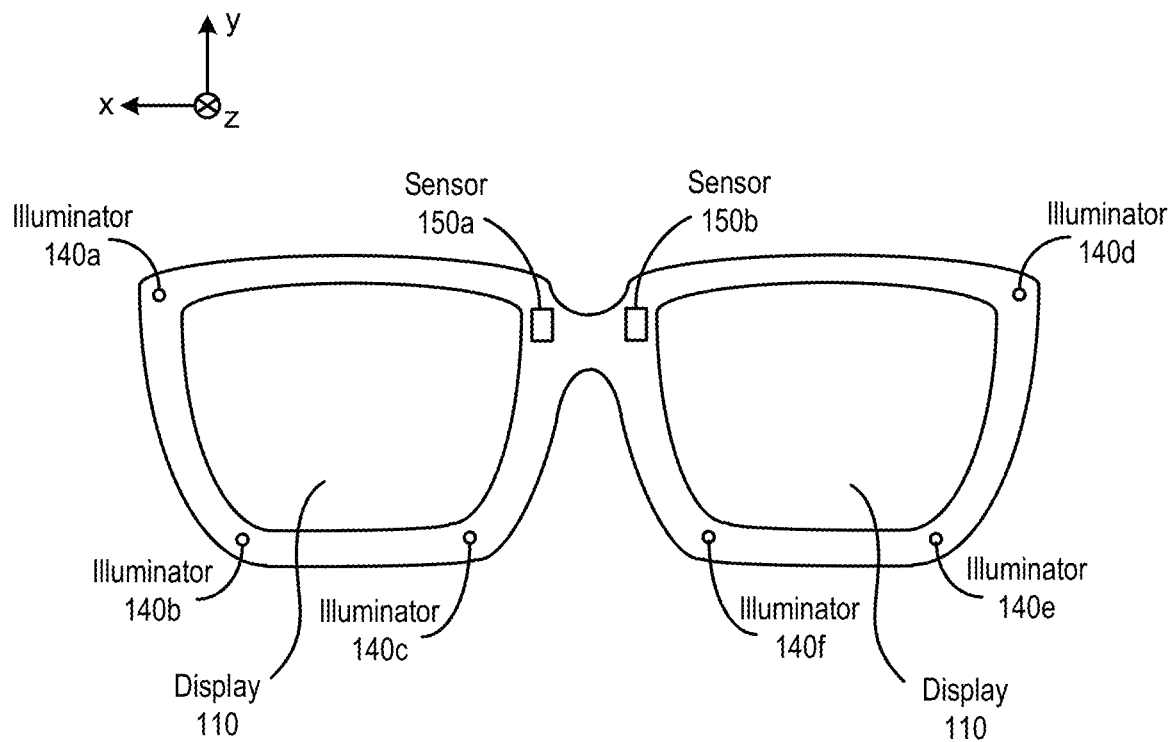

FIG. 1B is a diagram of another example of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensors 150a and 150b. Illuminators 140a, 140b, and 140c may emit lights of certain frequency range (e.g., NIR) towards direction D (which is opposite to direction A of FIG. 1A). The emitted light may be associated with a certain pattern, and can be reflected by the left eyeball of the user. Sensor 150a may include a pixel array to receive the reflected light and generate an image of the reflected pattern. Similarly, illuminators 140d, 140e, and 140f may emit NIR lights carrying the pattern. The NIR lights can be reflected by the right eyeball of the user, and may be received by sensor 150b. Sensor 150b may also include a pixel array to generate an image of the reflected pattern. Based on the images of the reflected pattern from sensors 150a and 150b, the system can determine a gaze point of the user, and update the image data provided to display 100 based on the determined gaze point to provide an interactive experience to the user.

As discussed above, to avoid damaging the eyeballs of the user, illuminators 140a, 140b, 140c, 140d, 140e, and 140f are typically configured to output lights of very low intensities. In a case where image sensors 150a and 150b comprise the same sensor devices as image sensors 120a-120d of FIG. 1A, the image sensors 120a-120d may need to be able to generate an output that correlates with the intensity of incident light when the intensity of the incident light is very low, which may further increase the dynamic range requirement of the image sensors.

Moreover, the image sensors 120a-120d may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensors 120a-120d need to generate images of the eyeball at high speed. For example, the rate at which the image sensors generate an image frame (the frame rate) needs to at least match the speed of movement of the eyeball. The high frame rate requires short total exposure time for all of the pixel cells involved in generating the image frame, as well as high speed for converting the sensor outputs into digital values for image generation. Moreover, as discussed above, the image sensors also need to be able to operate at an environment with low light intensity.

Figure 1B:
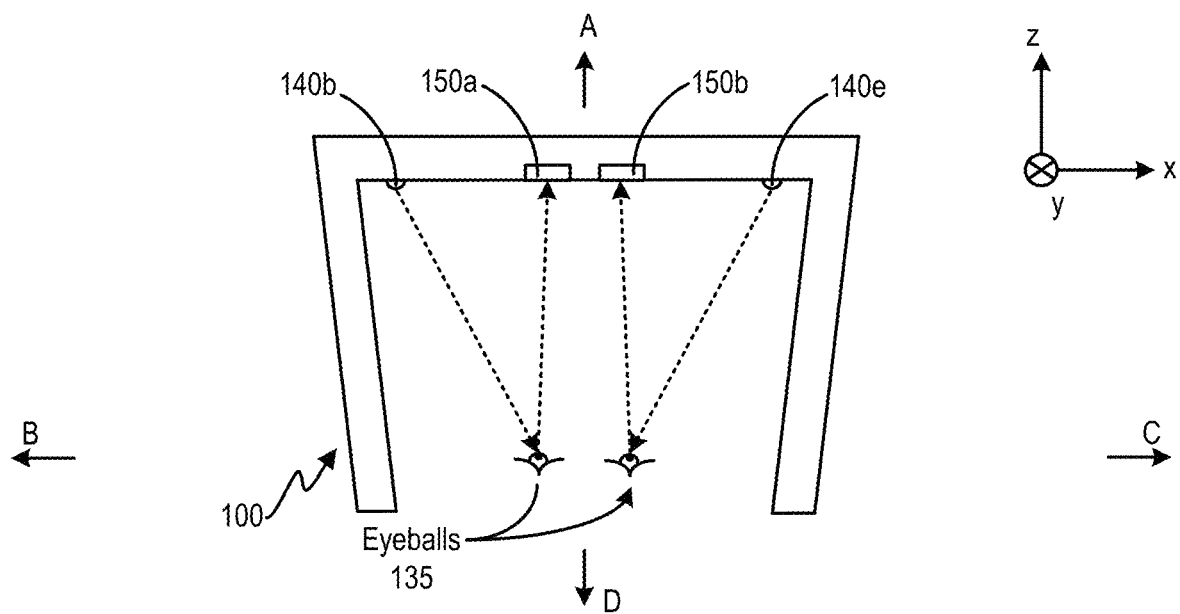
Figure 2:
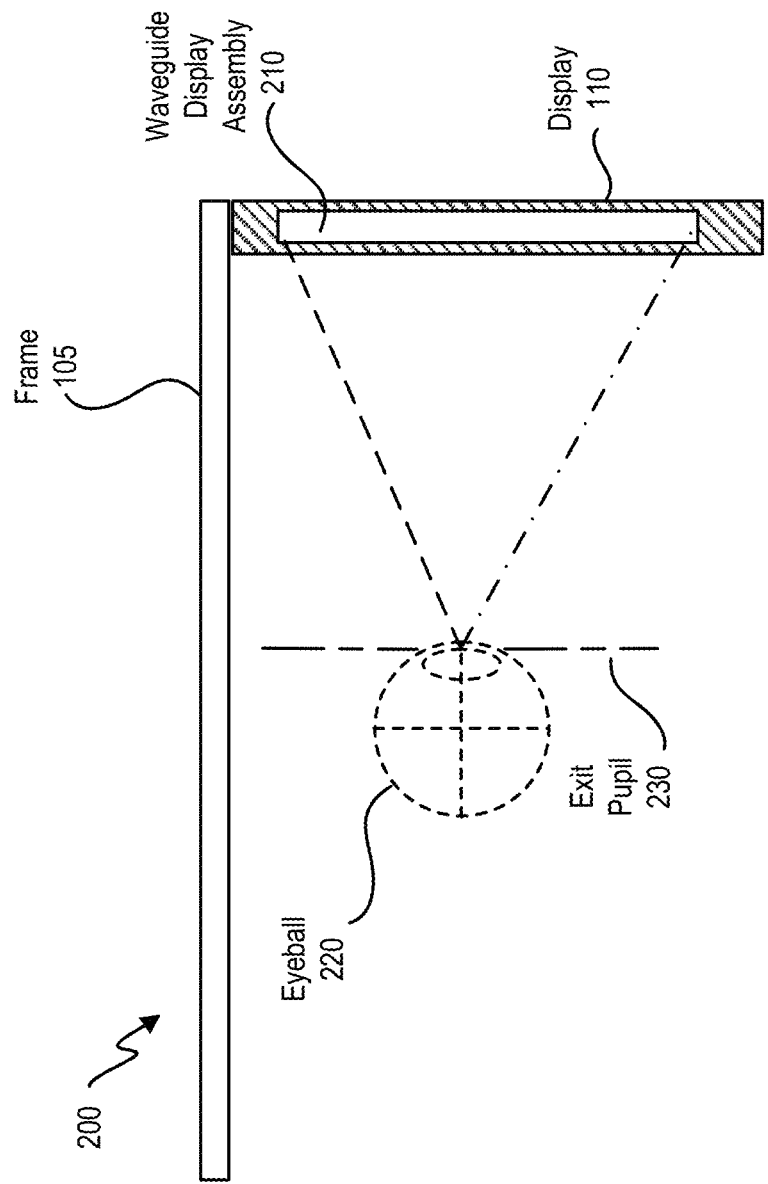
FIG. 2 is an example of a cross section of the near-eye display.

FIG. 2 is an example of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some examples, near-eye display 100 includes one or more optical elements between waveguide display assembly 210 and eyeball 220.

In some examples, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate examples, waveguide display assembly 210 may include the stacked waveguide display and the varifocal waveguide display.

Figure 3:
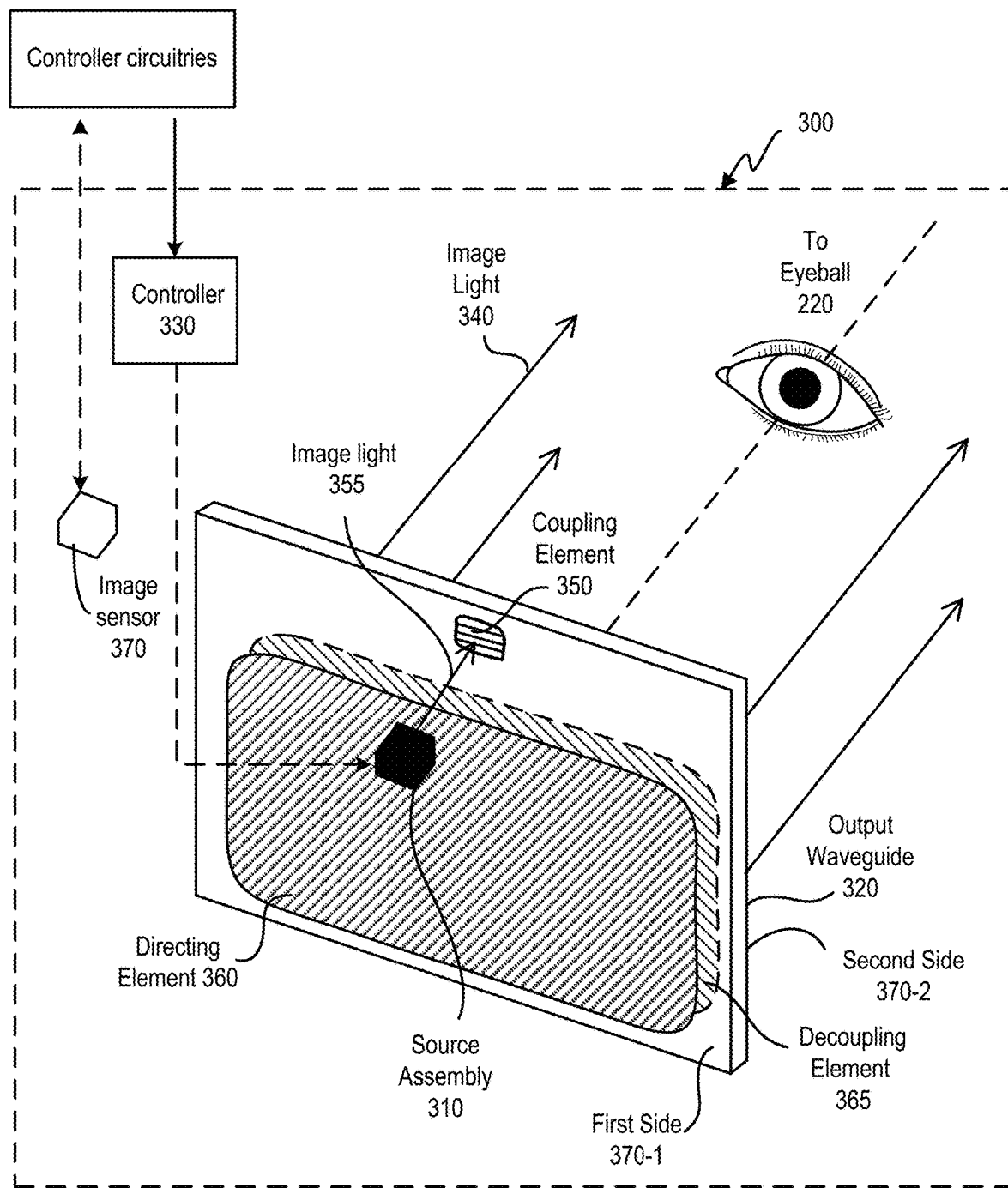
FIG. 3 illustrates an isometric view of an example of a waveguide display with a single source assembly.

FIG. 3 illustrates an isometric view of an example of a waveguide display 300. In some examples, waveguide display 300 is a component (e.g., waveguide display assembly 210) of near-eye display 100. In some examples, waveguide display 300 is part of some other near-eye display or other system that directs image light to a particular location.

Waveguide display 300 includes a source assembly 310, an output waveguide 320, and a controller 330. For purposes of illustration, FIG. 3 shows the waveguide display 300 associated with a single eyeball 220, but in some examples, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some examples, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some examples, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A to generate image data of a physical environment in front of the user (e.g., for location determination). Image sensor 370 may also be located on second side 370-2 and may include image sensors 150a and 150b of FIG. 1B to generate image data of eyeball 220 (e.g., for gaze point determination) of the user. Image sensor 370 may interface with a remote console that is not located within waveguide display 300. Image sensor 370 may provide image data to the remote console, which may determine, for example, a location of the user, a gaze point of the user, etc., and determine the content of the images to be displayed to the user. The remote console can transmit instructions to controller 330 related to the determined content. Based on the instructions, controller 330 can control the generation and outputting of image light 355 by source assembly 310.

Figure 4:
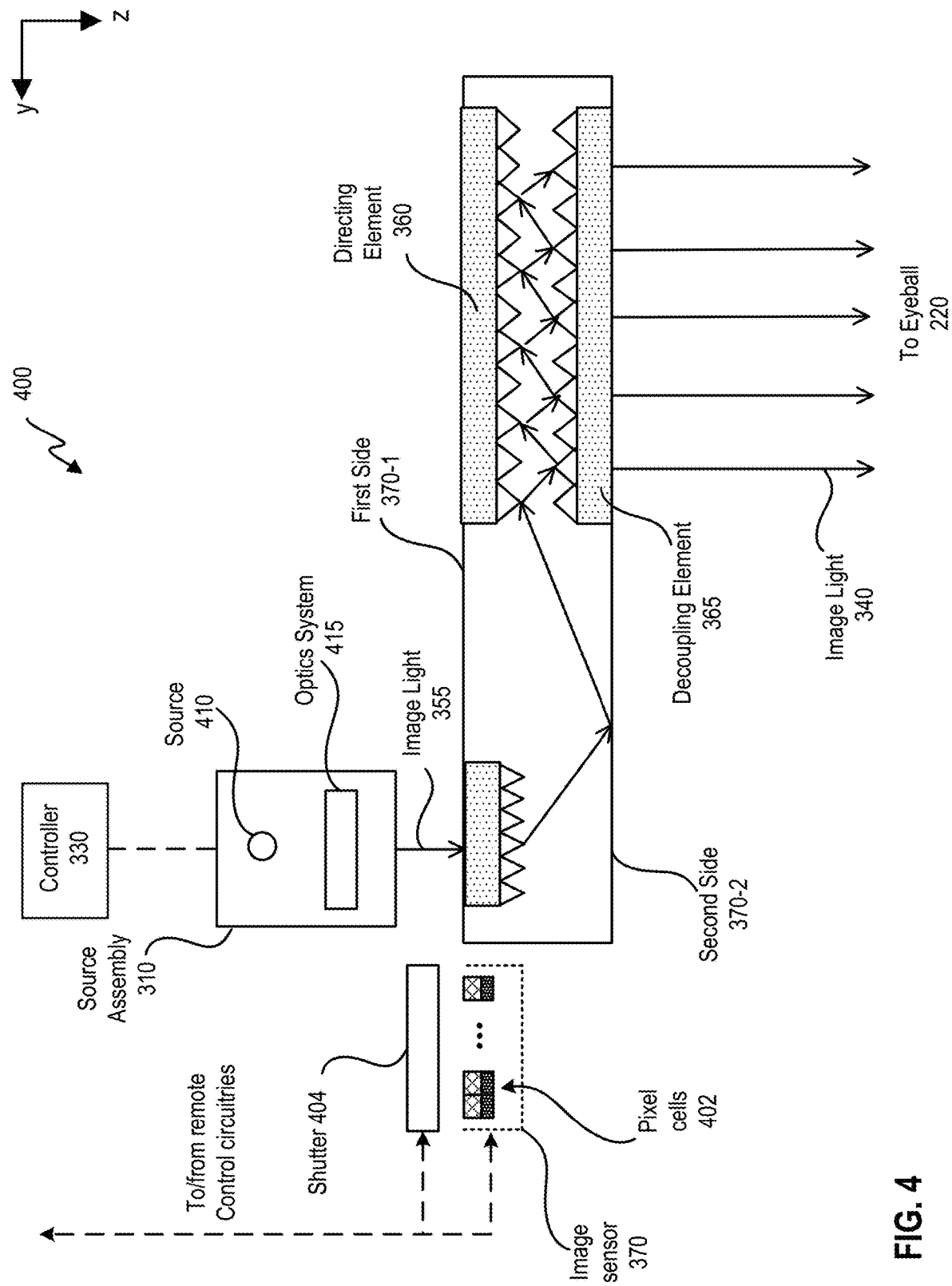
FIG. 4 illustrates a cross section of an example of the waveguide display.

FIG. 4 illustrates an example of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some examples, there can be a mechanical shutter 404 interposed between the set of pixel cells 402 and the physical environment to control the exposure of the set of pixel cells 402. In some examples, the mechanical shutter 404 can be replaced by an electronic shutter gate, as to be discussed below. Each of pixel cells 402 may correspond to one pixel of the image. Although not shown in FIG. 4, it is understood that each of pixel cells 402 may also be overlaid with a filter to control the frequency range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some examples, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In examples where coupling element 350 is diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In examples where directing element 360 is a diffraction grating, the pitch of the diffraction grating is chosen to cause incident image light 355 to exit output waveguide 320 at angle(s) of inclination relative to a surface of decoupling element 365.

In some examples, directing element 360 and/or decoupling element 365 are structurally similar. Expanded image light 340 exiting output waveguide 320 is expanded along one or more dimensions (e.g., may be elongated along x-dimension). In some examples, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
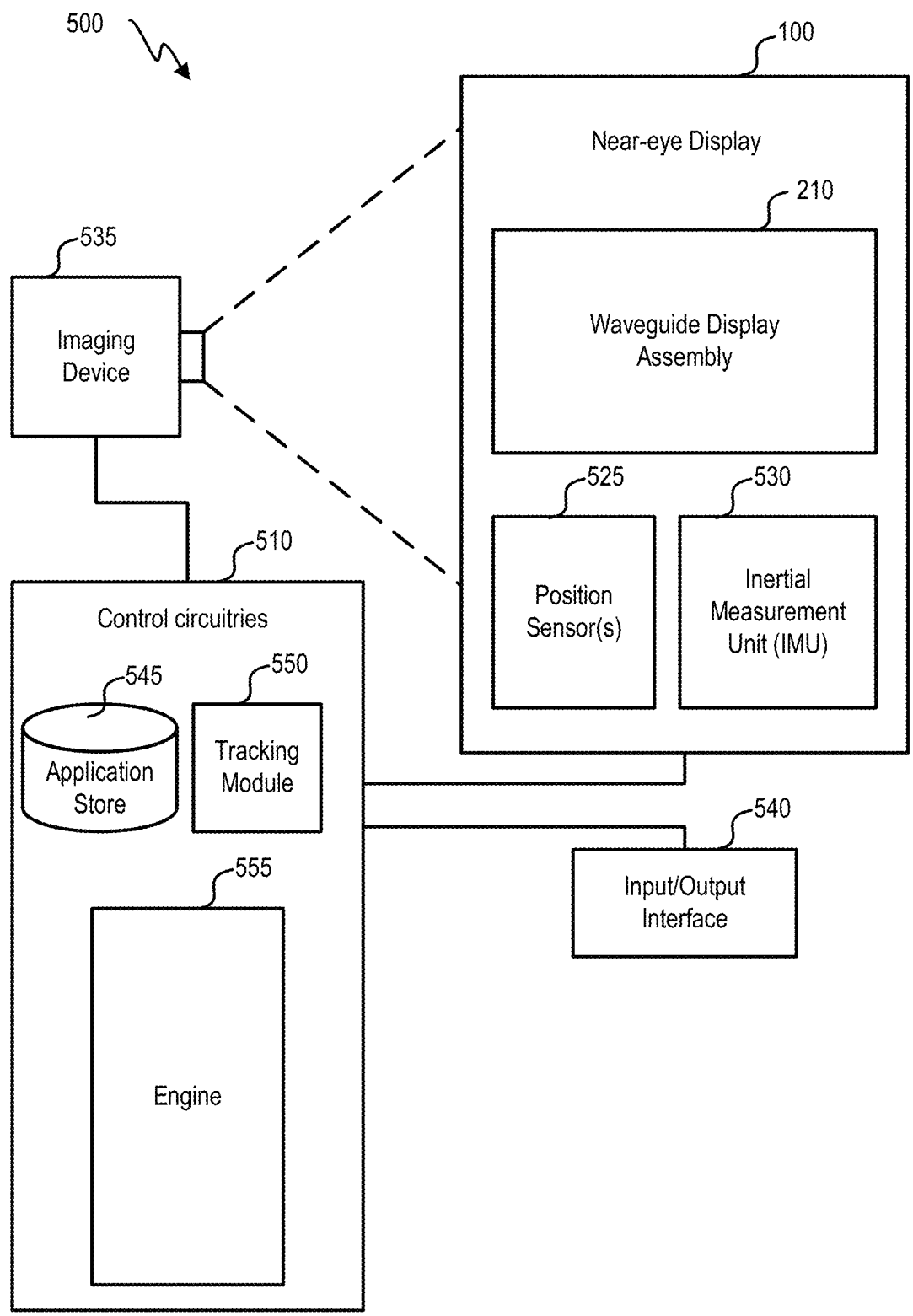
FIG. 5 is a block diagram of an example of a system including the near-eye display.

FIG. 5 is a block diagram of an example of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some examples, audio is presented via an external device (e.g., speakers and/or headphones) that receives audio information from near-eye display 100 and/or control circuitries 510 and presents audio data based on the audio information to a user. In some examples, near-eye display 100 may also act as an AR eyewear glass. In some examples, near-eye display 100 augments views of a physical, real-world environment, with computer-generated elements (e.g., images, video, sound, etc.).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating image data of a physical environment in which the user is located, for performing location tracking of the user. Imaging device 535 may further include, for example, image sensors 150a-150b of FIG. 1B for generating image data for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provide media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback applications, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some examples, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), or a gaze point of the user (e.g., based on image data provided by imaging device 535), a distance between an object and user (e.g., based on image data provided by imaging device 535).

Figure 6:
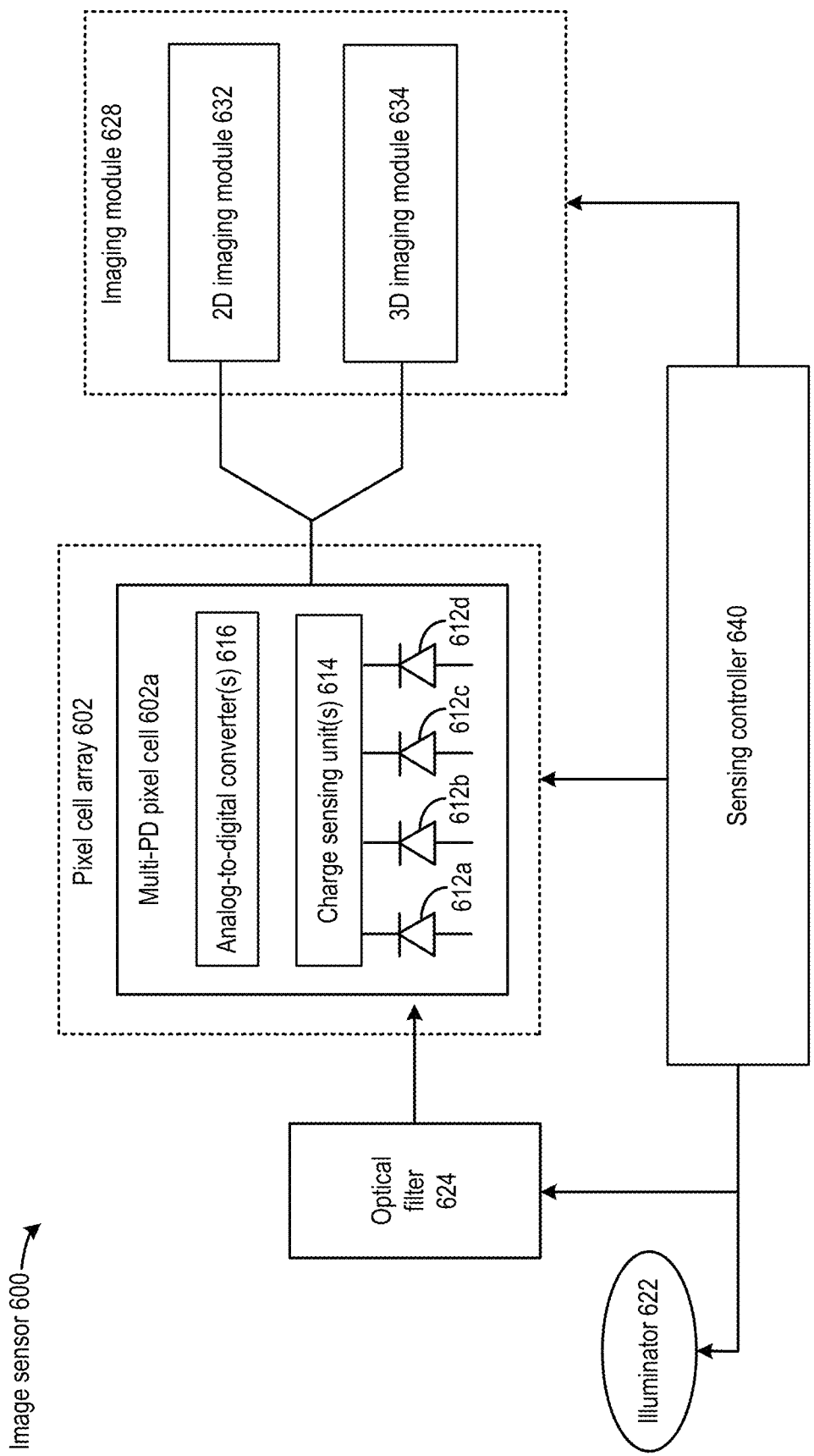
FIG. 6 illustrates block diagrams of examples of an image sensor.

FIG. 6 illustrates an example of an image sensor 600. Image sensor 600 can be part of near-eye display 100, and can provide 2D and 3D image data to control circuitries 510 of FIG. 5 to control the display content of near-eye display 100. As shown in FIG. 6, image sensor 600 may include an array of pixel cells 602 including pixel cell 602a. Although FIG. 6 illustrates only a single pixel cell 602, it is understood that an actual pixel cell array 602 can include may pixel cells.

Pixel cell 602a can include a plurality of photodiodes 612 including, for example, photodiodes 612a, 612b, 612c, and 612d, one or more charge sensing units 614, and one or more analog-to-digital converters 616. The plurality of photodiodes 612 can convert different components of incident light to charge. For example, photodiode 612a-612c can correspond to different visible light channels, in which photodiode 612a can convert a visible blue component (e.g., a wavelength range of 450-490 nanometers (nm)) to charge. Photodiode 612b can convert a visible green component (e.g., a wavelength range of 520-560 nm) to charge. Photodiode 612c can convert a visible red component (e.g., a wavelength range of 635-700 nm) to charge. Moreover, photodiode 612d can convert an infra-red component (e.g., 700-1000 nm) to charge. Each of the one or more charge sensing units 614 can include a charge storage device and a buffer to convert the charge generated by photodiodes 612a-612d to voltages, which can be quantized by one or more ADCs 616 into digital values. The digital values generated from photodiodes 612a-612c can represent the different visible light components of a pixel, and each can be used for 2D sensing in a particular visible light channel. Moreover, the digital value generated from photodiode 612d can represent the infra-red light component of the same pixel and can be used for 3D sensing. Although FIG. 6 shows that pixel cell 602a includes four photodiodes, it is understood that the pixel cell can include a different number of photodiodes (e.g., two, three, etc.).

In some examples, image sensor 600 may also include an illuminator 622, an optical filter 624, an imaging module 628, and a sensing controller 630. Illuminator 622 may be an infra-red illuminator, such as a laser, a light emitting diode (LED), etc., that can project infra-red light for 3D sensing. The projected light may include, for example, structured light, light pulses, etc. Optical filter 624 may include an array of filter elements overlaid on the plurality of photodiodes 612a-612d of each pixel cell including pixel cell 606a. Each filter element can set a wavelength range of incident light received by each photodiode of pixel cell 606a. For example, a filter element over photodiode 612a may transmit the visible blue light component while blocking other components, a filter element over photodiode 612b may transmit the visible green light component, a filter element over photodiode 612c may transmit the visible red light component, whereas a filter element over photodiode 612d may transmit the infra-red light component.

Image sensor 600 further includes an imaging module 628. Imaging module 628 may further include a 2D imaging module 632 to perform 2D imaging operations and a 3D imaging module 634 to perform 3D imaging operations. The operations can be based on digital values provided by ADCs 616. For example, based on the digital values from each of photodiodes 612a-612c, 2D imaging module 632 can generate an array of pixel values representing an intensity of an incident light component for each visible color channel, and generate an image frame for each visible color channel. Moreover, 3D imaging module 634 can generate a 3D image based on the digital values from photodiode 612d. In some examples, based on the digital values, 3D imaging module 634 can detect a pattern of structured light reflected by a surface of an object, and compare the detected pattern with the pattern of structured light projected by illuminator 622 to determine the depths of different points of the surface with respect to the pixel cells array. For detection of the pattern of reflected light, 3D imaging module 634 can generate pixel values based on intensities of infra-red light received at the pixel cells. As another example, 3D imaging module 634 can generate pixel values based on time-of-flight of the infra-red light transmitted by illuminator 622 and reflected by the object.

Figure 7A:
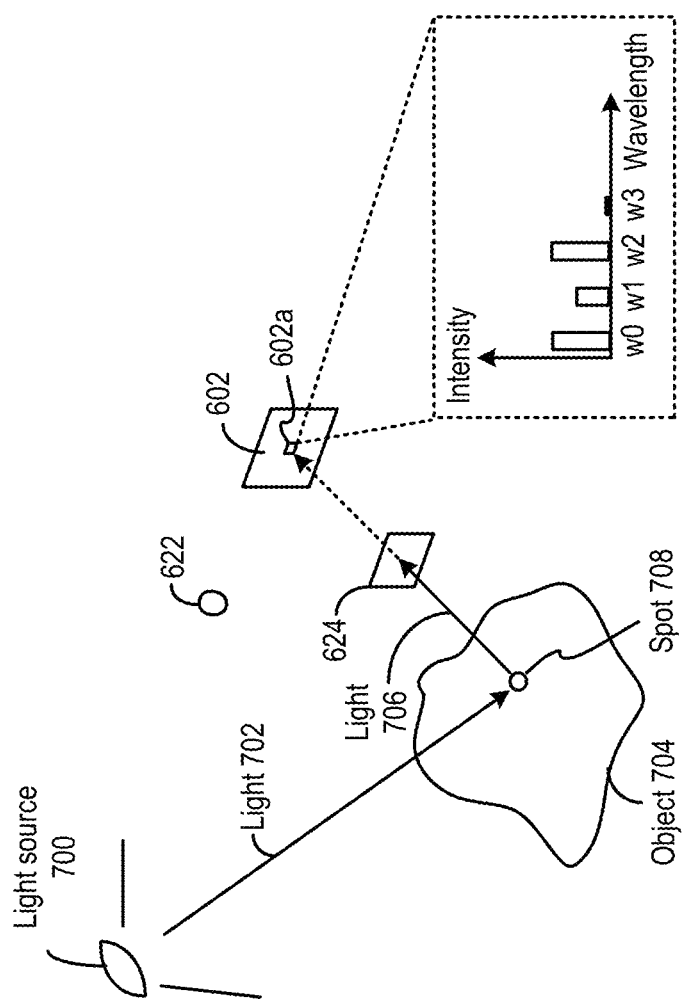
FIG. 7A, FIG. 7B, and FIG. 7C illustrate operations for determining light intensities of different ranges by examples of FIG. 6.
Figure 7B:
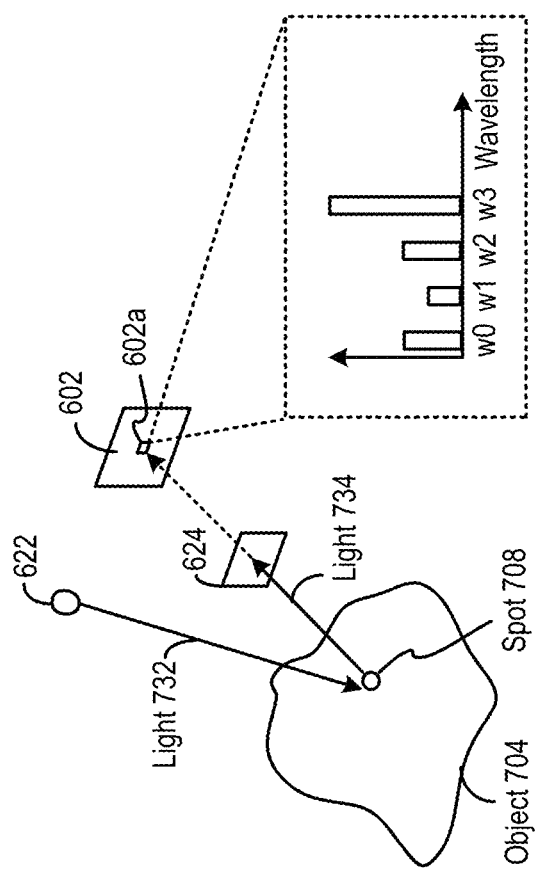
Figure 7C:
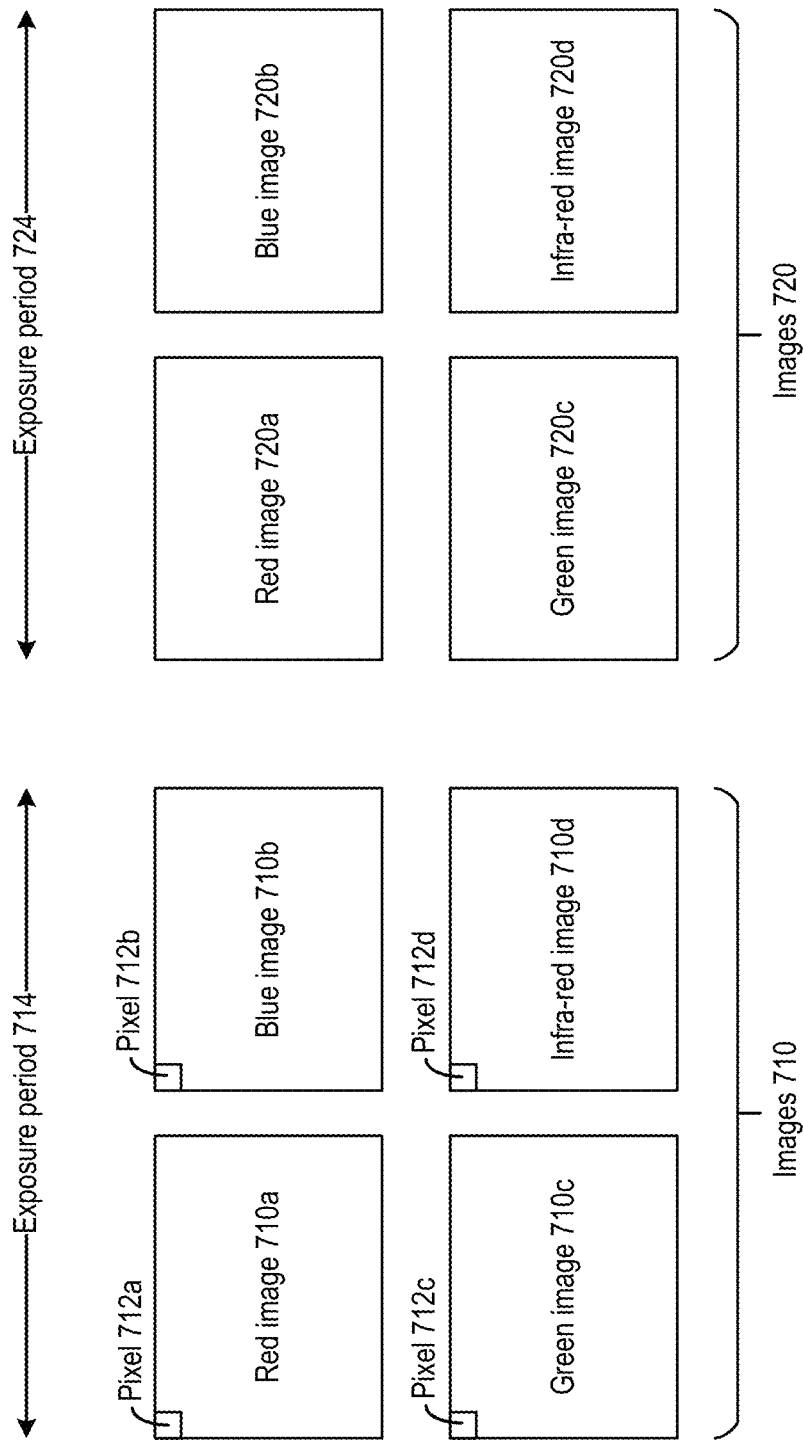

Image sensor 600 further includes a sensing controller 640 to control different components of image sensor 600 to perform 2D and 3D imaging of an object. Reference is now made to FIG. 7A-FIG. 7C, which illustrate examples of operations of image sensor 600 for 2D and 3D imaging. FIG. 7A illustrates an example of operations for 2D imaging. For 2D imaging, pixel cells array 602 can detect visible light in the environment including visible light reflected off an object. For example, referring to FIG. 7A, visible light source 700 (e.g., a light bulb, the sun, or other sources of ambient visible light) can project visible light 702 onto an object 704. Visible light 706 can be reflected off a spot 708 of object 704. Visible light 706 can also include the ambient infra-red light component. Visible light 706 can be filtered by optical filter array 624 to pass different components of visible light 706 of wavelength ranges w0, w1, w2, and w3 to, respectively, photodiodes 612a, 612b, 612c, and 612d of pixel cell 602a. Wavelength ranges w0, w1, w2, and w3 an correspond to, respectively, blue, green, red, and infra-red. As shown in FIG. 7A, as the infra-red illuminator 622 is not turned on, the intensity of infra-red component (w3) is contributed by the ambient infra-red light and can be very low. Moreover, different visible components of visible light 706 can also have different intensities. Charge sensing units 614 can convert the charge generated by the photodiodes to voltages, which can be quantized by ADCs 616 into digital values representing the red, blue, and green components of a pixel representing spot 708. Referring to FIG. 7C, after the digital values are generated, sensing controller 640 can control 2D imaging module 632 to generate, based on the digital values, sets of images including a set of images 710, which includes a red image frame 710a, a blue image frame 710b, and a green image frame 710c each representing one of red, blue, or green color image of a scene captured with the same exposure period 714. Each pixel from the red image (e.g., pixel 712a), from the blue image (e.g., pixel 712b), and from the green image (e.g., pixel 712c) can represent visible components of light from the same spot (e.g., spot 708) of a scene. A different set of images 720 can be generated by 2D imaging module 632 in a subsequent exposure period 724. Each of red image 710a, blue image 710b, and green image 710c can represent the scene in a specific color channel and can be provided to an application to, for example, extract image features from the specific color channel. As each image represents the same scene and each corresponding pixel of the images represent light from the same spot of the scene, the correspondence of images between different color channels can be improved.

Furthermore, image sensor 600 can also perform 3D imaging of object 704. Referring to FIG. 7B, sensing controller 610 can control illuminator 622 to project infra-red light 732, which can include a light pulse, structured light, etc., onto object 704. Infra-red light 732 can have a wavelength range of 700 nanometers (nm) to 1 millimeter (mm). Infra-red light 734 can reflect off spot 708 of object 704 and can propagate towards pixel cells array 602 and pass through optical filter 624, which can provide the infra-red component (of wavelength range w3) to photodiode 612d to convert to charge. Charge sensing units 614 can convert the charge to a voltage, which can be quantized by ADCs 616 into digital values. Referring to FIG. 7C, after the digital values are generated, sensing controller 640 can control 3D imaging module 634 to generate, based on the digital values, an infra-red image 710d of the scene as part of images 710 captured within exposure period 714. As infra-red image 710d can represent the same scene in the infra-red channel and a pixel of infra-red image 710d (e.g., pixel 712d) represents light from the same spot of the scene as other corresponding pixels (pixels 712a-712c) in other images within images 710, the correspondence between 2D and 3D imaging can be improved as well.

Figure 8A:
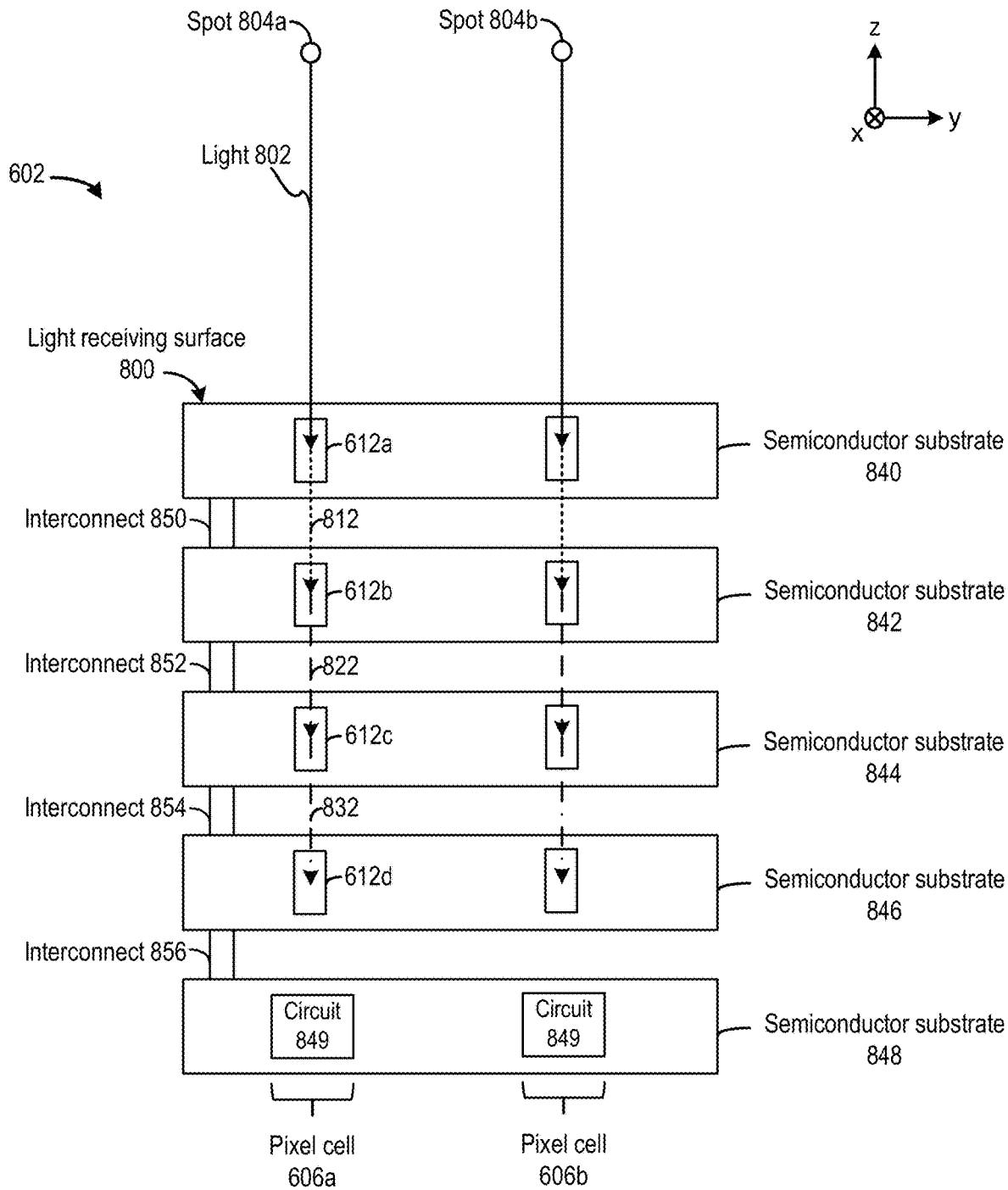
FIG. 8A, FIG. 8B, FIG. 8C, FIG. 8D, and FIG. 8E illustrate examples of components of the image sensor of FIG. 6.

FIG. 8A-FIG. 8E illustrate examples of arrangements of photodiodes 612 in an image sensor, such as within a pixel cell or between different pixel cells. As shown in FIG. 8A, the photodiodes 612a-612d in a pixel cell 602a can form a stack along an axis that is perpendicular to a light receiving surface 800 through which pixel cell 602a receives incident light 802 from a spot 804a. For example, the photodiodes 612a-612d can form a stack along a vertical axis (e.g., the z-axis) when the light receiving surface 800 is parallel with the x and y axes. Each photodiode can have a different distance from light receiving surface 800, and the distance can set the component of incident light 802 being absorbed and converted to charge by each photodiode. For example, photodiode 612a is closest to light receiving surface 800 and can absorb and convert the blue component to charge, which is of the shortest wavelength range among the other components. Light 812 includes the remaining components of light 802 (e.g., green, red, and infra-red) and can propagate to photodiode 612b, which can absorb and convert the green component. Light 822 includes the remaining components of light 812 (e.g., red and infra-red) and can propagate to photodiode 612c, which can absorb and convert the red component. The remaining infra-red component 832 can propagate to photodiode 612d to be converted to charge.

Each the photodiodes 612a, 612b, 612c, and 612d can be in a separate semiconductor substrate, which can be stacked to form image sensor 600. For example, photodiode 612a can be in a semiconductor substrate 840, photodiode 612b can be in a semiconductor substrate 842, photodiode 612c can be in a semiconductor substrate 844, whereas photodiode 612d can be in a semiconductor substrate 846. Each of substrates 840-846 can include a charge sensing unit, such as charge sensing units 614. Substrates 840-846 can form a sensor layer. Each semiconductor substrate can include other photodiodes of other pixel cells, such as pixel cells 602b to receive light from spot 804b. Image sensor 600 can include another semiconductor substrate 848 which can include pixel cell processing circuits 849 which can include, for example, ADCs 616, imaging module 628, sensing controller 640, etc. In some examples, charge sensing units 614 can be in semiconductor substrate 848. Semiconductor substrate 848 can form an application specific integrated circuit (ASIC) layer. Each semiconductor substrate can be connected to a metal interconnect, such as metal interconnects 850, 852, 854, and 856 to transfer the charge generated at each photodiode to processing circuit 849.

Figure 8B:
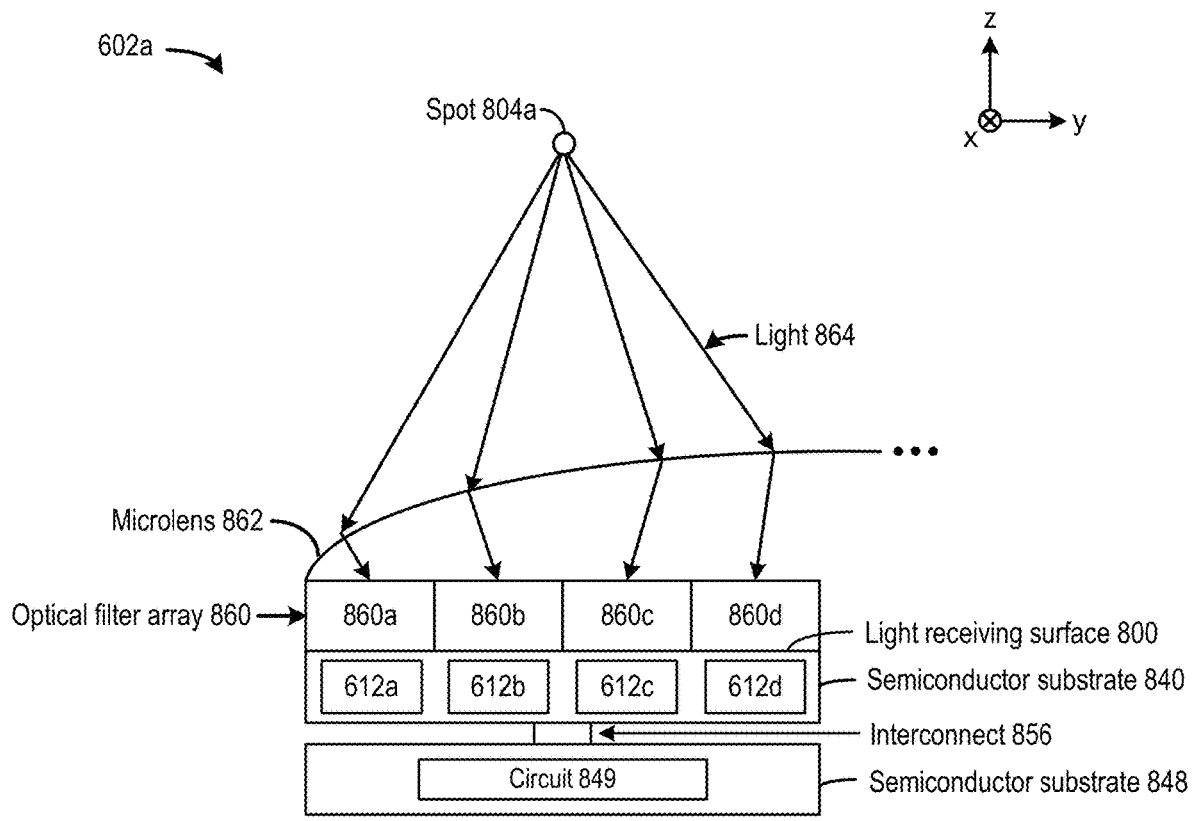
Figure 8B:
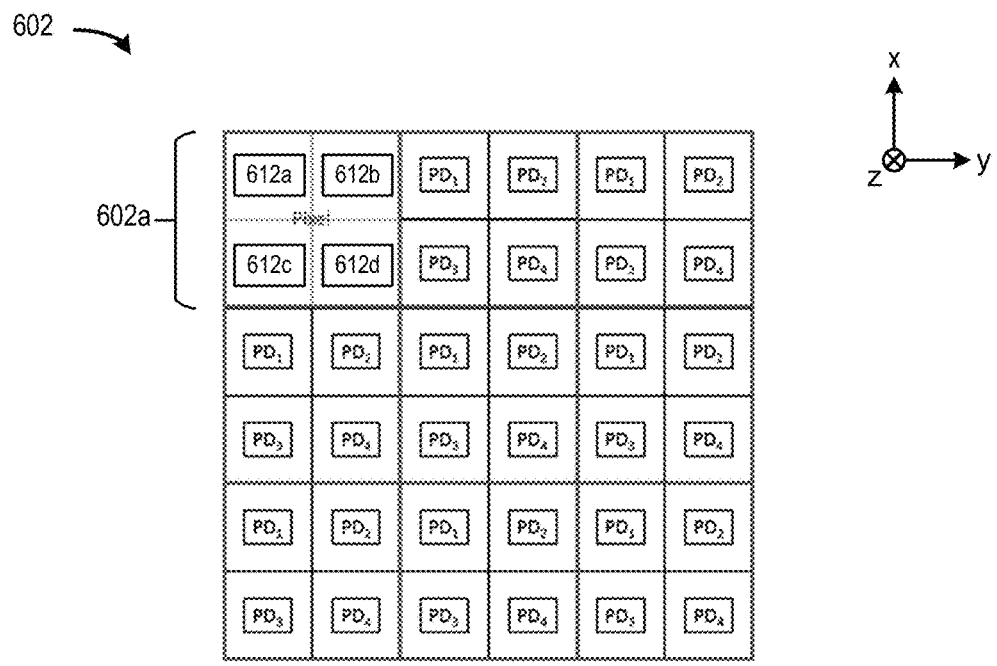
Figure 8C:
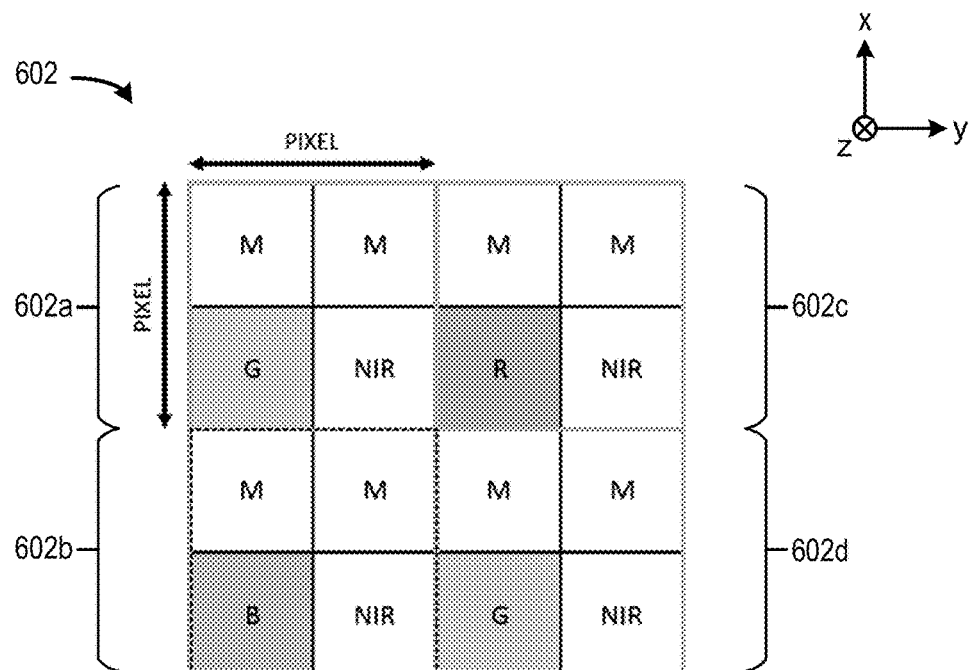
Figure 8C:
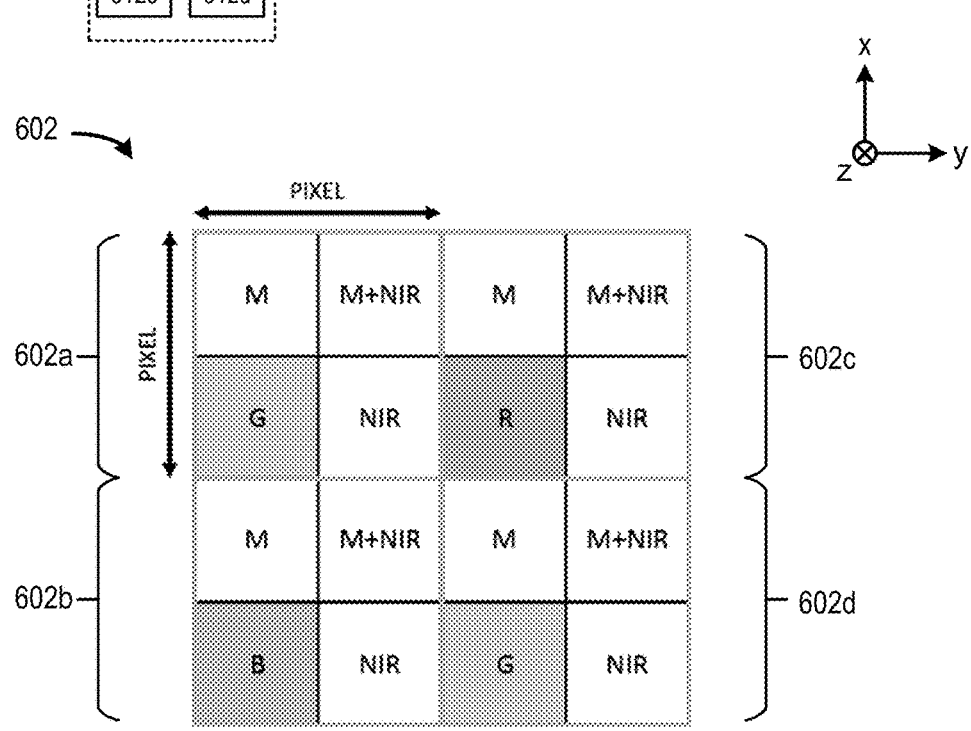
Figure 8D:
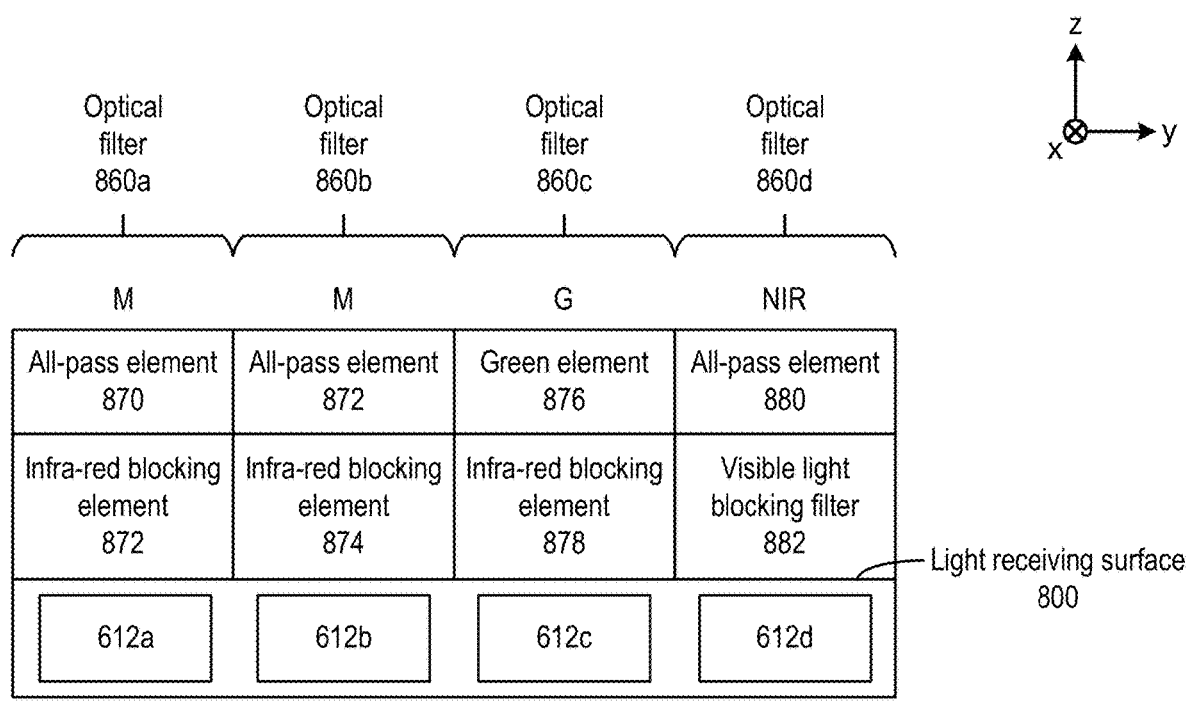
Figure 8D:
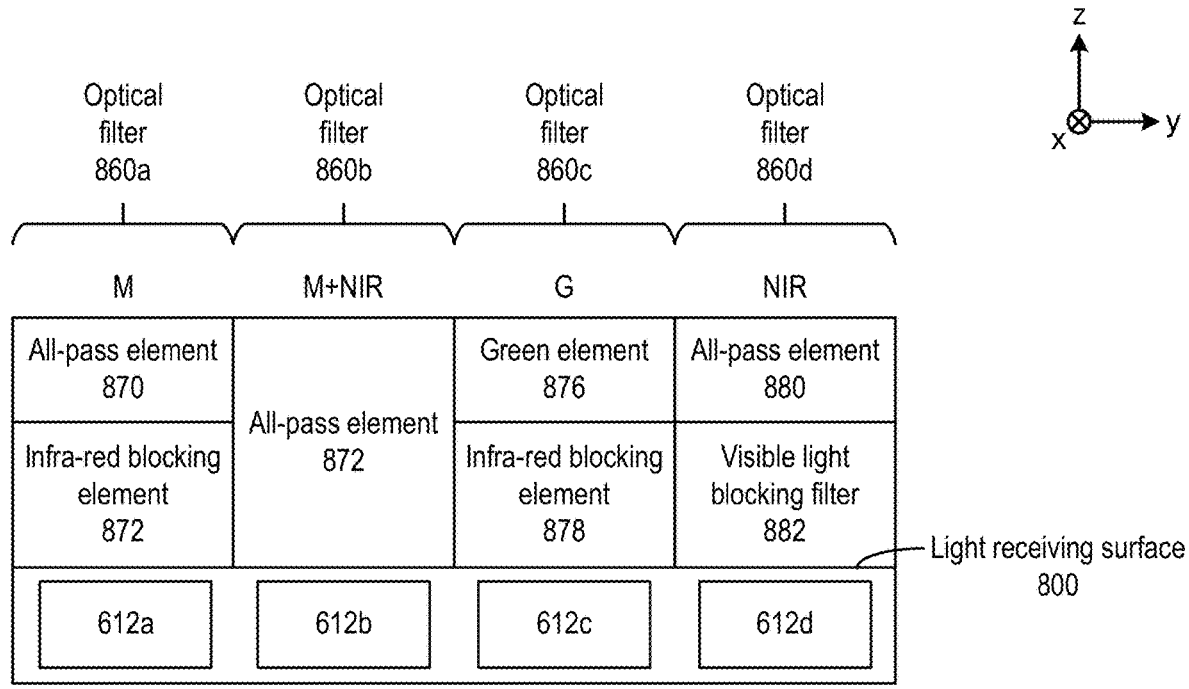

FIG. 8B-FIG. 8D illustrate other example arrangements of photodiodes 612 within a pixel cell. As shown in FIG. 8B-FIG. 8D, the plurality of photodiodes 612 can be arranged laterally, parallel with light receiving surface 800. The top graph of FIG. 8B illustrates a side view of an example of pixel cell 602a, whereas the bottom graph of FIG. 8B illustrates a top view of pixel array 602 including pixel cell 602a. The top graph and the bottom graph may illustrate two different example arrangements of photodiodes. For example, in the top graph four pixel cells 612a, 612b, 612c, and 612d can be arranged in a 4×1 pattern, while the bottom graph the four pixel cells are arranged in a 2×2 pattern.

As shown in FIG. 8B, with light receiving surface 800 being parallel with the x and y axes, photodiodes 612a, 612b, 612c, and 612d can be arranged adjacent to each other also along the x and y axes in semiconductor substrate 840. Pixel cell 602a further includes an optical filter array 860 overlaid on the photodiodes. Optical filter array 860 can be part of optical filter 624. Optical filter array 860 can include a filter element overlaid on each of photodiodes 612a, 612b, 612c, and 612d to set a wavelength range of incident light component received by the respective photodiode. For example, filter element 860a is overlaid on photodiode 612a and can allow only visible blue light to enter photodiode 612a. Moreover, filter element 860b is overlaid on photodiode 612b and can allow only visible green light to enter photodiode 612b. Further, filter element 860c is overlaid on photodiode 612c and can allow only visible red light to enter photodiode 612c. Filter element 860d is overlaid on photodiode 612d and can allow only infra-red light to enter photodiode 612d.

Pixel cell 602a further includes one or more microlens 862 which can project light 864 from a spot of a scene (e.g., spot 804a) via optical tiler array 860 to different lateral locations of light receiving surface 800, which allows each photodiode to become a sub-pixel of pixel cell 602a and to receive components of light from the same spot corresponding to a pixel. In some examples, a single microlens 862 can be overlaid on multiple pixels as shown in FIG. 8B. In some examples, a single microlens 862 can be overlaid on a pixel, and each pixel can have a single microlens.

Pixel cell 602a can also include semiconductor substrate 848 which can include circuit 849 (e.g., charge sensing units 614, ADCs 616, etc.) to generate digital values from the charge generated by the photodiodes. Semiconductor substrates 840 and 848 can form a stack and can be connected with interconnect 856. In FIG. 8B, semiconductor substrate 840 can form a sensor layer, whereas semiconductor substrate 848 can form an ASIC layer.

The arrangements of FIG. 8B, in which the photodiodes are arranged laterally and an optical filter array is used to control the light components received by the photodiodes, can offer numerous advantages. For example, the number of stacks and the number of semiconductor substrates can be reduced, which not only reduce the vertical height but also the interconnects among the semiconductor substrates. Moreover, relying on filter elements rather than the propagation distance of light to set the wavelength ranges of the components absorbed by each photodiode can offer flexibilities in selecting the wavelength ranges. As shown in top graph of FIG. 8C, pixel cells array 602 can include different optical filter arrays 860 for different pixel cells. For example, each pixel cell of pixel cells array 602 can have an optical filter array that provides monochrome channel of a wavelength range of 380-740 nm (labelled with "M") for photodiodes 612a and 612b, and an infra-red channel of a wavelength range of 700-1000 nm (labelled with "NIR") for photodiode 612d. But the optical filter arrays may also provide a different visible color channel for the different pixel cells. For example, the optical filter arrays 860 for pixel cells array 602a, 602b, 602c, and 602d may provide, respectively, a visible green channel (labelled with "G"), a visible red channel (labelled with "R"), a visible blue channel (labelled with "B"), and a visible green channel for photodiode 612c of the pixel cells arrays. As another example, as shown in the bottom graph of FIG. 8C, each optical filter array 860 can provide a monochrome and infra-red channel (labelled "M+NIR") which spans a wavelength range of 380-1000 nm for photodiode 612b of each pixel cells array.

FIG. 8D illustrates examples of optical filter array 860 to provide the example channels shown in FIG. 8C. As shown in FIG. 8D, optical filter array 860 can include a stack of optical filters to select a wavelength range of light received by each photodiode within a pixel cell array. For example, referring to the top graph of FIG. 8D, optical filter 860a can include an all-pass element 870 (e.g., a transparent glass that passes both visible light and infra-red light) and an infra-red blocking element 872 forming a stack to provide a monochrome channel for photodiode 612a. Optical filter 860b can also include an all-pass element 874 and an infra-red blocking element 876 to also provide a monochrome channel for photodiode 612b. Further, optical filter 860c can include a green-pass element 876 which passes green visible light (but reject other visible light component), and an infra-red blocking element 878, to provide a green channel for photodiode 612c. Lastly, optical filter 860d can include an all-pass element 880 and a visible light blocking filter 882 (which can block out visible light but allows infra-red light to go through) to provide an infra-red channel for photodiode 612d. In another example, as shown in the bottom graph of FIG. 8D, optical filter 860b can include only all-pass element 872 to provide a monochrome and infra-red channel for photodiode 612b.

Figure 8E:
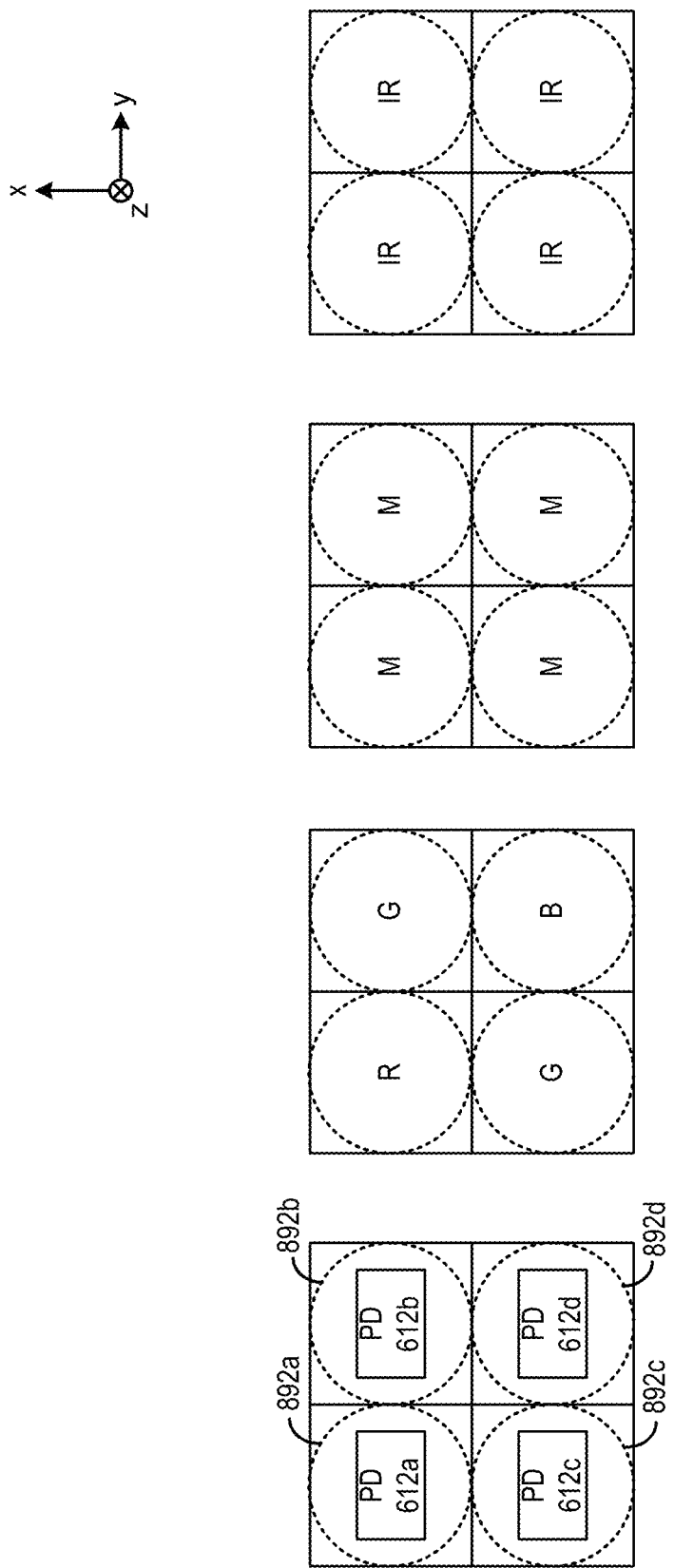

FIG. 8E illustrates another example optical configurations of photodiodes 612. As shown in FIG. 8E, instead of overlaying a microlens 862 over a plurality of photodiodes, as shown in FIG. 8B, a plurality of microlenses 892 can be overlaid over the plurality of photodiodes 612a-612d, which are arranged in a 2×2 format. For example, microlens 892a can be overlaid over photodiode 612a, microlens 892b can be overlaid over photodiode 612b, microlens 892c can be overlaid over photodiode 612c, whereas microlens 892d can be overlaid over photodiode 612d. With such arrangements, each photodiode can correspond to a pixel, which can shrink the required footprint of pixel cell array to achieve a target resolution.

Different patterns of filter arrays can be inserted between plurality of microlenses 862 and plurality of photodiodes 612. For example, as shown in FIG. 8E, a 2×2 color filter pattern comprising red (R), green (G), and blue (B) filters can be inserted between the microlenses and the photodiodes. Moreover, an all-pass filter pattern can also be inserted between the microlenses and the photodiodes so that each photodiode detects a monochrome channel. Also, an infra-red filter pattern can also be inserted between the microlenses and the photodiodes so that each photodiode detects infra-red light.

Figure 9:
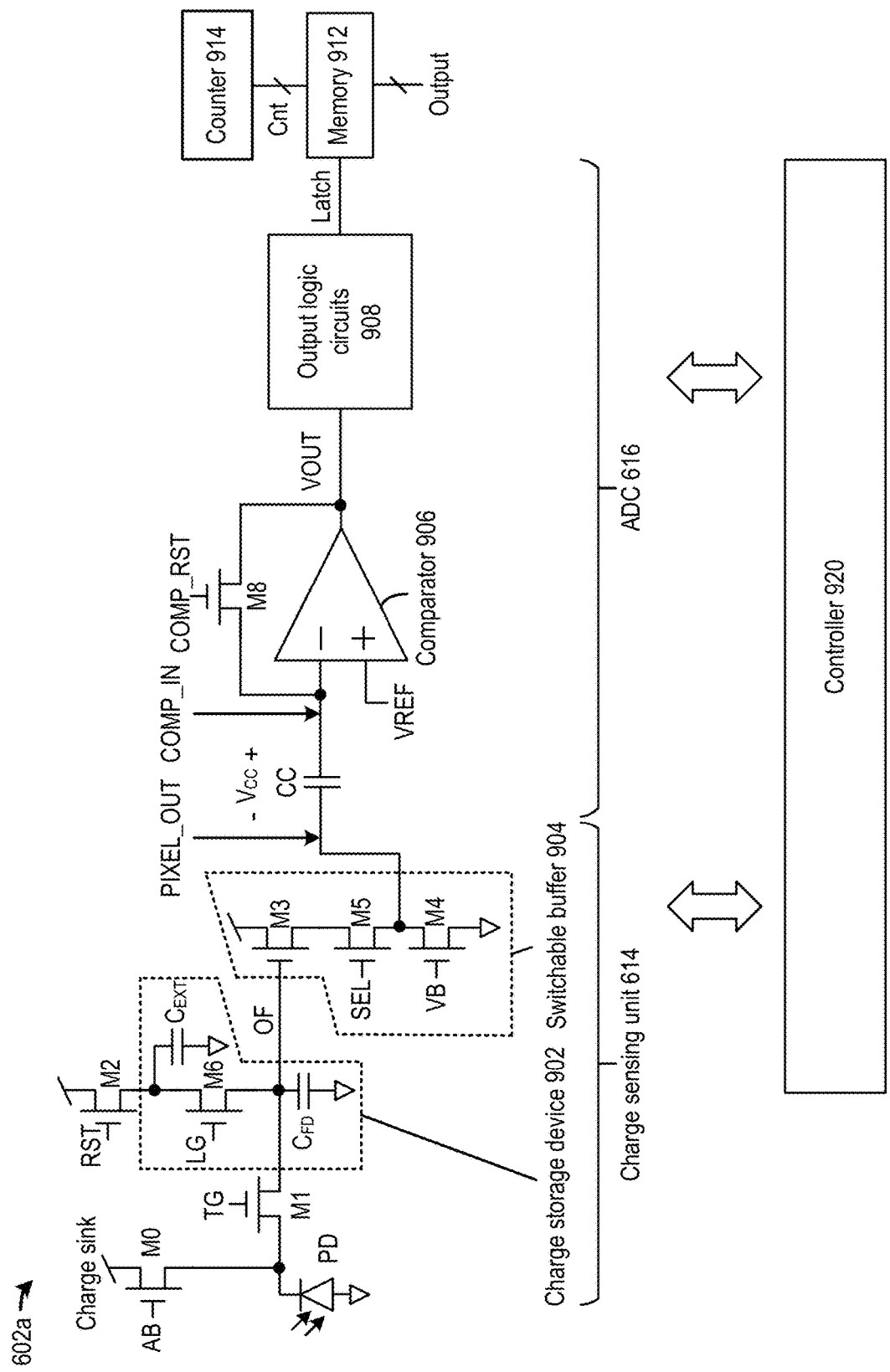
FIG. 9 illustrates examples of internal components of a pixel cell of FIG. 6.

Reference is now made to FIG. 9, which illustrates additional components of pixel cell 602a including an example of charge sensing unit 614 and ADC 616. As shown in FIG. 9, pixel cell 602a can include a photodiode PD (e.g., photodiode 612a), a charge draining transistor M0, a charge transfer transistor M1, a charge sensing unit 614 comprising a charge storage device 902 and a switchable buffer 904, and an ADC 616 comprising a CC capacitor, a comparator 906, and output logic circuits 908. The output of comparator 906 is coupled, via output logic circuits 908, with a memory 912 and a counter 914 which can be internal to or external to pixel cell 602a. Pixel cell 602 further includes a controller 920 to control the transistors, charge sensing unit 614, as well as ADC 616, As to be described below, controller 920 can set an exposure period to accumulate charge based on incident light, and can control charge sensing unit 614 and ADC 616 to perform multiple quantization operations associated with different light intensity ranges to generate a digital representation of the intensity of the incident light. Controller 920 can be internal to pixel cell 602a or part of sensing controller 640. Each transistor in pixel cell 602a can include, for example, a metal-oxide-semiconductor field-effect transistor (MOSFET), a bipolar junction transistor (BJT), etc. Photodiode PD, charge draining transistor M0, charge transfer transistor M1, and charge sensing unit 614 can be in a sensor layer (e.g., substrates 840-846 of FIG. 8A, substrate 840 of FIG. 8B), whereas ADC 616, memory 912, and counter 914 can be in an ASIC layer (e.g., substrate 848 of FIG. 8A and FIG. 8B), with the two substrates forming a stack.

Specifically, charge transfer transistor M1 can be controlled by a TG signal provided by controller 920 to transfer some of the charge to charge storage device 902. In one quantization operation, charge transfer transistor M1 can be biased at a partially-on state to set a quantum well capacity of photodiode PD, which also sets a quantity of residual charge stored at photodiode PD. After photodiode PD is saturated by the residual charge, overflow charge can flow through charge transfer transistor M1 to charge storage device 902. In another quantization operation, charge transfer transistor M1 can be fully turned on to transfer the residual charge from photodiode PD to charge storage device for measurement. Moreover, charge draining transistor M0 is coupled between photodiode PD and a charge sink. Charge draining transistor M0 can be controlled by an anti-blooming (AB) signal provided by controller 920 to start an exposure period, in which photodiode PD can generate and accumulate charge in response to incident light. Charge draining transistor M0 can also be controlled to provide an anti-blooming function to drain away additional charge generated by photodiode PD to the charge sink after charge storage device 902 saturates, to prevent the additional charge from leaking into neighboring pixel cells.

Charge storage device 902 has a configurable capacity and can convert the charge transferred from transistor M1 to a voltage at the OF node. Charge storage device 902 includes a $C_{FD}$ capacitor (e.g., a floating drain) and a $C_{EXT}$ capacitor (e.g., a MOS capacitor, a metal capacitor, etc.) connected by a M6 transistor. M6 transistor can be enabled by a LG signal to expand the capacity of charge storage device 902 by connecting $C_{FD}$ and $C_{EXT}$ capacitors in parallel, or to reduce the capacity by disconnecting the capacitors from each other. The capacity of charge storage device 902 can be reduced for measurement of residual charge to increase the charge-to-voltage gain and to reduce the quantization error. Moreover, the capacity of charge storage device 902 can also be increased for measurement of overflow charge to reduce the likelihood of saturation and to improve nonlinearity. As to be described below, the capacity of charge storage device 902 can be adjusted for measurement of different light intensity ranges. Charge storage device 902 is also coupled with a reset transistor M2 which can be controlled by a reset signal RST, provided by controller 920, to reset $C_{FD}$ and $C_{EXT}$ capacitors between different quantization operations. In some examples, with transistor M1 fully enabled, reset signal RST can also be used to control the start and end of the exposure period in which PD generates and accumulates charge in response to light. In such examples, charge draining transistor M0 can be omitted.

Switchable buffer 904 can be include a transistor M3 configured as a source follower to buffer the voltage at the OF node to improve its driving strength. The buffered voltage can be at the input node PIXEL_OUT of ADC 616. The M4 transistor provides a current source for switchable buffer 904 and can be biased by a VB signal. Switchable buffer 904 also includes a transistor M5 which be enabled or disabled by a SEL signal. When transistor M5 is disabled, source follower M3 can be disconnected from the PIXEL_OUT node. As to be described below, pixel cell 602a may include multiple charge sensing units 614 each including a switchable buffer 904, and one of the charge sensing units can be coupled with PIXEL_OUT (and ADC 616) at one time based on the SEL signal.

Figure 10:
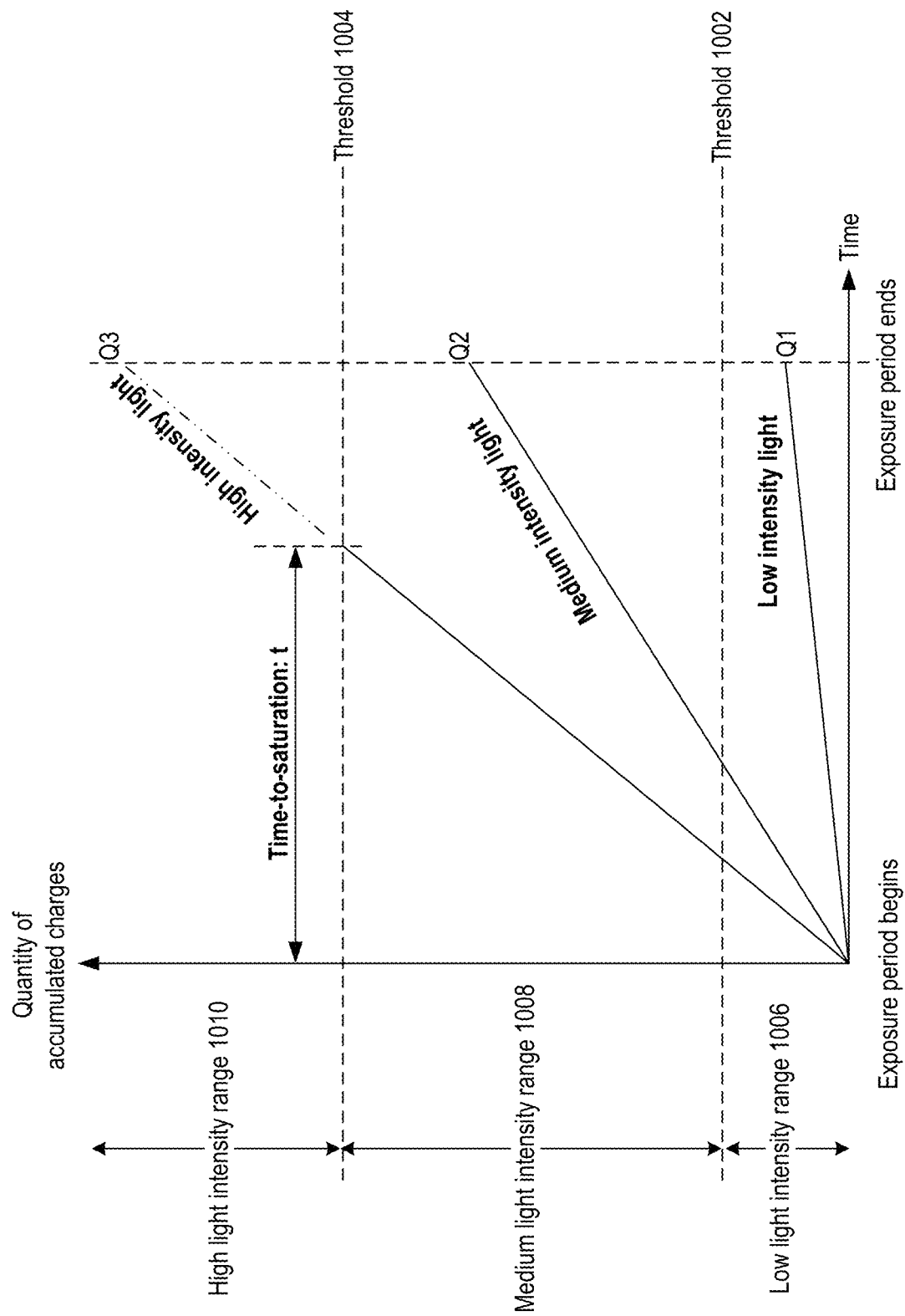
FIG. 10 illustrates examples of light intensity ranges to be measured by a pixel cell of FIG. 6.

As described above, charge generated by photodiode PD within an exposure period can be temporarily stored in charge storage device 902 and converted to a voltage. The voltage can be quantized to represent an intensity of the incident light based on a pre-determined relationship between the charge and the incident light intensity. Reference is now made to FIG. 10, which illustrates a quantity of charge accumulated with respect to time for different light intensity ranges. The total quantity of charge accumulated at a particular time point can reflect the intensity of light incident upon photodiode PD of FIG. 6 within an exposure period. The quantity can be measured when the exposure period ends. A threshold 1002 and a threshold 1004 can be defined for a threshold's quantity of charge defining a low light intensity range 1006, a medium light intensity range 1008, and a high light intensity range 1010 for the intensity of the incident light. For example, if the total accumulated charge is below threshold 1002 (e.g., Q1), the incident light intensity is within low light intensity range 1006. If the total accumulated charge is between threshold 1004 and threshold 1002 (e.g., Q2), the incident light intensity is within medium light intensity range 1008. If the total accumulated charge is above threshold 1004, the incident light intensity is within medium light intensity range 1010. The quantity of the accumulated charge, for low and medium light intensity ranges, can correlate with the intensity of the incident light, if the photodiode does not saturate within the entire low light intensity range 1006 and the measurement capacitor does not saturate within the entire medium light intensity range 1008.

The definitions of low light intensity range 1006 and medium light intensity range 1008, as well as thresholds 1002 and 1004, can be based on the full well capacity of photodiode PD and the capacity of charge storage device 902. For example, low light intensity range 706 can be defined such that the total quantity of residual charge stored in photodiode PD, at the end of the exposure period, is below or equal to the storage capacity of the photodiode, and threshold 1002 can be based on the full well capacity of photodiode PD. Moreover, medium light intensity range 1008 can be defined such that the total quantity of charge stored in charge storage device 902, at the end of the exposure period, is below or equal to the storage capacity of the measurement capacitor, and threshold 1004 can be based on the storage capacity of charge storage device 902. Typically threshold 1004 is can be based on a scaled storage capacity of charge storage device 902 to ensure that when the quantity of charge stored in charge storage device 902 is measured for intensity determination, the measurement capacitor does not saturate, and the measured quantity also relates to the incident light intensity. As to be described below, thresholds 1002 and 1004 can be used to detect whether photodiode PD and charge storage device 902 saturate, which can determine the intensity range of the incident light.

In addition, in a case where the incident light intensity is within high light intensity range 1010, the total overflow charge accumulated at charge storage device 902 may exceed threshold 1004 before the exposure period ends. As additional charge is accumulated, charge storage device 902 may reach full capacity before the end of the exposure period, and charge leakage may occur. To avoid measurement error caused due to charge storage device 902 reaching full capacity, a time-to-saturation measurement can be performed to measure the time duration it takes for the total overflow charge accumulated at charge storage device 902 to reach threshold 1004. A rate of charge accumulation at charge storage device 902 can be determined based on a ratio between threshold 1004 and the time-to-saturation, and a hypothetical quantity of charge (Q3) that could have been accumulated at charge storage device 902 at the end of the exposure period (if the capacitor had limitless capacity) can be determined by extrapolation according to the rate of charge accumulation. The hypothetical quantity of charge (Q3) can provide a reasonably accurate representation of the incident light intensity within high light intensity range 1010.

Referring back to FIG. 9, to measure high light intensity range 1010 and medium light intensity range 1008, charge transfer transistor M1 can be biased by TG signal in a partially turned-on state. For example, the gate voltage of charge transfer transistor M1 (TG) can be set based on a target voltage developed at photodiode PD corresponding to the full well capacity of the photodiode. With such arrangements, only overflow charge (e.g., charge generated by the photodiode after the photodiode saturates) will transfer through charge transfer transistor M1 to reach charge storage device 902, to measure time-to-saturation (for high light intensity range 1010) and/or the quantity of charge stored in charge storage device 902 (for medium light intensity range 1008). For measurement of medium and high light intensity ranges, the capacitance of charge storage device 902 (by connecting $C_{EXT}$ and $C_{FD}$) can also be maximized to increase threshold 1004.

Moreover, to measure low light intensity range 1006, charge transfer transistor M1 can be controlled in a fully turned-on state to transfer the residual charge stored in photodiode PD to charge storage device 902. The transfer can occur after the quantization operation of the overflow charge stored at charge storage device 902 completes and after charge storage device 902 is reset. Moreover, the capacitance of charge storage device 902 can be reduced. As described above, the reduction in the capacitance of charge storage device 902 can increase the charge-to-voltage conversion ratio at charge storage device 902, such that a higher voltage can be developed for a certain quantity of stored charge. The higher charge-to-voltage conversion ratio can reduce the effect of measurement errors (e.g., quantization error, comparator offset, etc.) introduced by subsequent quantization operation on the accuracy of low light intensity determination. The measurement error can set a limit on a minimum voltage difference that can be detected and/or differentiated by the quantization operation. By increasing the charge-to-voltage conversion ratio, the quantity of charge corresponding to the minimum voltage difference can be reduced, which in turn reduces the lower limit of a measurable light intensity by pixel cell 602a and extends the dynamic range.

The charge (residual charge and/or overflow charge) accumulated at charge storage device 902 can develop an analog voltage at the OF node, which can be buffered by switchable buffer 904 at PIXEL_OUT and quantized by ADC 616. As shown in FIG. 9, ADC 616 includes a comparator 906 which can be reset by a transistor M8, and output logic circuits 908. ADC 616 is also coupled with memory 912 and counter 914. Counter 914 can generate a set of count values based on a free-running clock signal, whereas memory 912 can be controlled, by comparator 906 via output logic circuits 908, to store a count value (e.g., the latest count value) generated by counter 914. Memory 912 can be, for example, a latch circuit to store the counter value based on local pixel value as described below. The stored count value can be output via pixel output buses 816.

Comparator 906 can compare an analog voltage COMP_IN, which is derived from PIXEL_OUT by the CC capacitor, against a threshold VREF, and generate a decision VOUT based on the comparison result. The CC capacitor can be used in a noise/offset compensation scheme to store the reset noise and comparator offset information in a VCC voltage, which can be added to the PIXEL_OUT voltage to generate the COMP_IN voltage, to cancel the reset noise component in the PIXEL_OUT voltage. The offset component remains in the COMP_IN voltage and can be cancelled out by the offset of comparator 906 when comparator 906 compares the COMP_IN voltage against threshold VREF to generate the decision VOUT. Comparator 906 can generate a logical one for VOUT if the COMP_IN voltage equals or exceeds VREF. Comparator 906 can also generate a logical zero for VOUT if the COMP_IN voltage falls below VREF. VOUT can control a latch signal which controls memory 912 to store a count value from counter 914.

Figure 11B:
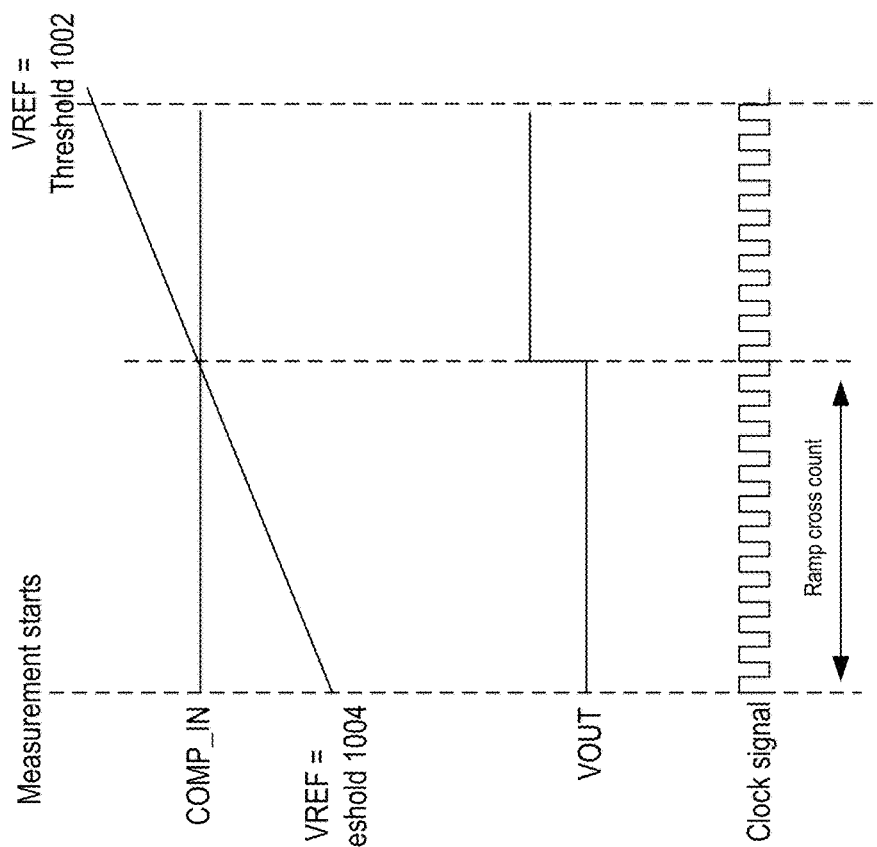
FIG. 11A, FIG. 11B, FIG. 11C, and FIG. 11D illustrate techniques for performing quantization.
Figure 11A:
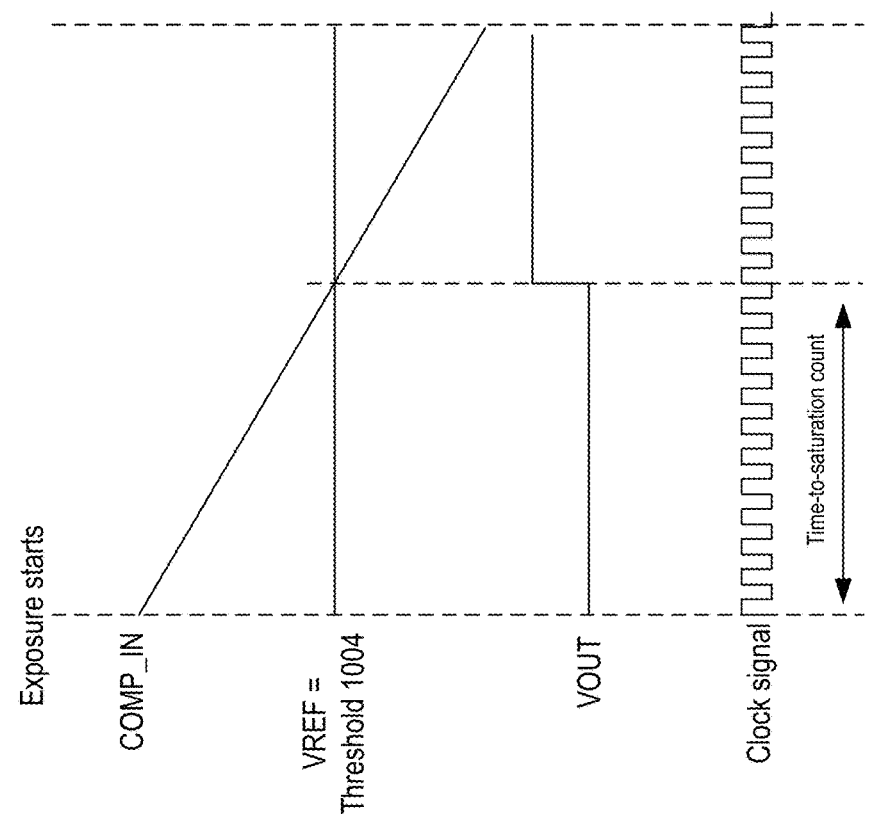

FIG. 11A illustrates an example of time-to-saturation measurement by ADC 616. To perform the time-to-saturation measurement, a threshold generator (which can be external to pixel cell 602a) can generate a fixed VREF. Fixed VREF can be set at a voltage corresponding a charge quantity threshold for saturation of charge storage device 902 (e.g., threshold 1004 of FIG. 10). Counter 914 can start counting right after the exposure period starts (e.g., right after charge draining transistor M0 is disabled). As the COMP_IN voltage ramps down (or up depending on the implementation) due to accumulation of overflow charge at charge storage device 902, clock signal keeps toggling to update the count value at counter 914. The COMP_IN voltage may reach the fixed VREF threshold at a certain time point, which causes VOUT to flip from low to high. The change of VOUT may stop the counting of counter 914, and the count value at counter 914 may represent the time-to-saturation.

FIG. 11B illustrates an example of measurement of a quantity of charge stored at charge storage device 902. After measurement starts, the threshold generator can generate a ramping VREF, which can either ramp up (in the example of FIG. 11B) or ramp down depending on implementation. The rate of ramping can be based on the frequency of the clock signal supplied to counter 914. In a case where overflow charge is measured, the voltage range of ramping VREF can be between threshold 1004 (charge quantity threshold for saturation of charge storage device 902) and threshold 1002 (charge quantity threshold for saturation of photodiode PD), which can define the medium light intensity range. In a case where residual charge is measured, the voltage range of the ramping VREF can be based on threshold 1002 and scaled by the reduced capacity of charge storage device 902 for residual charge measurement. In the example of FIG. 11B, the quantization process can be performed with uniform quantization steps, with VREF increasing (or decreasing) by the same amount for each clock cycle. The amount of increase (or decrease) of VREF corresponds to a quantization step. When VREF reaches within one quantization step of the COMP_IN voltage, VOUT of comparator 906 flips, which can stop the counting of counter 914, and the count value can correspond to a total number of quantization steps accumulated to match, within one quantization step, the COMP_IN voltage. The count value can become a digital representation of the quantity of charge stored at charge storage device 902, as well as the digital representation of the incident light intensity.

As discussed above, ADC 616 can introduce quantization errors when there is a mismatch between a quantity of charge represented by the quantity level output by ADC 616 (e.g., represented by the total number of quantization steps) and the actual input quantity of charge that is mapped to the quantity level by ADC 808. The quantization error can be reduced by using a smaller quantization step size. In the example of FIG. 11B, the quantization error can be reduced by the amount of increase (or decrease) in VREF per clock cycle.

Although quantization error can be reduced by using smaller quantization step sizes, area and performance speed may limit how far the quantization step can be reduced. With smaller quantization step size, the total number of quantization steps needed to represent a particular range of charge quantities (and light intensity) may increase. A larger number of data bits may be needed to represent the increased number of quantization steps (e.g., 8 bits to represent 255 steps, 7 bits to represent 127 steps, etc.). The larger number of data bits may require additional buses to be added to pixel output buses 816, which may not be feasible if pixel cell 601 is used on a head-mounted device or other wearable devices with very limited spaces. Moreover, with a larger number of quantization step size, ADC 808 may need to cycle through a larger number of quantization steps before finding the quantity level that matches (with one quantization step), which leads to increased processing power consumption and time, and reduced rate of generating image data. The reduced rate may not be acceptable for some applications that require a high frame rate (e.g., an application that tracks the movement of the eyeball).

One way to reduce quantization error is by employing a non-uniform quantization scheme, in which the quantization steps are not uniform across the input range. FIG. 11C illustrates an example of a mapping between the ADC codes (the output of the quantization process) and the input charge quantity level for a non-uniform quantization process and a uniform quantization process. The dotted line illustrates the mapping for the non-uniform quantization process, whereas the solid line illustrates the mapping for the uniform quantization process. For the uniform quantization process, the quantization step size (denoted by $\Delta_1$) is identical for the entire range of input charge quantity. In contrast, for the non-uniform quantization process, the quantization step sizes are different depending on the input charge quantity. For example, the quantization step size for a low input charge quantity (denoted by $\Delta_S$) is smaller than the quantization step size for a large input charge quantity (denoted by $\Delta_L$). Moreover, for the same low input charge quantity, the quantization step size for the non-uniform quantization process ($\Delta_S$) can be made smaller than the quantization step size for the uniform quantization process ($\Delta_1$).

One advantage of employing a non-uniform quantization scheme is that the quantization steps for quantizing low input charge quantities can be reduced, which in turn reduces the quantization errors for quantizing the low input charge quantities, and the minimum input charge quantities that can be differentiated by ADC 616 can be reduced. Therefore, the reduced quantization errors can push down the lower limit of the measureable light intensity of the image sensor, and the dynamic range can be increased. Moreover, although the quantization errors are increased for the high input charge quantities, the quantization errors may remain small compared with high input charge quantities. Therefore, the overall quantization errors introduced to the measurement of the charge can be reduced. On the other hand, the total number of quantization steps covering the entire range of input charge quantities may remain the same (or even reduced), and the aforementioned potential problems associated with increasing the number of quantization steps (e.g., increase in area, reduction in processing speed, etc.) can be avoided.

Figure 11D:
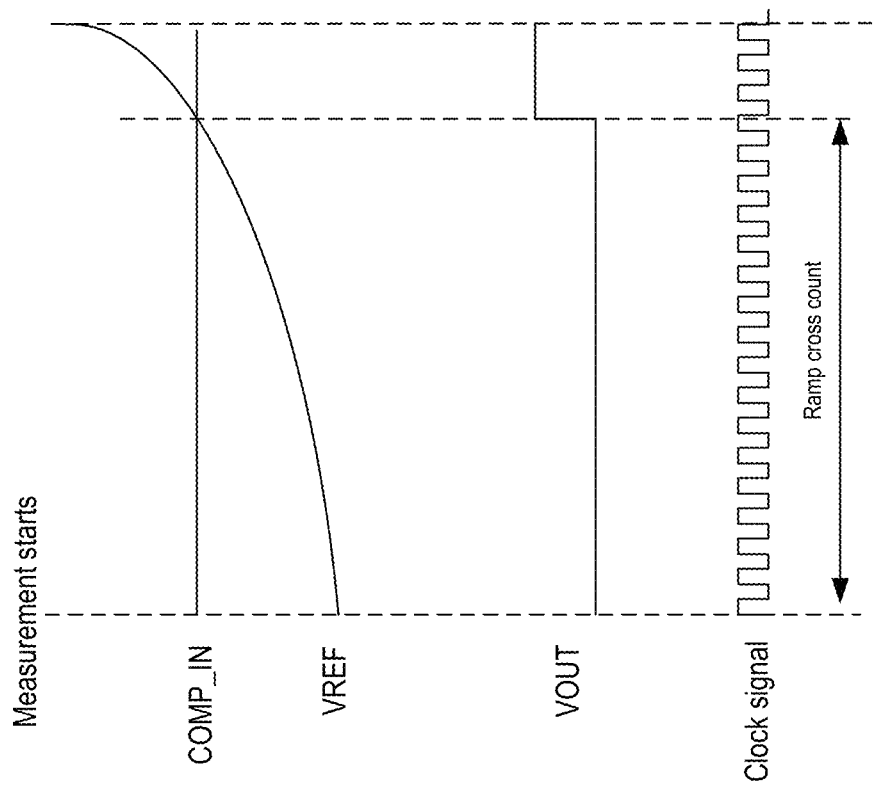
Figure 11C:
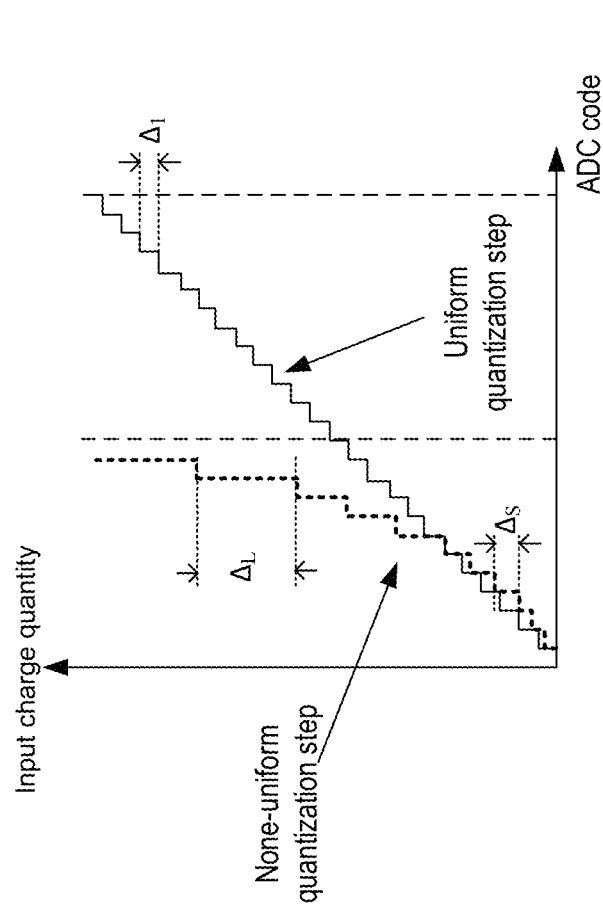

FIG. 11D illustrates an example of quantizing an analog voltage by pixel ADC 808 using a non-uniform quantization process. Compared with FIG. 11B (which employs a uniform quantization process), VREF increases in a non-linear fashion with each clock cycle, with a shallower slope initially and a steeper slope at a later time. The differences in the slopes are attributed to the uneven quantization step sizes. For lower counter count values (which correspond to a lower input quantity range), the quantization steps are made smaller, hence VREF increases at a slower rate. For higher counter count values (which correspond to a higher input quantity range), the quantization steps are made larger, hence VREF increases at a higher rate. The non-uniform VREF slope can be generated based on, for example, changing the frequency of counting of counter 814, changing the relationship between the VREF voltage and the count values of counter 914, etc. In some examples, the non-uniform quantization process of FIG. 11D can be employed for light intensity determination for low light intensity range 1006 and medium light intensity range 1008.

Referring back to FIG. 9, controller 920 can perform a TTS quantization operation, a quantization operation to measure a quantity of overflow charge (herein after, "FD ADC" operation), and a quantization operation to measure a quantity of residual charge (hereinafter "PD ADC" operation). Controller 920 can also skip one or more of the quantization operations. Output logic circuits 908 can select which of the quantization operations to store the count value at memory 912. Output logic circuits 908 can make the selection based on determining, based on the output of comparator 906 in each quantization operation, whether a quantity of the residual charge in photodiode PD exceeds a saturation threshold of the photodiode (e.g., corresponding to threshold 1002 of FIG. 10), and whether a quantity of the overflow charge in charge storage device 902 exceeds a saturation threshold of the charge storage device (e.g., corresponding to threshold 1004 of FIG. 10). If output logic circuits 908 detect that the quantity of the overflow charge exceeds threshold 1004 during the TTS operation, output logic circuits 908 can store the TTS output in memory 912. If output logic circuits 908 detect that the quantity of the overflow charge does not exceed threshold 1004 but that the quantity of the residual charge exceeds threshold 1002, output logic circuits 908 can store the FD ADC output in memory 912. Lastly if output logic circuits 908 detect the quantity of the residual charge does not exceed threshold 1002, output logic circuits 908 can store the PD ADC output in memory 912. In some examples, output logic circuits 908 can include registers to store one or more states of whether saturation of charge storage device 902 is detected and whether the saturation of photodiode PD is detected, which output logic circuits 908 can use to perform the selection.

Figure 12A:
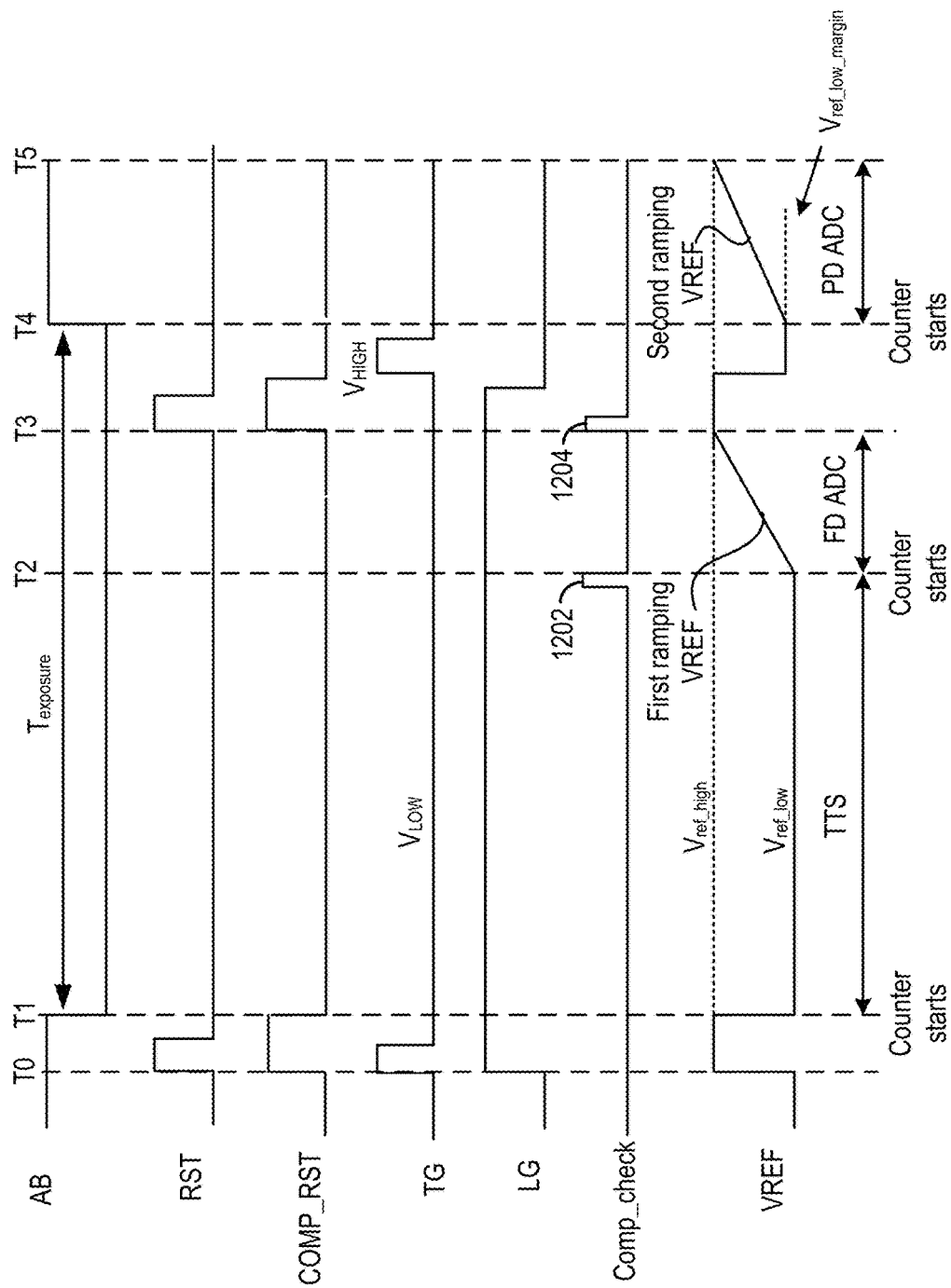
FIG. 12A and FIG. 12B illustrate example sequences of control signals to perform light intensity measurement.
Figure 12B:
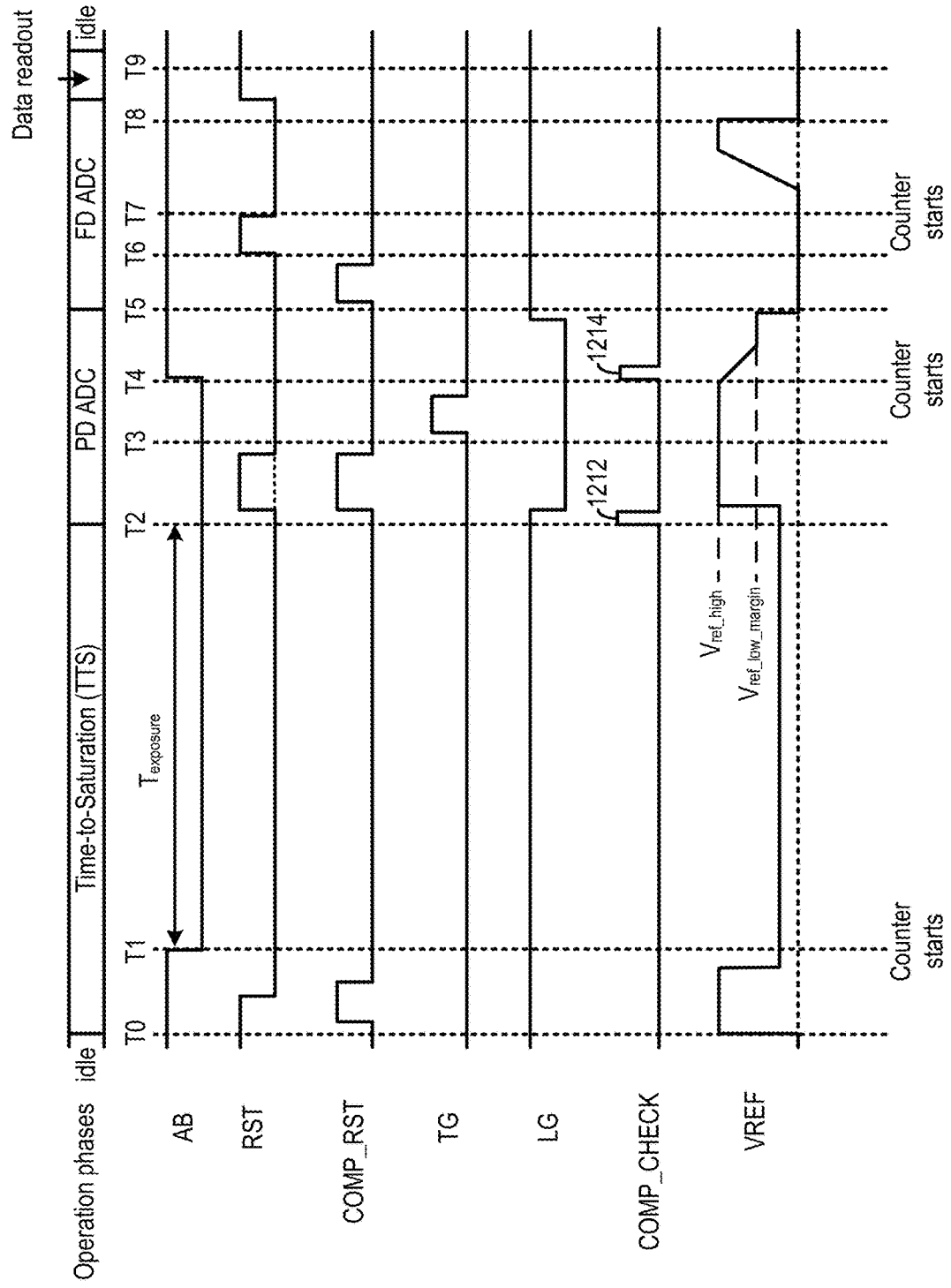

Reference is now made to FIG. 12A and FIG. 12B, which illustrate example sequences of the control signals of pixel cell 602a generated by controller 920. Both FIG. 12A and FIG. 12B illustrate the change of AB, RST, COMP_RST, TG, LG, and VREF with respect to time. Referring to FIG. 12A, the period between times T0 and T1 can correspond to a first reset phase, in which charge storage device 902 and comparator 906 can be put in a reset state by controller 920 by asserting the RST and COMP_RST signals, while the AB signal can be asserted to prevent charge generated by photodiode PD from reaching charge storage device 902. Both RST and LG signals are asserted to reset $C_{FD}$ and $C_{EXT}$ capacitors to set PIXEL_OUT at the reset level. With COMP_RST signal asserted and the positive terminal of comparator 906 connected to $V_{ref\_high}$, COMP_IN can be set to a sum of $V_{ref\_high}$ and comparator offset $V_{comp\_offset}$. Moreover, with RST signal asserted, PIXEL_OUT can be set the reset voltage $V_{pixel\_out\_rst}$ and can include reset noise $V\sigma_{KTC}$. A first sampling operation can be performed by the CC capacitor to store a $V_{CC}$ voltage including the components of the comparator offset, the reset noise, and PIXEL_OUT voltage at the reset level, as follows:

$$V_{CC}(T1) = (V_{ref\_high} + V_{comp\_offset}) - (V_{pixel\_out\_rst} + V\sigma_{KTC})$$ (Equation 1)

At time T1, the RST signal, the AB signal, and the COMP_RST signal are released, which starts an exposure period (labelled $T_{exposure}$) in which photodiode PD can accumulate and transfer charge. Exposure period $T_{exposure}$ can end at time T4 when the AB signal is asserted. Between times T1 and T3, TG signal can set charge transfer transistor M1 in a partially turned-on state to allow PD to accumulate residual charge before photodiode PD saturates. If the light intensity in the medium or high intensity ranges of FIG. 10, photodiode PD can saturate and transfer overflow charge via charge transfer transistor M1. LG signal can remain asserted to operate in low gain mode, in which both $C_{FD}$ capacitor and $C_{EXT}$ capacitor are connected in parallel to form charge storage device 902 to store the overflow charge. The overflow charge develops a new PIXEL_OUT voltage, $V_{pixel\_out\_sig1}$. The CC capacitor can AC couple the new PIXEL_OUT voltage $V_{pixel\_out\_sig1}$ into COMP_IN voltage by adding the $V_{CC}$ voltage, which includes the reset noise and comparator offset component. The new PIXEL_OUT voltage also includes reset noise, which can be cancelled by the reset noise component of the $V_{CC}$ voltage. The COMP_IN voltage at time Tx between times T1 and T3 can be as follows:

$$V_{comp\_in}(Tx) = V_{pixel\_out\_sig1} - V_{pixel\_out\_rst} + V_{ref\_high} + V_{comp\_offset} \quad \text{(Equation 2)}$$

In Equation 2, the difference between $V_{pixel\_out\_sig1} - V_{pixel\_out\_rst}$ represents the quantity of overflow charge stored in charge storage device 902. The comparator offset in the COMP_IN voltage can also cancel out the comparator offset introduced by comparator 906 when performing the comparison.

Between times T1 and T3, two phases of measurement of the COMP_IN voltage can be performed, including a time-to-saturation (TTS) measurement phase for high light intensity range 1010 and an FD ADC phase for measurement of overflow charge for medium light intensity 1008. Between times T1 and T2 the TTS measurement can be performed by comparing COMP_IN voltage with a static $V_{ref\_low}$ representing a saturation level of charge storage device 902 by comparator 906. When PIXEL_OUT voltage reaches the static VREF, the output of comparator 906 (VOUT) can trip, and a count value from counter 914 at the time when VOUT trips can be stored into memory 912. At time T2, controller 920 can perform a check 1202 of the state of comparator 906. If the output of comparator 906 trips, controller 920 can store the state in a register of output logic circuits 908 indicating that the overflow charge in charge storage device 902 exceeds threshold 1004. The storage of the state can also prevent subsequent measurement phases (FD ADC and PD ADC) from overwriting the count value stored in memory 912. The count value from TTS can then be provided to represent the intensity of light received by photodiode PD during the exposure period.

Between times T2 and T3, the FD ADC operation can be performed by comparing COMP_IN voltage with a ramping VREF voltage that ramps from $V_{ref\_low}$ to $V_{ref\_high}$, which represents the saturation level of photodiode PD (e.g., threshold 1002), as described in FIG. 11B. If VOUT of comparator 906 trips during FD ADC, the count value of counter 914 at the time when VOUT trips can be stored in memory 912, if the state flag in output logic circuits 908 is not asserted which indicated that charge storage device 902 does not saturate in the TTS operation. Although exposure period ends at time T2, between times T2 and T3 photodiode PD remains capable of accumulating residual charge (if not saturated) or transferring overflow charge to charge storage device 902. At time T3, the controller can perform a check 1204 of the state of comparator 906 of the state of comparator 906. If the output of comparator 906 trips, and the state flag in output logic circuits 908 is not asserted from the TTS operation, controller 920 can assert the state flag in output logic circuits 908 to indicate that the overflow charge in charge storage device 902 exceeds threshold 1004. The assertion of the state flag can also prevent subsequent PD ADC phase from overwriting the count value stored in memory 912. The count value from FD ADC can then be provided to represent the intensity of light received by photodiode PD during the exposure period.

Between times T3 and T4 can be the second reset phase, in which both RST and COMP_RST signals are asserted to reset charge storage device 902 (comprising the parallel combination of $C_{FD}$ capacitor and $C_{EXT}$ capacitor) and comparator 906 to prepare for the subsequent PD ADC operation. The $V_{CC}$ voltage can be set according to Equation 1.

After RST and COMP_RST are released, LG is turned off to disconnect $C_{EXT}$ from $C_{FD}$ to increase the charge-to-voltage conversion rate for the PD ADC operation. TG is set at a level to fully turn on the M1 charge transfer transistor to transfer the residual charge stored in photodiode PD to $C_{FD}$. The residual charge develops a new PIXEL_OUT voltage, $V_{pixel\_out\_sig2}$. The CC capacitor can AC couple the new PIXEL_OUT voltage $V_{pixel\_out\_sig2}$ into COMP_IN voltage by adding the $V_{CC}$ voltage. Between times T3 and T4, photodiode PD remains capable of generating additional charge in addition to the charge generated between times T1 to T3, and transferring the additional charge to charge storage device 902. The $V_{pixel\_out\_sig2}$ also represents the additional charge transferred between times T3 and T4. At time T4, the COMP_IN voltage can be as follows:

$$V_{comp\_in}(T4) = V_{pixel\_out\_sig2} - V_{pixel\_out\_rst} + V_{ref\_high} + V_{comp\_offset} \quad \text{(Equation 3)}$$

In Equation 3, the difference between $V_{pixel\_out\_sig2} - V_{pixel\_out\_rst}$ represents the quantity of charge transferred by the photodiode to charge storage device 902 between times T3 and T4. The comparator offset in the COMP_IN voltage can also cancel out the comparator offset introduced by comparator 906 when performing the comparison.

At time T4, the AB signal is asserted to prevent photodiode PD from accumulating and transferring additional charge. Moreover, VREF can be set a static level $V_{ref\_low\_margin}$. Comparator 906 can compare the COMP_IN voltage with $V_{ref\_low\_margin}$ to determine whether photodiode PD saturates. $V_{ref\_low\_margin}$ is slightly higher than $V_{ref\_low}$, which represents the saturation level of photodiode PD (e.g., threshold 1002), to prevent false tripping of comparator 906 when the quantity of residual charge is close to but does not exceed the saturation level.

Between times T4 and T5, controller 920 can perform the PD ADC operation by comparing the COMP_IN voltage with a VREF ramp that starts from $V_{ref\_low\_margin}$ to $V_{ref\_high}$. In PD ADC phase, $V_{ref\_high}$ can represent the minimum detectable quantity of residual charge stored in photodiode PD, whereas $V_{ref\_low\_margin}$ can represent the saturation threshold of photodiode PD with margin to account for dark current, as described above. If the state flag in output logic circuits 908 remains not asserted at this point, and if the output of comparator 906 trips, the count value of counter 914 when comparator 906 trips can be stored into memory 912, and the count value from PD ADC can be provided to represent the intensity of light.

Reference is now made to FIG. 12B, which illustrates another example sequence of the control signals of pixel cell 602a generated by controller 920. In FIG. 12B, PD ADC operation can be performed between the TTS and FD ADC operations, which can reduce the accumulation of additional charge in charge storage device 902 or in photodiode PD after the TTS operation and improve shutter efficiency. As shown in FIG. 12B, between times T0 and T1 is a first reset phase as in FIG. 12A, in which both charge storage device 902 and comparator 906 can be put in a reset state by controller 920 by asserting the RST and COMP_RST signals. Moreover, LG signal is asserted, which allows $C_{FD}$ and $C_{EXT}$ capacitors to be reset by the RST signal and the PIXEL_OUT signal is set at the reset level. With COMP_RST signal asserted and the positive terminal of comparator 1102 connected to $V_{ref\_high}$, COMP_IN can be set to a sum of $V_{ref\_high}$ and comparator offset $V_{comp\_offset}$. Moreover, with RST signal asserted, PIXEL_OUT can be set the reset voltage $V_{pixel\_out\_rst}$ and can include reset noise $V\sigma_{KTC}$. A first sampling operation can be performed by the CC capacitor to store a $V_{CC}$ voltage including the components of the comparator offset, the reset noise, and PIXEL_OUT voltage at the reset level, as described in Equation 1 above:

$$V_{cc}(T1)=(V_{ref\_high}+V_{comp\_offset})-(V_{pixel\_out\_rst}+V\sigma_{KTC}) \quad \text{(Equation 1)}$$

Moreover, AB signal can be asserted to prevent charge generated by photodiode PD from reaching charge storage device 902.

At time T1, the AB, COMP_RST, and the RST signals are released, which starts the exposure period in which photodiode PD can accumulate and transfer charge. TG signal can set transfer transistor M1 in a partially turned-on state to allow PD to transfer overflow charge to charge storage device 902. LG signal can remain asserted to operate in low gain mode, in which both $C_{FD}$ capacitor and $C_{EXT}$ capacitor are connected in parallel to form charge storage device 902 to store the overflow charge. The overflow charge develops a new PIXEL_OUT voltage, $V_{pixel\_out\_sig1}$. The CC capacitor can AC couple the PIXEL_OUT voltage to become the COMP_IN voltage. The COMP_IN voltage between times T1 and T2 can be set based on Equation 1 above.

Between times T1 and T2, a time-to-saturation (TTS) measurement can be performed by comparator 906 comparing COMP_IN voltage with a static $V_{ref\_low}$ to generate VOUT. At time T2, controller 920 can perform a check 1212 of the state of comparator 906. If the output of comparator 906 trips, controller 920 can store the state in a register of output logic circuits 908 indicating that the overflow charge in charge storage device 902 exceeds threshold 1004 as in FIG. 12A.

Following the TTS measurement, between times T2 and T5, the PD ADC operation can be performed to measure the residual charge stored in photodiode PD. The LG signal is de-asserted to disconnect $C_{EXT}$ from $C_{FD}$ to increase charge-to-voltage conversion ratio, as described above. The overflow charge (if any) is divided between $C_{FD}$ and $C_{EXT}$ based on a ratio of capacitances between $C_{FD}$ and $C_{EXT}$ such that $C_{FD}$ stores a first portion of the overflow charge and $C_{EXT}$ stores a second portion of the overflow charge. $V_{pixel\_out\_sig1}$ can correspond to the first portion of the overflow charge stored in $C_{FD}$.

To prepare for the PD ADC operation, between times T2 and T3, COMP_RST signal is asserted again to reset comparator 1102. The resetting of comparator 1102 can set a new $V_{CC}$ voltage across the CC capacitor based on a difference between $V_{pixel\_out\_sig1}$ and the output of comparator 1102 in the reset state, as follows:

$$V_{cc}(T2)=(V_{ref\_high}+V_{comp\_offset})-(V_{pixel\_out\_sig1}(T3)+V\sigma_{KTC}) \quad \text{(Equation 4)}$$

Optionally, the RST signal can be asserted between times T2 and T3 to reset $C_{FD}$ and to remove the first portion of the overflow charge, prior to the transfer of the residual charge. This allows the subsequent PD ADC operation to quantize only the residual charge rather than a mixture of the residual charge and the first portion of the overflow charge. Such arrangements can improve the accuracy of measurement of low light intensity as there is no need to remove the overflow charge component (based on the result of the subsequent FD ADC operation) from the PD ADC operation output which could otherwise introduce additional errors. On the other hand, not asserting the RST signal between times T2 and T3 can be advantageous, as such arrangements can introduce redundancy in the PD ADC and FD ADC operations and increase the signal-to-noise ratio, as both operations measure a mixture of residual and overflow charge.

Between times T3 and T4, COMP_RST signal is released so that comparator 1102 exits the reset state. Moreover, the TG signal can set transfer transistor M1 in a fully turned-on state to transfer the residual charge to $C_{FD}$. The residual charge can be transferred to $C_{FD}$, which changes the PIXEL_OUT voltage to $V_{pixel\_out\_sig2}$. The new PIXEL_OUT voltage can be AC coupled into a new COMP_IN voltage at time T4, as follows:

$$V_{comp\_in}(T4)=V_{pixel\_out\_sig2}-V_{pixel\_out\_sig1}+V_{ref\_high}+V_{comp\_offset} \quad \text{(Equation 5)}$$

In Equation 5, the difference between $V_{pixel\_out\_sig2}-V_{pixel\_out\_sig1}$ represents the quantity of residual charge transferred by the photodiode to charge storage device 902 between times T3 and T4.

After TG is fully turned-on between times T3 and T4, the TG is de-asserted to disconnect photodiode PD from $C_{FD}$ and $C_{EXT}$. As a result, no additional charge is transferred to $C_{FD}$ and $C_{EXT}$ after time T4 until the start of next exposure period. Compared with the arrangements of FIG. 12A where additional charge can be accumulated in photodiode PD during the FD ADC operation which typically takes a long time, in FIG. 12B the additional charge is accumulated only during the reset period T2-T3 and the transfer period T3-T4, both of which are typically much shorter than a FD ADC operation. Moreover, after T4, no additional overflow charge is accumulated at charge storage device 608a. As a result, both FD ADC and PD ADC can process charge accumulated in almost the same exposure period as the TTS operation, which can improve the shutter efficiency of the image sensor.

Between times T4 and T5, controller 920 can perform the PD ADC operation by comparing the COMP_IN voltage with a VREF ramp that starts from $V_{ref\_high}$ to $V_{ref\_low\_margin}$. In PD ADC phase, $V_{ref\_high}$ can represent the minimum detectable quantity of residual charge stored in photodiode PD, whereas $V_{ref\_low\_margin}$ can represent the saturation threshold of photodiode PD with margin to account for dark current, as described above. If photodiode PD does not saturate, COMP_IN can go above the VREF ramp. An inverted VOUT (VOUTb) can become a logical one and cause a count value to be stored in memory 912 for PD ADC. At time T5, the controller can perform a check 1214 of the state of comparator 906 of the state of comparator 906. If the output of comparator 906 trips, and the state flag in output logic circuits 908 is not asserted from the TTS operation, controller 920 can assert the state flag in output logic circuits 908 to indicate that the residual charge exceeds threshold 1002. The assertion of the state flag can also prevent subsequent FD ADC phase from overwriting the count value stored in memory 912. The count value from PD ADC can then be provided to represent the intensity of light received by photodiode PD during the exposure period.

Between times T5 and T8, a FD ADC operation can be made to measure the overflow charge transferred by photodiode PD within the exposure period. As photodiode PD remains disconnected from $C_{FD}$ and $C_{EXT}$, no additional charge is transferred to $C_{FD}$ and $C_{EXT}$, and the total charge stored in $C_{FD}$ and $C_{EXT}$ is mostly generated in the exposure period $T_{exposure}$, together with additional charge generated by the photodiode between times T3 and T4.

At time T5, the LG signal is asserted to connect $C_{FD}$ with $C_{EXT}$, which allows the second portion of the overflow charge stored in $C_{EXT}$ to combine with the residual charge stored in $C_{FD}$ (and the first portion of the overflow charge if RST is not asserted between times T2 and T3), and a new PIXEL_OUT voltage $V_{pixel\_out\_sig3}$ can develop at the parallel combination of $C_{FD}$ and $C_{EXT}$ and is to be quantized.

Between times T5 and T7, a noise sampling operation can be performed to mitigate the effect of reset noise and comparator offset on the FD ADC operation. Between times T5 and T6, comparator 1102 can be reset as part of the first sampling operation. The positive terminal of comparator 1102 is connected to the lower end of VREF, $V_{ref\_low}$. The $V_{CC}$ voltage can include components of reset noise and comparator offset as described above. The $V_{CC}$ voltage can be as follows:

$$V_c(T5) = (V_{ref\_low} + V_{comp\_offset}) - (V_{pixel\_out\_sig3} + V\sigma_{KTC1})$$ (Equation 6)

Between times T6 and T7, both $C_{FD}$ and $C_{EXT}$ can be reset, while comparator 1102 exits the reset state, as part of a second sampling operation. As a result of resetting, PIXEL_OUT can be reset to a reset voltage $V_{pixel\_out\_rst}$. Moreover, second reset noise charge is also introduced into charge storage device 608, which can be represented by $V\sigma_{KTC2}$. The second reset noise charge typically tracks the first reset noise charge. At time T6, as the result of the second sampling operation, $V_{pixel\_out}$ can be as follows:

$$V_{pixel\_out}(T6) = V_{pixel\_out\_rst} + V\sigma_{KTC2}$$ (Equation 7)

At time T7, COMP_RST is released, and comparator 1102 exits the reset state. Via AC-coupling, the COMP_IN voltage can track $V_{pixel\_out}(T6)$ in addition to $V_{cc}(T5)$ as follows:

$$V_{comp\_in}(T7) = (V_{ref\_low} + V_{comp\_offset}) + (V_{pixel\_out\_rst} - V_{pixel\_out\_sig3}) + (V\sigma_{KTC2} - V\sigma_{KTC1})$$ (Equation 8)

Following the second sampling operation, the COMP_IN voltage can be quantized by comparing against a VREF ramp between times T7 and T8. When VREF goes above COMP_IN, VOUT can become a logical one. If the state flag in output logic circuits 908 remains not asserted at this point, the count value of counter 914 when comparator 906 trips can be stored into memory 912, and the count value from FD ADC can be provided to represent the intensity of light. After time T8, the digital value stored in memory 912 can be read out to represent the intensity of light received by photodiode PD within the integration, at time T9. In a case where one image frame is generated in a single frame period, the frame period can span from time T0 to T8.

Although FIG. 12A and FIG. 12B show TTS, FD ADC and PD ADC operations are performed, it is understood that ADC 616 (and pixel cell 602a) needs not perform all of these operations, and can skip some of them. As to be described below, the quantization operations may vary for different photodiodes within pixel cell 602a.

The multi-stage quantization operations described in FIG. 12A and FIG. 12B, which involve the charge sensing unit 614, ADC 616, and memory 912, can substantially extend the dynamic range of a pixel cell and improve the pixel cell's performance in measuring high light intensity and low light intensity. However, in a case where a pixel cell includes multiple photodiodes, as shown in FIG. 8A-FIG. 8C, providing a charge sensing unit 614, an ADC 616, and a memory 912 for each photodiode of a pixel cell to support the multi-stage quantization operations for the each photodiode can be challenging due to size and power. Specifically, buffer 904 and $C_{EXT}$ capacitor of charge sensing unit 614, as well as comparator 906, typically have very large footprint and can dominate the size of the pixel cell. In addition, circuit components such comparator 906, buffer 904, and memory 912 also consume a lot of power. If a charge sensing unit 614, an ADC 616, and a memory 912 is provided for each photodiode of a pixel cell, both the footprint and the power consumption of the pixel cell can be substantially increased, which may render the pixel cells unsuitable for applications where space and power are at a premium, such as applications at mobile devices and wearable devices.

Figure 13A:
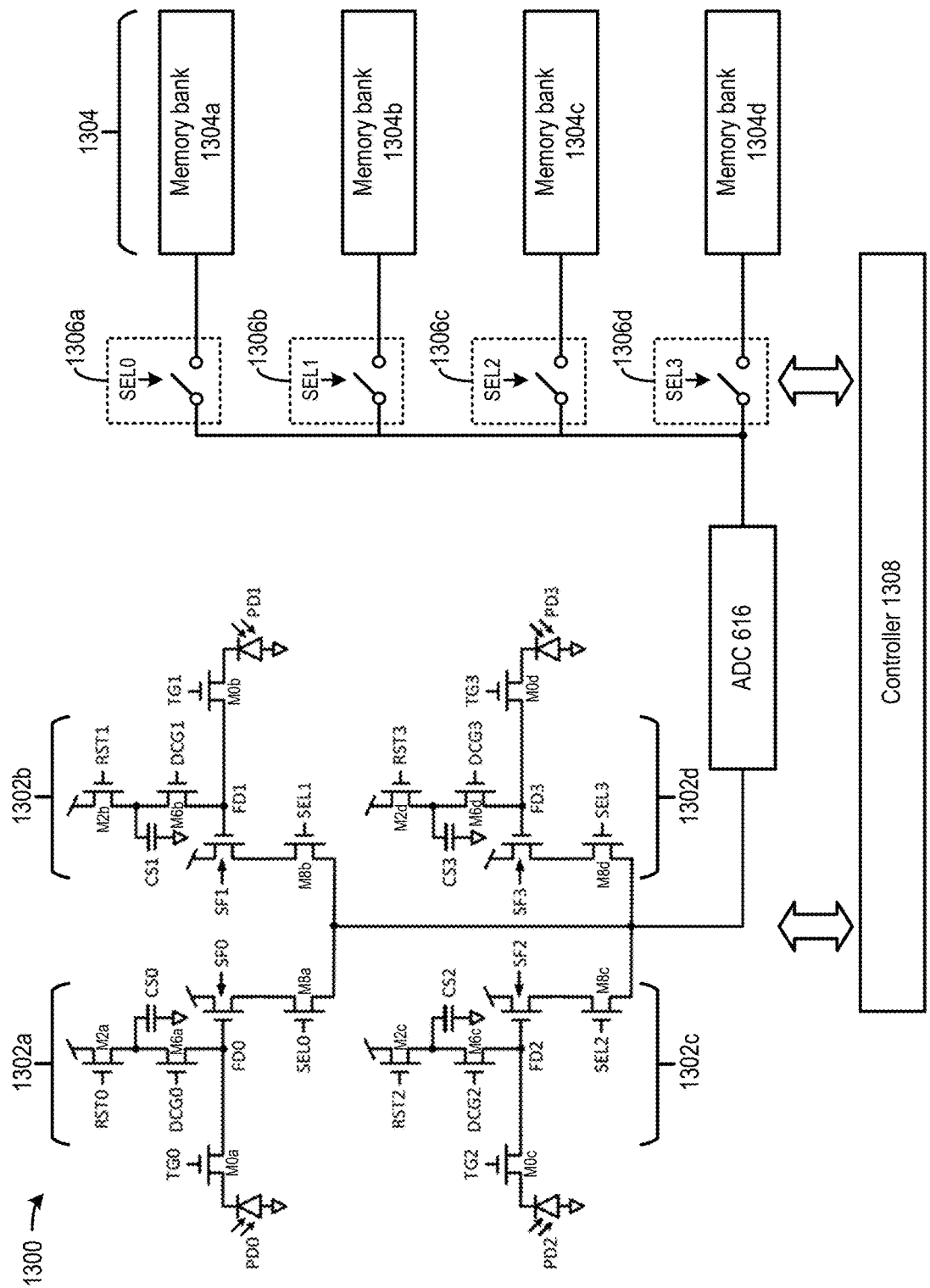
FIG. 13A, FIG. 13B, FIG. 13C, FIG. 13D, and FIG. 13E illustrate examples of an image sensor and their operations.

Reference is now made to FIG. 13A-FIG. 13E, which illustrate example techniques to reduce the footprint of a sensor layer (e.g., substrates 840-846 of FIG. 8A, substrate 840 of FIG. 8B) of a multi-photodiode pixel cell. FIG. 13A illustrates an example of circuit components of an image sensor 1300 having a plurality of photodiodes including PD0, PD1, PD2, and PD3. In some examples, photodiodes PD0-PD3 can be part of a pixel cell, such as pixel cell 602a of FIG. 6. For example, photodiodes PD0, PD1, PD2, PD3 can correspond to, photodiodes 612a, 612b, 612c, and 612d. In some examples, PD0, PD1, PD2, and PD3 can be configured to sense different components of visible light, such as R, Gr, Gb, and B channels. In some examples, the photodiodes can be part of different pixel cells.

Each of photodiodes PD0, PD1, PD2, and PD3 can be coupled with a charge sensing unit 1302 to convert the charge generated by the photodiode to a voltage. Charge sensing unit 1302 can be part of a pixel cell or shared between pixel cells. Specifically, PD0 is selectively coupled with a charge sensing unit 1302a via transfer transistor M0a when TG0 signal is asserted. Charge sensing unit 1302a includes a configurable charge storage device having a floating drain FD0 and an auxiliary capacitor CS0, and a switchable buffer having a source follower SF0. Floating drain FD0 and auxiliary capacitor CS0 can be connected in parallel by transistor M6a to increase the total capacitance when DCG0 signal is asserted. Charge sensing unit 1302a further includes a transistor M2a which can reset floating drain FD0 and auxiliary capacitor CS0 when RST0 signal is asserted. Transistor M2a can also reset photodiode PD0 and start the exposure period for photodiode PD0 via transistors M6a and M0a when both TG0 and DCG0 signals are asserted, while the de-assertion of TG0 can end the exposure period. Moreover, source follower SF0 can be enabled by transistor M8a when SEL0 signal is asserted.

Likewise, PD1 is selectively coupled with a charge sensing unit 1302b via transistor M0b when TG1 signal is asserted. Charge sensing unit 1302b includes a configurable charge storage device having a floating drain FD1 and an auxiliary capacitor CS1, and a switchable buffer having a source follower SF1. Floating drain FD1 and auxiliary capacitor CS1 can be connected in parallel by transistor M6b to increase the total capacitance when DCG1 signal is asserted. Charge sensing unit 1302b further includes a transistor M2b which can reset floating drain FD1 and auxiliary capacitor CS1 when RST1 signal is asserted. Transistor M2b can also reset photodiode PD1 and start the exposure period for photodiode PD1 via transistors M6b and M0b when both TG1 and DCG1 signals are asserted, while the de-assertion of TG1 can end the exposure period. Moreover, source follower SF1 can be enabled by transistor M8b when SEL1 signal is asserted.

In addition, PD2 is selectively coupled with a charge sensing unit 1302c via transistor M0c when TG2 signal is asserted. Charge sensing unit 1302c includes a configurable charge storage device having a floating drain FD2 and an auxiliary capacitor CS2, and a switchable buffer having a source follower SF2. Floating drain FD2 and auxiliary capacitor CS2 can be connected in parallel by transistor M6b to increase the total capacitance when DCG2 signal is asserted. Charge sensing unit 1302c further includes a transistor M2c which can reset floating drain FD2 and auxiliary capacitor CS2 when RST2 signal is asserted. Transistor M2c can also reset photodiode PD2 and start the exposure period for photodiode PD2 via transistors M6c and M0c when both TG2 and DCG2 signals are asserted, while the de-assertion of TG2 can end the exposure period. Moreover, source follower SF2 can be enabled by transistor M8c when SEL2 signal is asserted.

Further, PD3 is selectively coupled with a charge sensing unit 1302d via transistor M0d when TG3 signal is asserted. Charge sensing unit 1302d includes a configurable charge storage device having a floating drain FD3 and an auxiliary capacitor CS3, and a switchable buffer having a source follower SF3. Floating drain FD3 and auxiliary capacitor CS3 can be connected in parallel by transistor M6d to increase the total capacitance when DCG3 signal is asserted. Charge sensing unit 1302a further includes a transistor M2d which can reset floating drain FD0 and auxiliary capacitor CS3 when RST3 signal is asserted. Transistor M2d can also reset photodiode PD3 and start the exposure period for photodiode PD3 via transistors M6d and M0d when both TG3 and DCG3 signals are asserted, while the de-assertion of TG3 can end the exposure period. Moreover, source follower SF3 can be enabled by transistor M8d when SEL3 signal is asserted.

Image sensor 1300 further includes ADC 616 as well as memory 1304. ADC 616 is shared among charge sensing units 1302a-1302d and is selectively coupled with one of source followers SF0, SF1, SF2, and SF3 when the corresponding SEL signal (SEL0, SEL1, SEL2, and SEL3) is asserted. The sharing of ADC 616 among charge sensing units 1302a-1302d, as opposed to having one dedicated ADC 616 for each of charge sensing units 1302a-1302d, can reduce the number of ADCs in image sensor 1300, which in turn can reduce the power and footprint of the pixel cell.

In addition, pixel cell further includes memory 1304, which can include memory banks 1304a, 1304b, 1304c, and 1304d, with each memory bank comprising multiple bits and configured to store a digital output generated by ADC 616 for a photodiode. For example, memory bank 1304a can store the digital output from quantizing the charge generated by photodiode PD1, memory bank 1304b can store the digital output from quantizing the charge generated by photodiode PD2, memory bank 1304c can store the digital output from quantizing the charge generated by photodiode PD3, whereas memory bank 1304d can store the digital output from quantizing the charge generated by photodiode PD3. ADC 616 is coupled with each of memory banks 1304a, 1304b, 1304c, and 1304d via, respectively, switches 1306a, 1306b, 1306c, and 1306d. Switches 1306a-1306b can be controlled by SEL signals (SEL0, SEL1, SEL2, and SEL3) so that the assertion of a SEL signal can connect one of charge sensing units 1302a-1302d and photodiodes PD0-PD3 to ADC 616 to perform quantization operation, and the resulting digital output can be stored in the one of the memory banks 1304a-1304d corresponding to the photodiode.

Image sensor 1300 further includes a controller 1308 that control the sequences of control signals TG0-TG3, RST0-RST3, SEL0-SEL3, and DCG0-DCG3 to control a sequence of operations including charge generation, quantization to generate digital outputs, and storage of the digital outputs in memory 1304 for photodiodes PD0-PD3 using shared ADC 616. Controller 1308 can generate the control signals to provide photodiodes PD0-PD3 with sequential accesses to ADC 616 to perform quantization operations to generate a digital output and store the first digital output in memory 1304. The sequential accesses can start with photodiode PD0, followed by photodiodes PD1, PD2, and PD3.

Figure 13B:
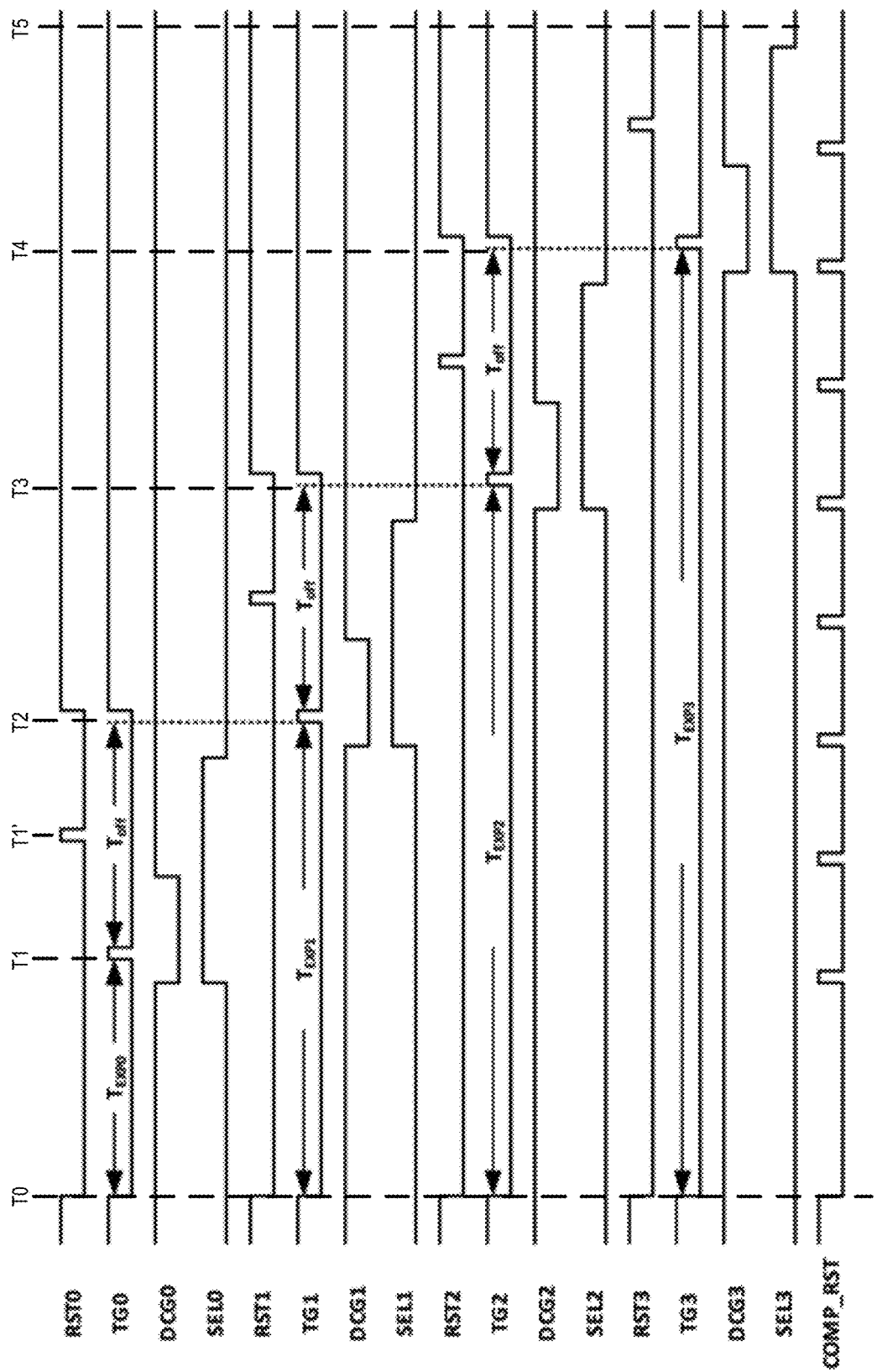
Figure 13C:
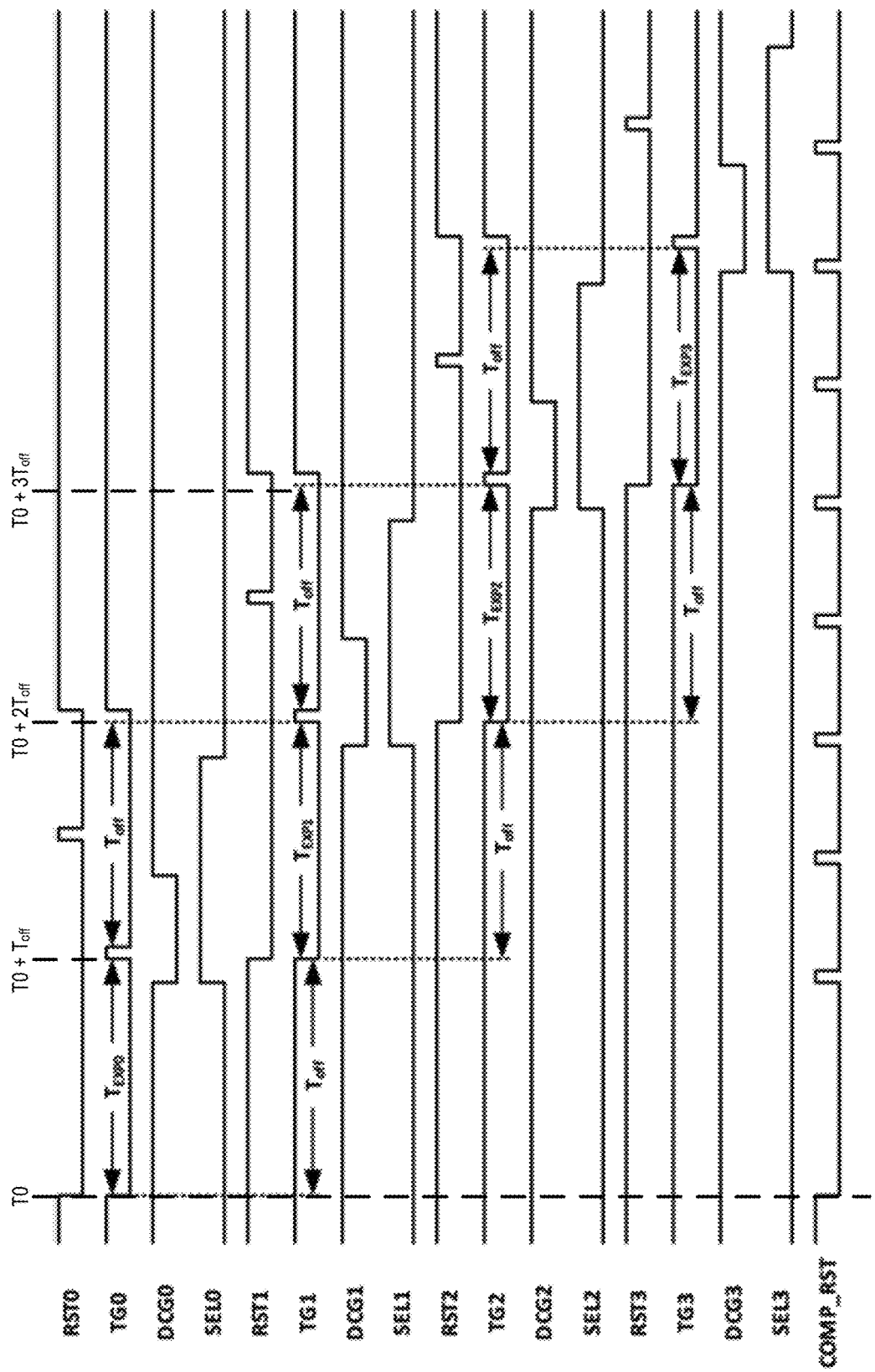
Figure 13D:
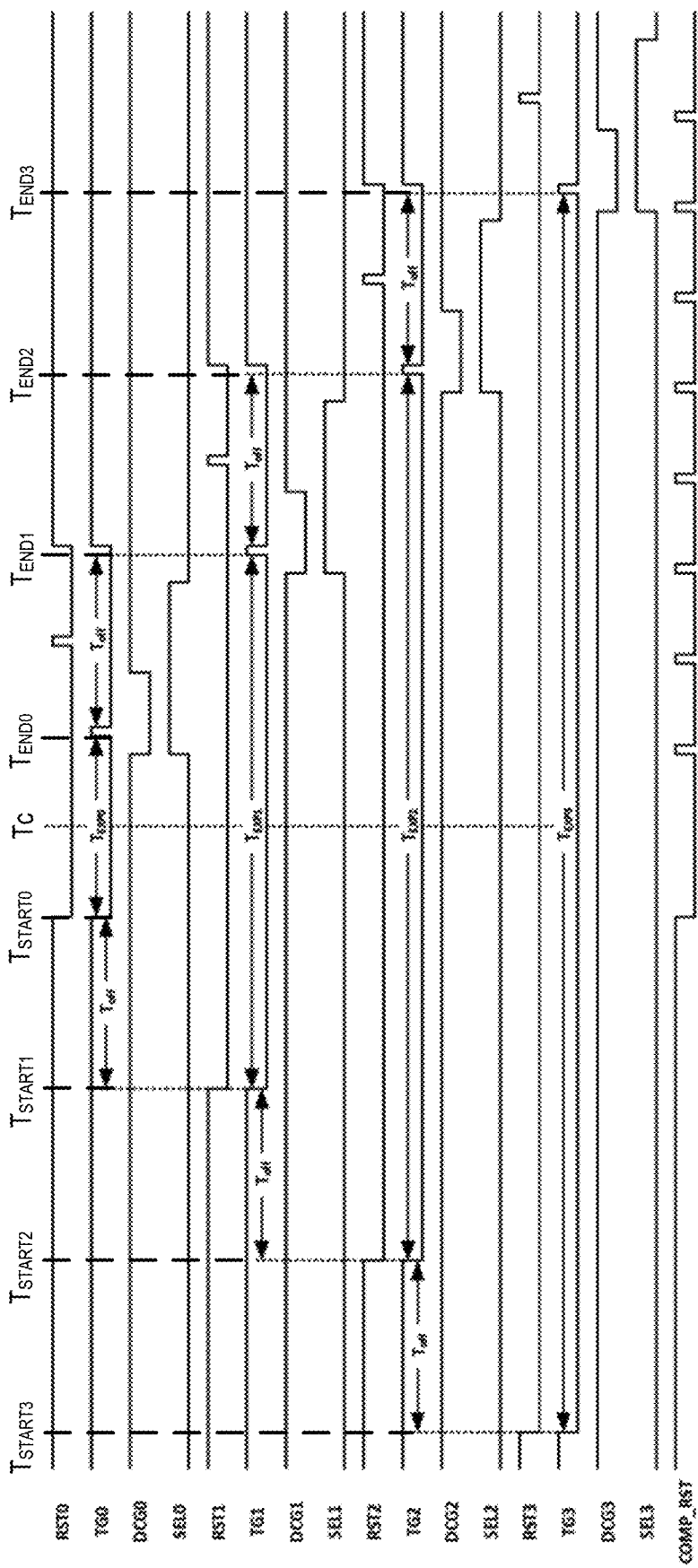
Figure 13E:
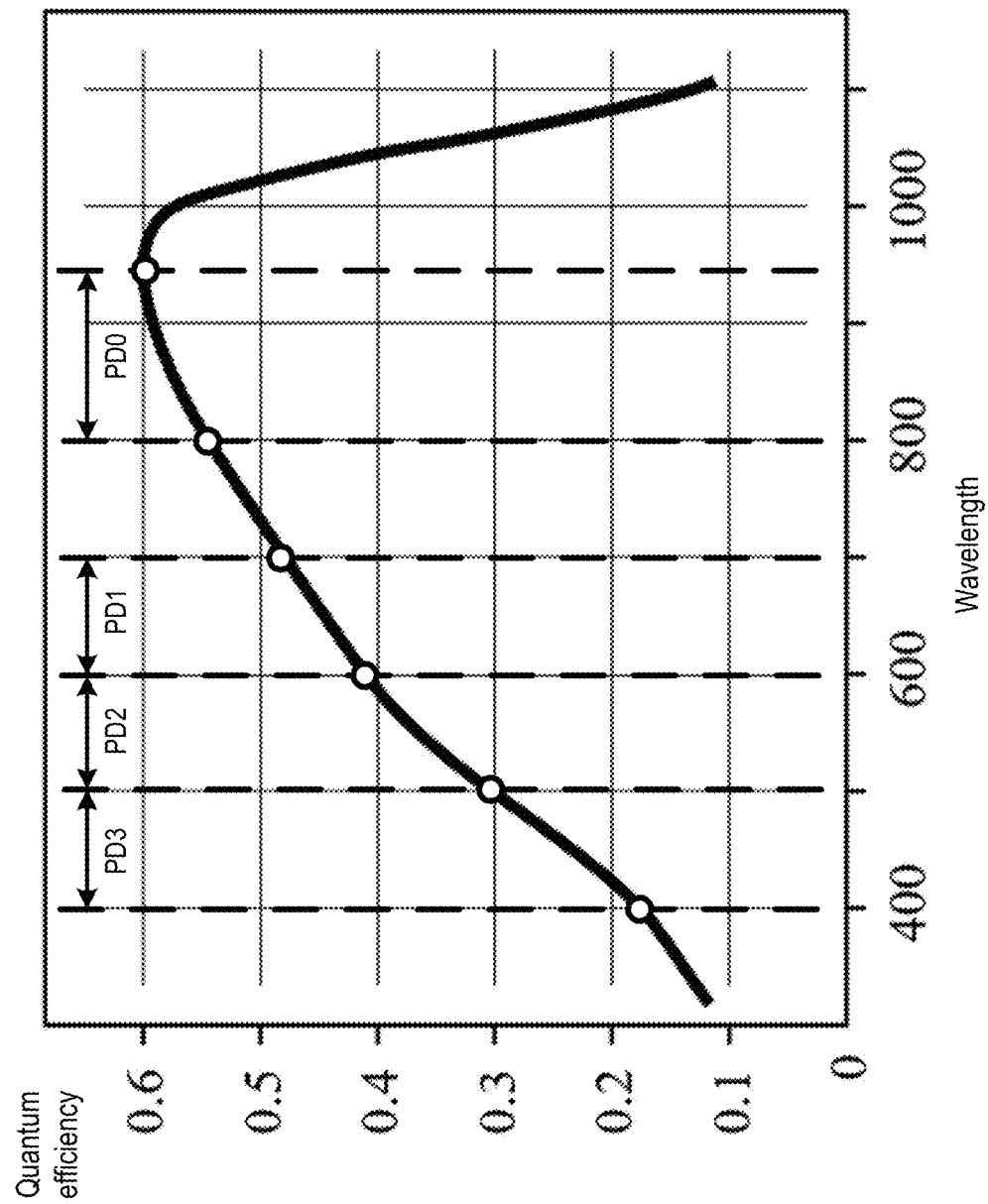

FIG. 13B-FIG. 13D illustrate example sequences of the control signals. In each example of FIG. 13B-FIG. 13D, the TTS operation is omitted, and the quantization operations illustrated in FIG. 12B, in which PD ADC precedes FD ADC after the exposure period ends, are performed. But it is understood that the quantization operations illustrated in FIG. 12A, in which FD ADC is performed during the exposure period, as well as the TTS operation, can also be performed in the sequence of operations illustrated in FIG. 13B-FIG. 13D.

Referring to FIG. 13B, the exposure periods of photodiodes PD0-PD3, including $T_{EXP0}$ for PD0, $T_{EXP1}$ for PD1, $T_{EXP2}$ for PD2, and $T_{EXP3}$ for PD3, start at the same time T0. During the exposure periods, controller 1308 de-asserts reset signals RST0, RST1, RST2, and RST3 to release the photodiodes from reset. Controller 1308 also control a voltage level of TG0, TG1, TG2, and TG3 to set a saturation level of the photodiodes, to enable the photodiodes to accumulate charge until the saturation level is reached. When a photodiode saturates, the remaining charge can be output to the respective charge sensing unit 1302 as overflow charge. Controller 1308 also asserts DCG0, DCG1, DCG2, and DCG3 signals to maximize the capacitance of the charge storage device in each of the charge sensing units 1302, and to store portions of overflow charge in the floating drain node (e.g., FD0, FD1, FD2, and FD3) and in the auxiliary capacitor (e.g., CS0, CS1, CS2, and CS2) in each of the charge sensing units 1302.

Moreover, as shown in FIG. 13B-FIG. 13D, the signals SEL0, SEL1, SEL2, and SEL3 are also de-asserted during the exposure periods, as no quantization operation is performed during the exposure periods. But in a case where TTS and/or FD ADC are performed during the exposure periods, SEL0 can be asserted during $T_{EXP0}$ to enable TTS operation for PD0 using ADC 616. SEL1, SEL2 and SEL3 can also be asserted sequentially, one at a time, after the TTS operation for PD0 completes, to enable FD ADC operations sequentially for PD1, PD2, and PD3.

Referring back to FIG. 13B, photodiode PD0 is in the exposure phase within the exposure period $T_{EXP0}$, which ends at time T1 where TG0 is asserted and DCG0 is de-asserted by controller 1308. A first portion of the overflow charge from photodiode PD0 (if any) can remain in auxiliary capacitor CS0, whereas a second portion of the overflow charge from PD0 (if any) stored in floating drain FD0 can be mixed with the residual charge transferred from photodiode PD0. At time T1 controller 1308 can reset comparator 906 of ADC 616 to store comparator offset information in the CC capacitor, and then start the quantization operations. Between times T1 and T2, controller 1308 can assert SEL0 to connect charge sensing unit 1302a to ADC 616 to perform a PD ADC operation (between times T1 and T1'), followed by asserting RST0 and COMP_RST at time T1' to store reset noise and comparator offset information in the CC capacitor, and a FD ADC operation between times T1' to T2. ADC 616 can then store the output from one of the PD ADC or FD ADC operations in memory bank 1304a as described above in FIG. 13B. The total time taken by the PD ADC and FD ADC operation is labelled as $T_{off}$. Controller 1308 can then de-assert SEL0 to disconnect charge sensing unit 1302a from ADC 616 after the quantization operations complete for photodiode PD0.

Between times T0 and T2, photodiode PD1 remains in the exposure phase within the exposure period $T_{EXP1}$, which ends at time T2 with a delay of $T_{off}$ from the end of the exposure period $T_{EXP0}$ (at time T1) for photodiode PD0. As a result, the total duration of exposure period $T_{EXP1}$ can be a sum of $T_{EXP0}$ and $T_{off}$ ($T_{EXP0}+T_{off}$). The delay in the end of exposure period $T_{EXP2}$ is to wait for quantization operations for PD0 to complete at ADC 616, which can then proceed to quantize the charge generated by photodiode PD1. Extending exposure period $T_{EXP2}$ beyond time T1 can be beneficial in that extra charge generated from photon can be stored in the floating drain FD1 between times T1 and T2, prior to being quantized by ADC 616, to mitigate the effect of dark charge accumulated between times T1 and T2. Following time T2, controller 1308 can assert SEL1 signal to connect charge sensing unit 1302b to ADC 616, to perform PD ADC operation followed by FD ADC operation based on a sequence of RST1, TG1, and DCG1 signals, and store the digital output in memory bank 1304b. The quantization operations for photodiode PD1 ends at time T3 and span a duration of $T_{off}$. Controller 1308 can then de-assert SEL1 to disconnect charge sensing unit 1302b from ADC 616 after the quantization operations complete for photodiode PD1.

Moreover, between times T0 and T3, photodiode PD2 remains in the exposure phase within the exposure period $T_{EXP2}$, which ends at time T3 with a delay of $T_{off}$ from the end of the exposure period $T_{EXP1}$ (at time T2) for photodiode PD1. As a result, the total duration of exposure period $T_{EXP1}$ can be a sum of $T_{EXP1}$ and $T_{off}$ ($T_{EXP1}+T_{off}$). Following time T3, controller 1308 can assert SEL2 signal to connect charge sensing unit 1302c to ADC 616, to perform PD ADC operation followed by FD ADC operation based on a sequence of RST2, TG2, and DCG2 signals, and store the digital output in memory bank 1304c. The quantization operations for photodiode PD2 ends at time T4 and span a duration of $T_{off}$. Controller 1308 can then de-assert SEL2 to disconnect charge sensing unit 1302c from ADC 616 after the quantization operations complete for photodiode PD2.

In addition, between times T0 and T4, photodiode PD3 remains in the exposure phase within the exposure period $T_{EXP3}$, which ends at time T4 with a delay of $T_{off}$ from the end of the exposure period $T_{EXP2}$ (at time T3) for photodiode PD2. As a result, the total duration of exposure period $T_{EXP3}$ can be a sum of $T_{EXP2}$ and $T_{off}$ ($T_{EXP2}+T_{off}$). Following time T4, controller 1308 can assert SEL3 signal to connect charge sensing unit 1302d to ADC 616, to perform PD ADC operation followed by FD ADC operation based on a sequence of RST3, TG3, and DCG3 signals, and store the digital output in memory bank 1304d. The quantization operations for photodiode PD3 ends at time T5 and span a duration of $T_{off}$. Controller 1308 can then de-assert SEL3 to disconnect charge sensing unit 1302d from ADC 616 after the quantization operations complete for photodiode PD3. The digital outputs stored in memory banks 1304a-1304d can be used to generate an image frame (e.g., in a demosaicing operation), or to generate separate image frames (e.g., for 2D and 3D sensing).

The arrangements of FIG. 13B, in which the exposure period of a photodiode is delayed to accommodate for an earlier quantization operation of a preceding photodiode in the sequential accesses, results in the exposure periods $T_{EXP0}$-$T_{EXP3}$ having different durations. The duration difference between the exposure periods can degrade the global shutter operation of the photodiodes within the pixel cell. Specifically, the duration difference between the exposure periods can introduce an offset among the digital outputs, since each photodiode is provided with different durations of time to be exposed to light and to generate charge. As a result, the total charge generated by each photodiode can be different even if the first component and the second component of the incident light have the same intensity.

FIG. 13C and FIG. 13D illustrate various techniques to improve the global shutter operations among the photodiodes PD0-PD3 of image sensor 1300. As shown in FIG. 13C, instead of starting each of exposure periods $T_{EXP0}$-$T_{EXP3}$ at time T0, the start time of exposure periods $T_{EXP1}$, $T_{EXP2}$, and $T_{EXP3}$ can be delayed to compensate for the delay of the end time, such that each of exposure periods $T_{EXP0}$-$T_{EXP3}$ can have the same duration. Specifically, the start time of exposure period $T_{EXP1}$ (for photodiode PD1) is delayed with respect to exposure period $T_{EXP0}$ (for photodiode PD0) by $T_{off}$ and becomes T0+$T_{off}$. Moreover, the start time of exposure period $T_{EXP2}$ (for photodiode PD2) is delayed with respect to exposure period $T_{EXP1}$ (for photodiode PD1) by $T_{off}$ and becomes T0+2$T_{off}$. Further, the start time of exposure period $T_{EXP3}$ (for photodiode PD3) is delayed with respect to exposure period $T_{EXP2}$ (for photodiode PD2) by $T_{off}$ and becomes T0+3$T_{off}$.

Although the arrangements in FIG. 13C can improve the uniformity in the durations of the exposure periods of the photodiodes and reduce the offset among the digital outputs, the arrangements in FIG. 13C can lead to motion artifacts and distortions in an image frame of a high-speed moving object. Specifically, as the start time of the exposure periods are shifted, photodiodes PD0-PD3 capture light at different times. When the object is moving between different physical locations at a high speed, different photodiodes may capture different images of the object at the different physical locations for an image frame, which can introduce motion artifacts and distortions.

FIG. 13D illustrates another example sequence of the control signals to mitigate the effect of motion artifacts caused by high-speed moving objects. As shown in FIG. 13D, controller 1308 can control the start time (e.g., based on de-assertion of the RST0, RST1, RST2, and RST3 signals) and the end time (e.g., based on assertion of the TG0, TG1, TG2, and TG3 signals) of exposure periods $T_{EXP0}$, $T_{EXP1}$, $T_{EXP2}$, and $T_{EXP3}$, such that their center points align at the same time Tc. Aligning the centers of the exposure periods can reduce the motion artifacts. This is because the charge generated from an exposure period can represent an average intensity of light received by a photodiode within the exposure period. By aligning the centers of the exposure periods, it becomes more likely that the digital outputs represent the intensities of light captured by the photodiodes at the same time that corresponds to the centers of the exposure periods, rather than the intensities of light captured at different times. As a result, the motion artifacts caused by the different durations of exposure periods can be reduced or at least mitigated.

Specifically, controller 1308 can delay the end time of the exposure period of a photodiode by $T_{off}$ with respect to the exposure period of the preceding photodiode in the sequential accesses to ADC 616, to accommodate for the quantization operations. To align the center points of the exposure periods at time Tc, controller 1308 can set the start time of the exposure period of the photodiode to become earlier than the start time of the exposure period of the preceding photodiode by $T_{off}$. For example, referring to FIG. 13D, the start time of $T_{EXP1}$ ($T_{START1}$) leads the start time of $T_{EXP0}$ ($T_{START0}$) by $T_{off}$, while the end time of $T_{EXP1}$ ($T_{END1}$) lags behind the end time of $T_{EXP0}$ ($T_{END0}$) also by $T_{off}$. Moreover, the start time of $T_{EXP2}$ ($T_{START2}$) leads the start time of $T_{EXP1}$ ($T_{START1}$) by $T_{off}$, while the end time of $T_{EXP2}$ ($T_{END2}$) lags behind the end time of $T_{EXP1}$ ($T_{END1}$) also by $T_{off}$. Further the start time of $T_{EXP3}$ ($T_{START3}$) leads the start time of $T_{EXP2}$($T_{START2}$) by $T_{off}$, while the end time of $T_{EXP3}$ ($T_{END3}$) lags behind the end time of $T_{EXP2}$ ($T_{END2}$) also by $T_{off}$. As a result, the exposure period of each photodiode becomes longer than the exposure period of the preceding photodiode in the sequential accesses to ADC 616 by $2T_{off}$.

In the examples of FIG. 13A and FIG. 13C, various techniques can be applied in the image processing operations to mitigate the effect of offset introduced by the non-uniform exposure periods. In one example, the exposure periods of the photodiodes can be configured based on the quantum efficiencies of the photodiodes. The quantum efficiency can refer to a ratio between a quantity of photons received by a photodiode and a quantity of converted electrons by the photodiode for the photons. For example, referring to FIG. 13E, a photodiode may have different quantum efficiencies with respect to photons of different wavelength ranges. For target wavelength ranges of 500-700 nm (for visible light) and 800-950 nm (for infra-red light), the quantum efficiency can be the lowest for a target wavelength range between 400-500 nm, followed by 500-600 nm, 600 nm-700 nm, and the highest for 800-950 nm.

Based on the target wavelength range of light to be converted by each photodiode, the quantum efficiencies of the photodiodes can be determined, and the exposure periods of the photodiode can be chosen to compensate for the non-uniform quantum efficiencies. For example, a first photodiode having a lower quantum efficiency can be assigned in a lower order in the sequential accesses to ADC 616 compared with a second photodiode having a higher quantum efficiency, such that the first photodiode has a longer exposure period than the second photodiode. In the example of FIG. 13B and FIG. 13D, the longest exposure period $T_{EXP3}$ is assigned to photodiode PD3 which can be selected to detect light of a wavelength range of 400-500 nm, whereas the shortest exposure period $T_{EXP0}$ is assigned to photodiode PD0 which can be selected to detect light of a wavelength range of 800-950 nm. Photodiode PD1 can be selected to detect light of a wavelength range of 600-700 nm, whereas photodiode PD2 can be selected to detect light of a wavelength range of 500-600 nm. The selection can be based on a stack structure (e.g., as shown in FIG. 8A) or an optical filter array (e.g., as shown in FIG. 8B).

In another example, photodiodes PD0, PD1, PD2, and PD3 can be used to detect different components of visible light (e.g., R, Gr, Gb, and B), and a demosaicing operation can be performed in the image processor to reconstruct a color image based on the digital outputs of the photodiodes from each pixel cell. The demosaicing operation can be configured to account for the different durations of the exposure periods of the photodiodes. For example, the image processor can scale the digital outputs from each photodiode with a weight based on the durations of the exposure periods of the photodiodes, with a larger weight assigned to a photodiode having a longer exposure period and a smaller weight assigned to a photodiode having a shorter exposure period, to eliminate or reduce the effect of the offset caused by the different durations of exposure periods.

Figure 14A:
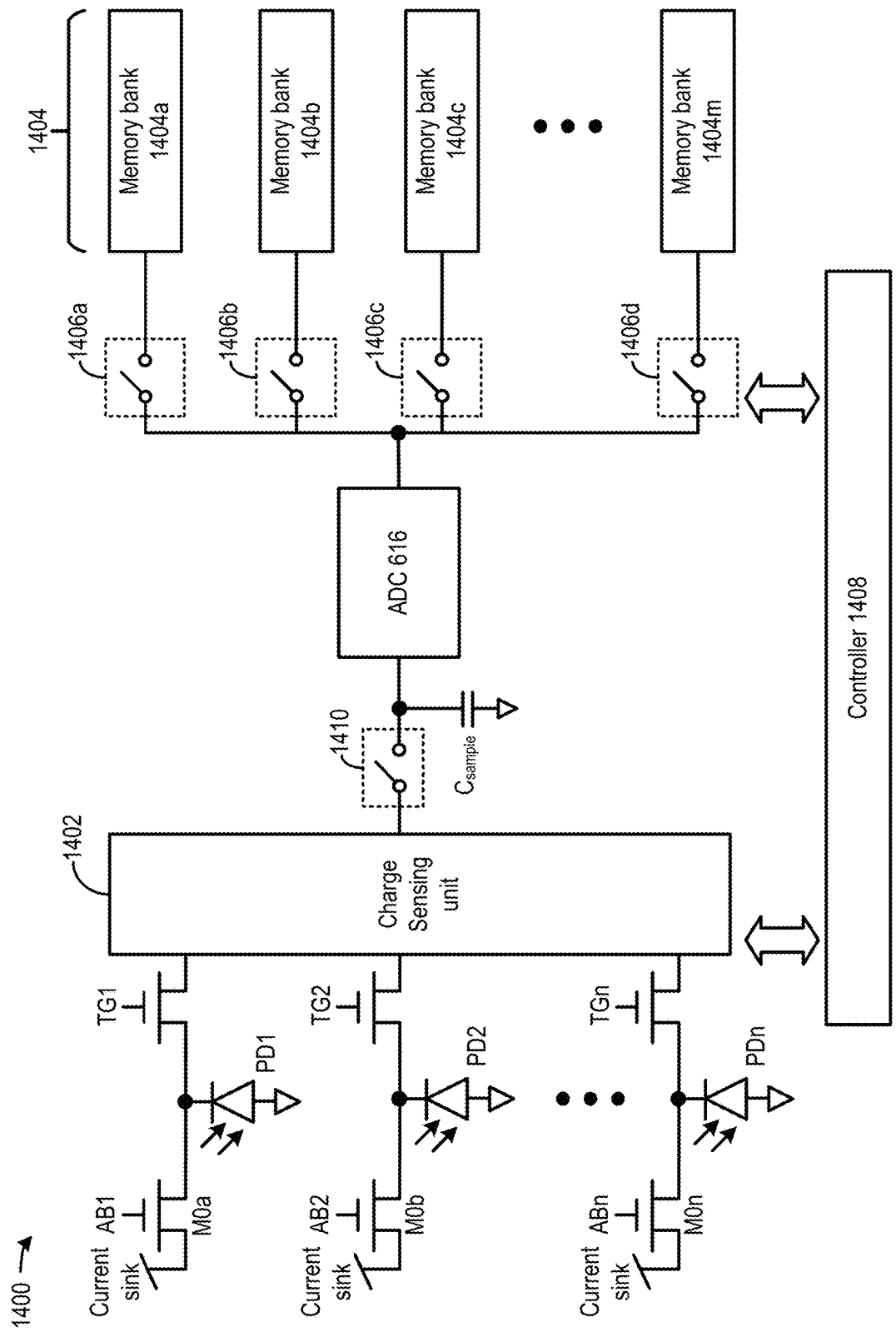
FIG. 14A, FIG. 14B, FIG. 14C, and FIG. 14D illustrate examples of an image sensor and their operations.

FIG. 14A-FIG. 14D illustrate additional techniques to reduce the footprint of an image sensor. FIG. 14A illustrates an example image sensor 1400 having n photodiodes including PD1 . . . PDn, one or more charge sensing units 1402, ADC 616, and a memory 1404 including m multi-bit memory banks (e.g., memory bank 1404a, 1404b, . . . 1404m). The n photodiodes can be part of a pixel cell or can be divided between multiple pixel cells. Moreover, ADC 616 and memory 1404 can be part of a pixel cell or can be shared between multiple pixel cells. Each memory bank can be coupled with a switch 1406 (e.g., switch 1406a for memory bank 1404a, switch 1406b for memory bank 1404b, etc.) to select a particular memory bank for write/read out. Compared with image sensor 1300 of FIG. 13A, image sensor 1400 may include fewer charge sensing units and fewer memory multi-bit memory banks 1404 for the same number of photodiodes, which can further reduce the footprint and power of image sensor 1400. Image sensor 1400 further includes a controller 1408 to control a sequence of control signals (e.g., AB1, AB2, TG1, TG2, etc.) to perform quantization operations and storage of digital outputs for each photodiode.

Figure 14B:
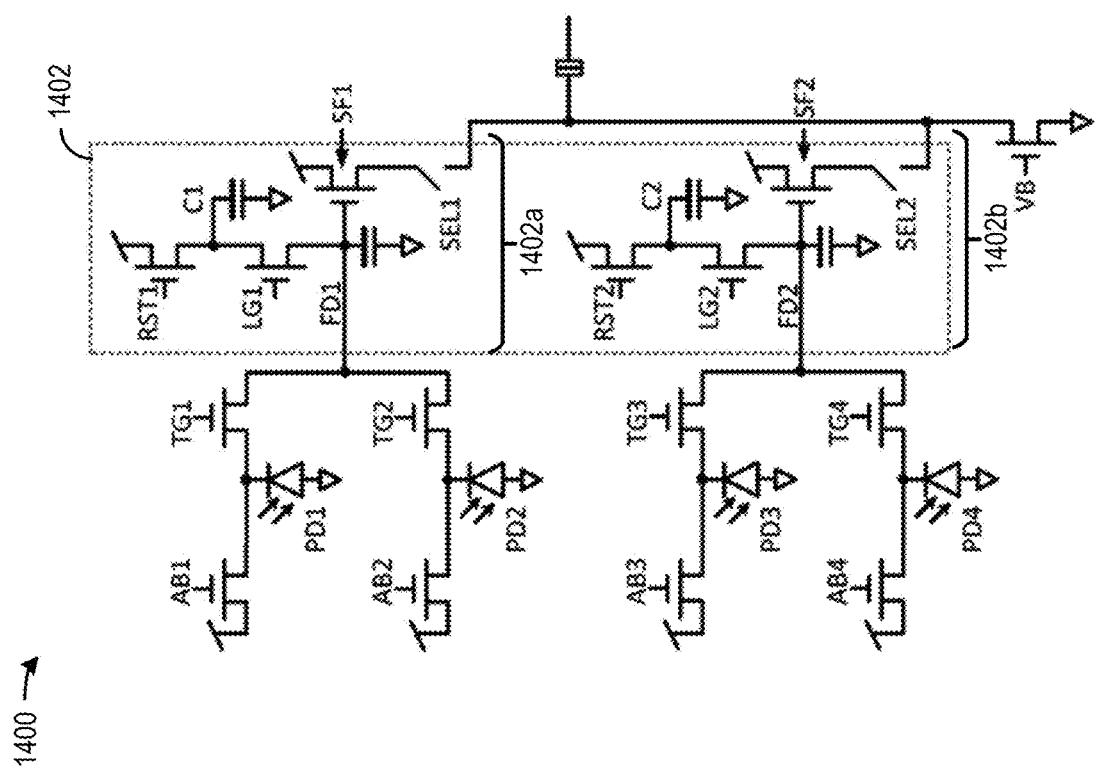
Figure 14C:
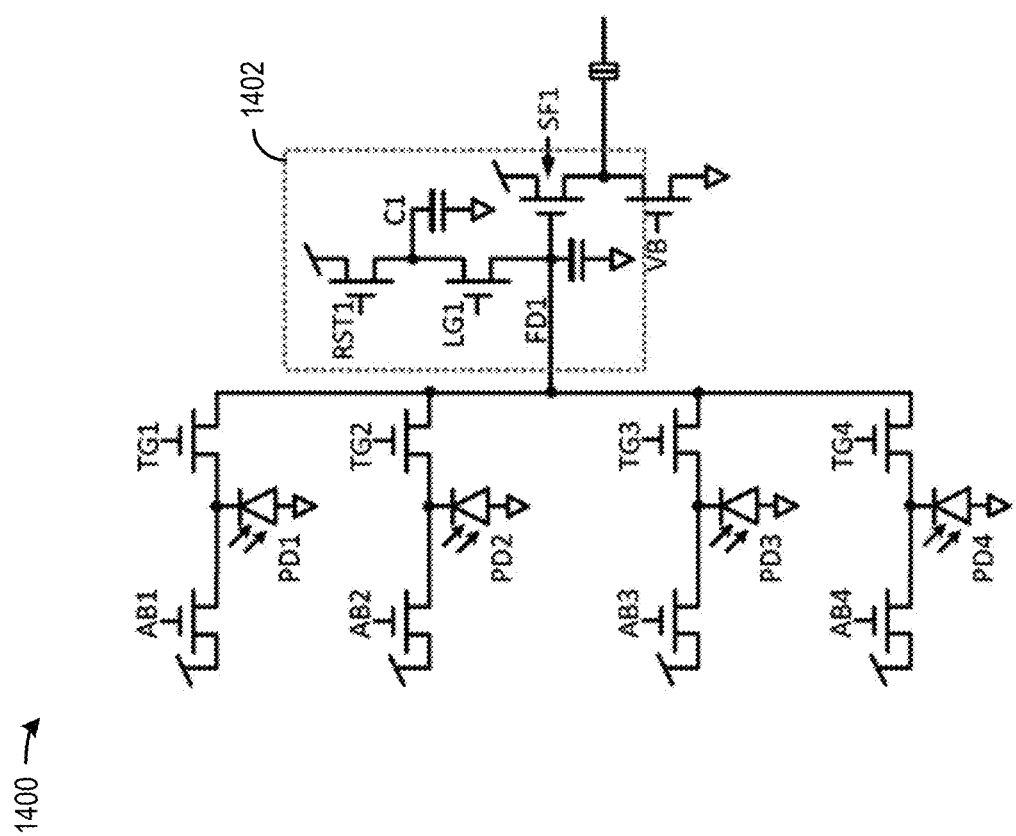

FIG. 14B and FIG. 14C illustrate examples arrangements of charge sensing units 1402. As shown in FIG. 14B, image sensor 1400 may include a plurality of charge sensing units 1402 each shared by a group of photodiodes. For example, one or more charge sensing units 1402 may include a charge sensing unit 1402a shared by a first group of photodiodes including photodiodes PD1 and PD2, and a charge sensing unit 1402b shared by a second group of photodiodes including photodiodes PD3 and PD4. Each photodiode within a group can sequentially access the charge sensing unit (e.g., based on sequential assertion TG1, TG2, TG3, and TG4 signals) to transfer charge for quantization by ADC 616, whereas each charge sensing unit can also sequentially access ADC 616 (e.g., based on assertion of SEL1 and SEL2 signals) to perform the quantization operations.

In the example of FIG. 14B, PD1 can access charge sensing unit 1402a first, followed by PD2, whereas PD3 can access charge sensing unit 1402b first, followed by PD4. Moreover, charge sensing unit 1402a can access ADC 616 first, followed by charge sensing unit 1402b. The first photodiode within each group to access the charge sensing unit of the group (e.g., PD1 for charge sensing unit 1402a, PD3 for charge sensing unit 1402b) can transfer both overflow charge and residual charge to the charge sensing unit and therefore can perform both FD ADC and PD ADC operation, while the first photodiode to access ADC 616 (e.g., PD1) can also perform TTS operation. A photodiode that accesses the charge sensing unit after the first photodiode within the group typically cannot perform FD ADC operation, if its exposure period ends before or when the photodiode is connected to the charge sensing unit of the group.

Referring to FIG. 14C, in some examples, image sensor 1400 may include a single charge sensing unit 1402 shared by all the photodiodes (e.g., PD1-PD4) of image sensor 1400, and the single charge sensing unit 1402 can be coupled with ADC 616. In such a case, each photodiode can sequentially access the single charge sensing unit 1402 and ADC 616 (e.g., based on sequential assertion TG1, TG2, TG3, and TG4 signals) to perform charge transfer and quantization operation. For example, photodiode PD1 can access charge sensing unit 1402 and ADC 616 first, followed by photodiodes PD2, PD3, and PD4. The first photodiode to access charge sensing unit 1402 and ADC 616 (e.g., PD1) can transfer both overflow charge and residual charge to the charge sensing unit and therefore can perform both FD ADC and PD ADC operation. The rest of photodiodes in the pixel cell (e.g., PD2, PD3, and PD4) typically cannot perform FD ADC operation, if the exposure period of the photodiode ends before or when the photodiode is connected to charge sensing unit 1402.

Referring back to FIG. 14A, image sensor 1400 includes a memory 1404 having m memory banks (e.g., memory bank 1404a, 1404b, . . . 1404m). The number of memory banks can be smaller than the number of photodiodes, to further reduce the footprint and power of image sensor 1400. For example, in a case where image sensor 1400 includes four photodiodes (e.g., PD1, PD2, PD3, and PD4), memory 1404 can include a single memory bank, two memory banks, etc. Compared with image sensor 1300 of FIG. 13A where four memory banks are provided to store the digital outputs of four photodiodes PD0-PD3, the footprint and power of image sensor 1400 can be reduced.

As the number of memory banks is smaller than the number of photodiodes, a memory bank can be used to store the digital outputs of multiple photodiodes at different times. For example, a first digital output of a first photodiode can be stored in a memory bank first. The first digital output can be read out from the memory bank and then overwritten with a second digital output of a second photodiode. As ADC 616 needs to wait until the read out of the first digital output completes before performing the quantization operation for the second photodiode, controller 1408 may delay the start of the quantization operation as well as the end of the exposure period of the second photodiode to accommodate for the read out of the first digital output from the memory bank, and the exposure period of the second photodiode may be extended as a result. The read out operation typically includes transfer of the digital output from the memory bank to an external device via buses, and the read out delay can be attributed to the size of the digital output as well as the limited bandwidth of the buses. Because of the read out delay, the duration of the exposure period of the second photodiode can become much longer than the duration of the exposure period of the first photodiode.

To reduce the effect of read out delay on the exposure period, a pixel cell may include a sampling capacitor to temporarily store the analog output of the charge sensing unit. Referring back to FIG. 14A, image sensor 1400 may include a sample and hold (S/H) circuit including a sampling switch 1410 and sampling capacitor $C_{sample}$ to store the analog output of charge sensing unit 1402 during the read out of memory 1404. This enables stopping the exposure period of a photodiode and transferring residual charge from the photodiode to charge sensing unit 1402 for the PD ADC operation during the read out of memory 1404. As a result, the extension of the exposure period of the photodiode can be reduced. The sampling capacitor $C_{sample}$ can be implemented as a metal-to-metal capacitor, such as a metal-insulator-metal (MIM) capacitors, a metal-oxide-metal (MOM) capacitors, etc., which can be stacked between the sensor layer and the ASIC layer to reduce the footprint of the pixel cell.

Figure 14D:
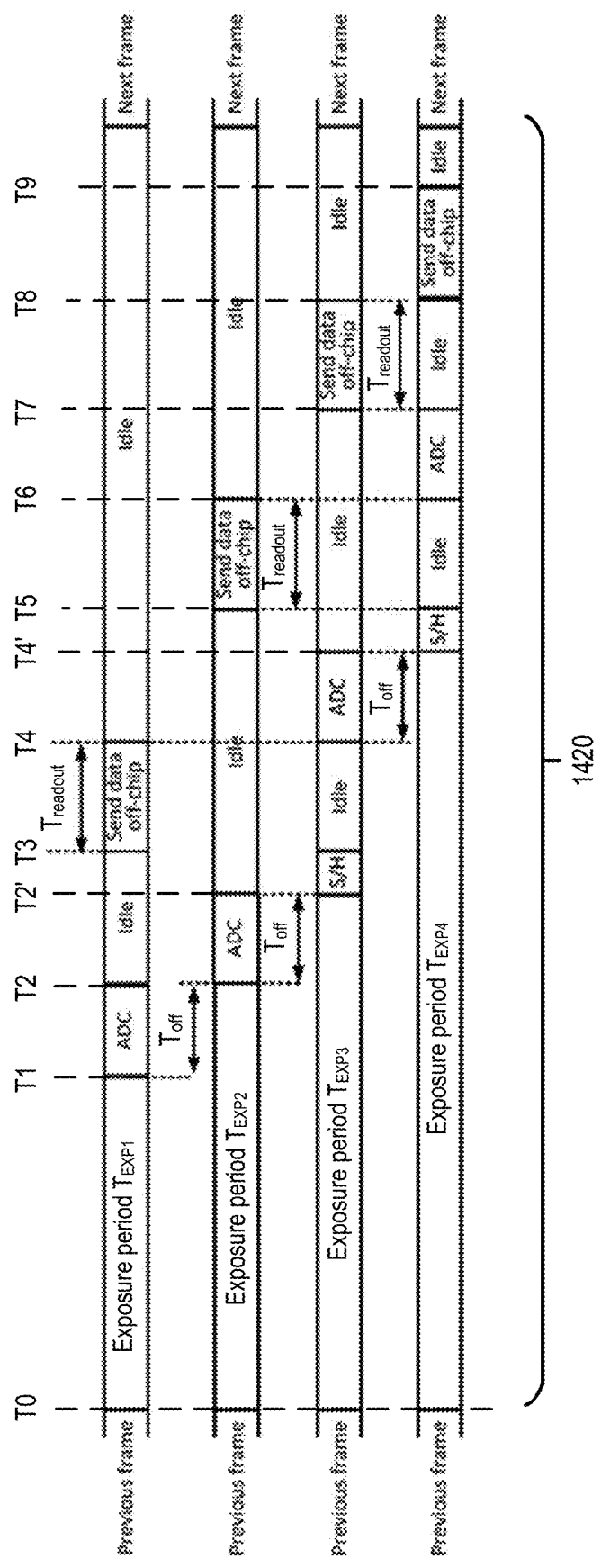

FIG. 14D illustrates an example sequence of operations of image sensor 1400 having four photodiodes PD1-PD4, a single charge sensing unit 1402, a memory 1404 having two memory banks, and a sampling capacitor $C_{sample}$, within a frame period 1420. Controller 1408 can control the sequence/timing of the control signals (e.g., AB1, TG1, AB2, TG2, etc.) to operate the photodiodes, the charge sensing unit, and memory according to the sequence of operations in FIG. 14D.

As shown in FIG. 14D, the exposure periods of photodiodes PD1-PD4, including $T_{EXP1}$ for PD1, $T_{EXP2}$ for PD2, $T_{EXP3}$ for PD3, and $T_{EXP4}$ for PD4, start at the same time T0. The exposure period $T_{EXP1}$ ends at time T1 for PD1. A quantization operation (e.g., TTS) can be performed during the exposure period. Between times T1 and T2, quantization operations (e.g., PD ADC and FD ADC) can be performed to generate a first digital output, followed by the storage of the first digital output at memory bank 1404a. The total duration between times T1 and T2 is labelled $T_{off}$. After the quantization operations complete, the first digital output can be transferred out of memory bank 1404a as part of a first read out operation, between times T3 and T4. The total duration between times T3 and T4 is labelled $T_{readout}$.

Meanwhile, for photodiode PD2, the exposure period $T_{EXP2}$ starts at time T0 and extends to time T2 to accommodate for the quantization operations for PD1, such that $T_{EXP2}$ exceeds $T_{EXP1}$ by $T_{off}$. At time T2, PD2 is coupled with charge sensing unit 1402. A quantization operation (e.g., PD ADC) can then be performed to generate a second digital output between times T2 and T2', followed by the storage of the second digital output at memory bank 1404b. The total duration between times T2 and T2' is $T_{off}$. After the quantization operation completes, the second digital output can be transferred out of memory bank 1404b as part of a second read out operation, between times T5 and T6. The total duration between times T5 and T6 is $T_{readout}$. The second read out operation occurs after the first read out operation completes at time T4.

Moreover, for photodiode PD3, the exposure period $T_{EXP3}$ starts at time T0 and extends to time T2' to accommodate for the quantization operation for PD2, such that $T_{EXP3}$ exceeds $T_{EXP2}$ by $T_{off}$. At time T2', photodiode PD3 can be coupled with charge sensing unit 1402 to transfer residual charge, and a first sample-and-hold operation can be performed to sample and store the output of charge sensing unit 1402 in sampling capacitor $C_{sample}$. But the quantization operation for PD3 to generate a third digital output can only occur after the first read out operation completes, so that memory bank 1404a can be overwritten with the third digital output. Therefore, as shown in FIG. 14D, the quantization operation for the photodiode PD3 starts at time T4 after the first read out operation completes, and ends at time T4' when the third digital output is stored in memory bank 1404a. After the quantization operation completes, the third digital output can be transferred out of memory bank 1404a as part of a third read out operation, between times T7 and T8. The total duration between times T7 and T8 is $T_{readout}$. The third read out operation occurs after the third read out operation completes at time T8.

For photodiode PD4, the exposure period $T_{EXP4}$ starts at time T0 but extends to T4' to accommodate for the quantization operations for PD1, PD2, and PD3, as well as for the first read out operation between times T3 and T4. This is because the sampling capacitor $C_{sample}$ has been used to hold the analog output for PD3 and is not available until the quantization operation for PD3 completes and the third digital output is stored in memory bank 1404a, at time T4'. As a result, the exposure period $T_{EXP4}$ can exceed the exposure period $T_{EXP3}$ for photodiode PD3 by a sum of $T_{readout}$ and $T_{off}$. After the quantization operation for PD3 completes at time T4', PD4 can be coupled with charge sensing unit 1402, and a second sample-and-hold operation can be performed to sample and store the analog output of charge sensing unit 1402 (for PD4) in sampling capacitor $C_{sample}$. Assuming that memory 1404 does not support simultaneous read and write operation, the quantization operation for PD4 to generate a fourth digital output can only occur after the second read out operation completes, so that memory 1404 can process new write operations and memory bank 1404b can be overwritten with the fourth digital output. Therefore, as shown in FIG. 14D, the quantization operation for the photodiode PD4 starts at time T6 after the second read out operation completes, and ends at time T7 when the fourth digital output is stored in memory bank 1404b and right before the third read out operation starts. After the quantization operation completes, the fourth digital output can be transferred out of memory bank 1404b as part of a fourth read out operation, between times T8 and T9. The total duration between times T8 and T9 is $T_{readout}$.

Figure 15A:
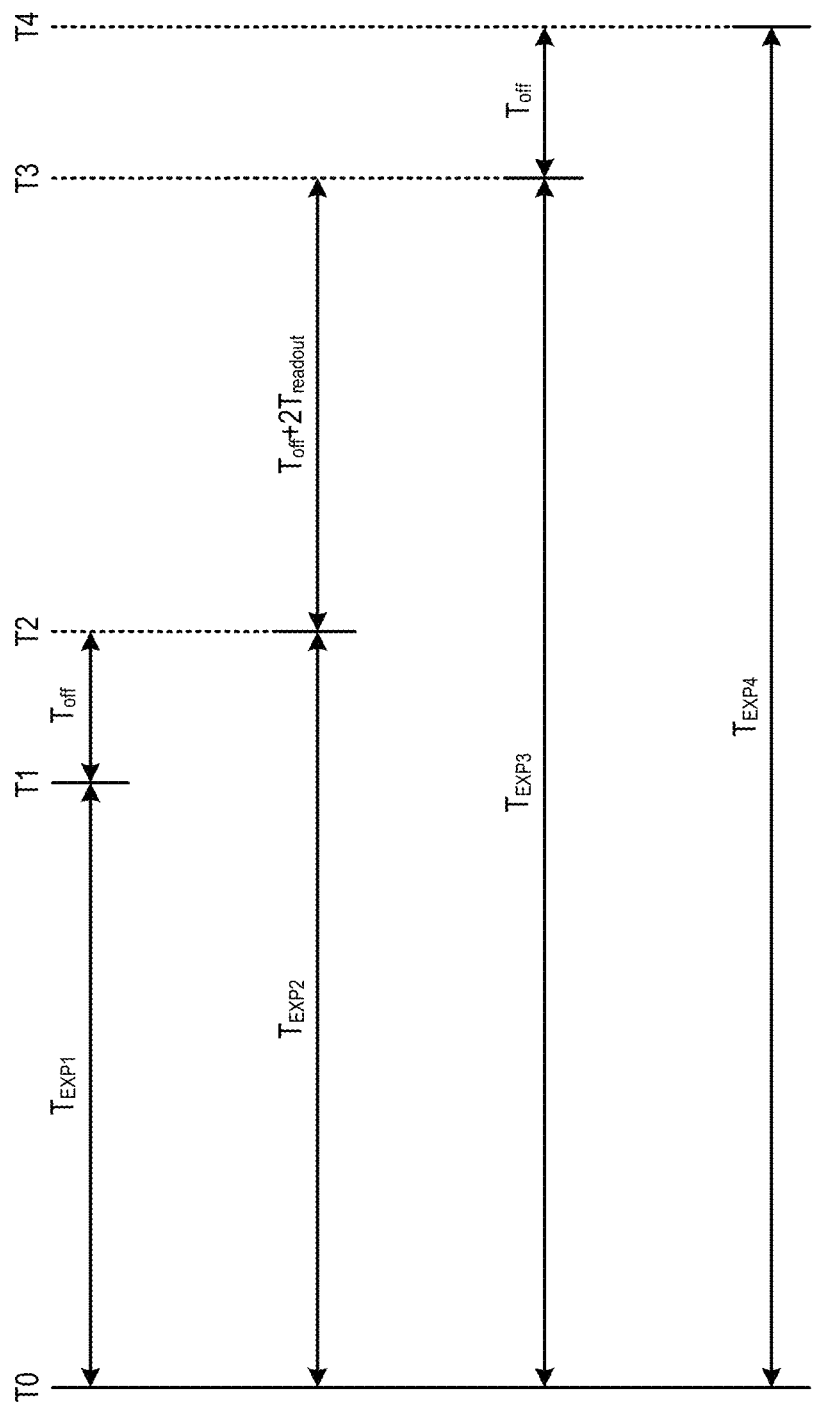
FIG. 15A, FIG. 15B, and FIG. 15C illustrate other example operations of an image sensor.
Figure 15B:
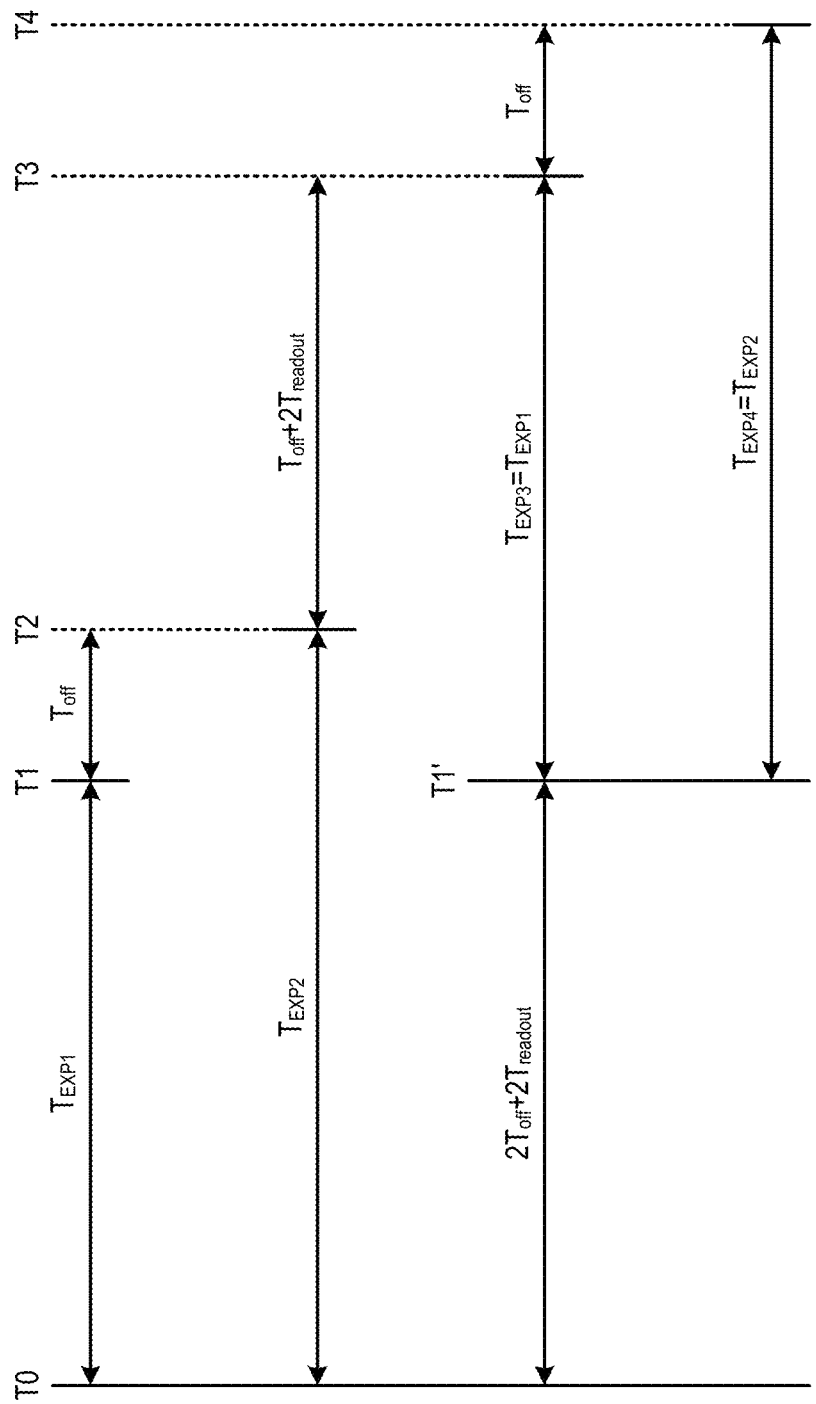
Figure 15C:
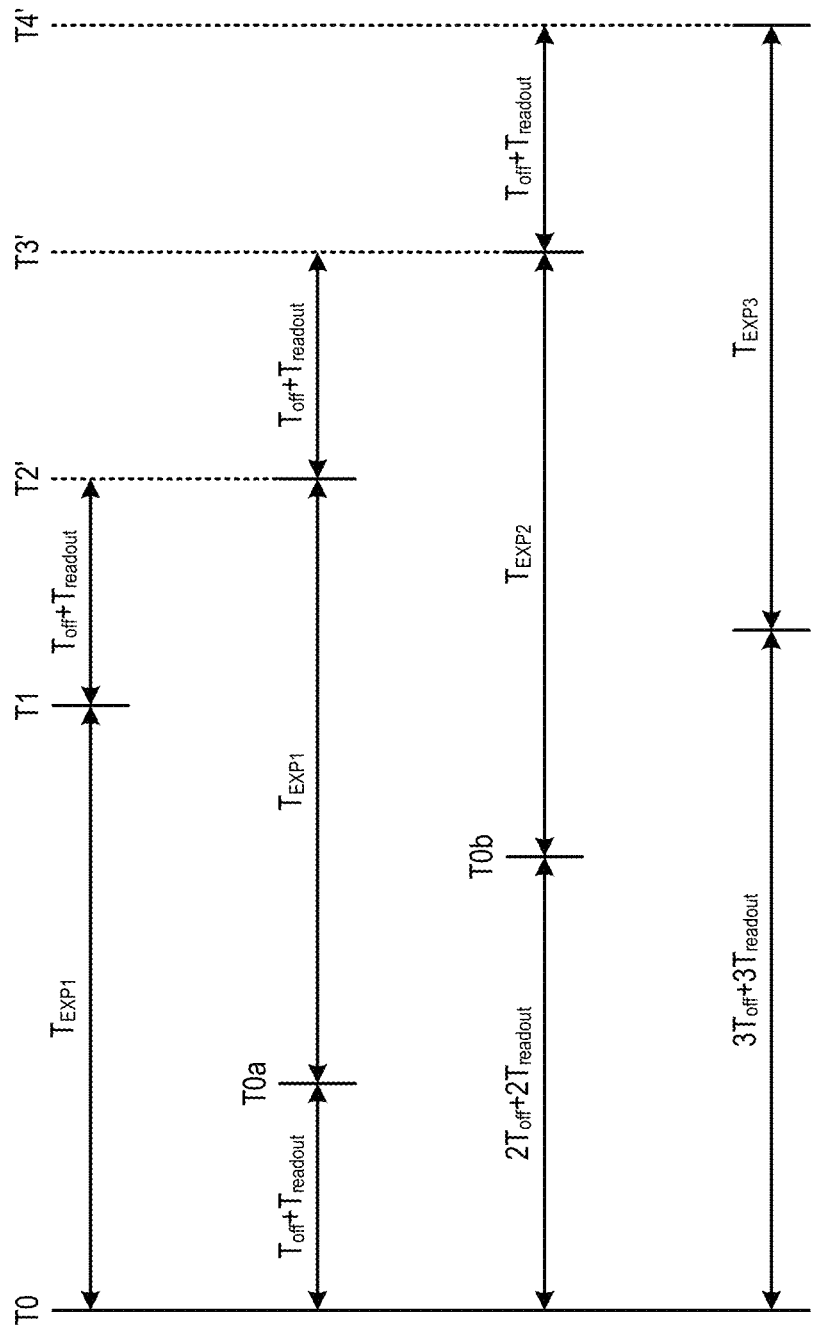

In some examples, to further reduce the footprint of the ASIC layer, memory 1404 of image sensor 1400 can include a single memory bank, as well as sampling switch 1410 and sampling capacitor $C_{sample}$. FIG. 15A-FIG. 15C illustrate different arrangements of exposure periods $T_{EXP1}$ for PD1, $T_{EXP2}$ for PD2, $T_{EXP3}$ for PD3, and $T_{EXP4}$ for PD4 for image sensor 1400 having a single memory bank, sampling switch 1410 and sampling capacitor $C_{sample}$.

As shown in FIG. 15A, the exposure periods of photodiodes PD1-PD4, including $T_{EXP1}$ for PD1, $T_{EXP2}$ for PD2, $T_{EXP3}$ for PD3, and $T_{EXP4}$ for PD4, start at the same time T0. The exposure period $T_{EXP1}$ ends at time T1 for PD1. A quantization operation (e.g., TTS) can be performed during the exposure period. Between times T1 and T2, quantization operations (e.g., PD ADC and FD ADC) can be performed to generate a first digital output, followed by the storage of the first digital output at the single memory bank. The first digital output is then read out and transferred from the single memory bank in a first read out operation.

For photodiode PD2, the exposure period $T_{EXP2}$ starts at time T0 and extends to time T2 to accommodate for the quantization operations for PD1, such that $T_{EXP2}$ exceeds $T_{EXP1}$ by $T_{off}$. At time T2, PD2 is coupled with charge sensing unit 1402, and a first sample-and-hold operation can be performed to store the analog output of charge sensing unit 1402 at the sampling capacitor $C_{sample}$. The quantization operation for PD2 to generate a second digital output starts after first read out operation completes. When the single memory bank becomes available, the quantization operation for PD2 can be performed to generate the second digital output, and the second digital output can be stored at the single memory bank. The second digital output is then read out and transferred from the single memory bank in a second read out operation, which completes at time T3. The duration between times T2 and T3 is about $T_{off}+2T_{readout}$ to account for the first and second read out operations and the quantization operation for photodiode PD2.

For photodiode PD3, the exposure period $T_{EXP3}$ starts at time T0 but extends to T3 until the single memory bank becomes available after the second read out operation completes. The quantization operation for PD3 to generate a third digital output starts at T3 and ends at T4, after which the third digital output is stored in the single memory bank. The duration between times T3 and T4 is $T_{off}$. The third digital output is then read out and transferred from the single memory bank in a third read out operation (not shown in FIG. 15A).

For photodiode PD4, the exposure period $T_{EXP4}$ starts at time T0 and extends to T4 to accommodate for the quantization operation for PD3. At time T4, PD4 is coupled with charge sensing unit 1402, and a second sample-and-hold operation can be performed to store the analog output of charge sensing unit 1402 at the sampling capacitor $C_{sample}$. The quantization operation for PD4 to generate a fourth digital output can start after the third read out operation completes.

FIG. 15B illustrates another example arrangement of exposure periods for photodiodes PD1-PD4. The arrangements of exposure periods of photodiodes PD1 and PD2 are identical to FIG. 15A, in which exposure periods $T_{EXP1}$ and $T_{EXP2}$ start at time T0 and end at, respectively, times T1 and T2. On the other hand, the start time of exposure periods $T_{EXP3}$ and $T_{EXP4}$ can be delayed from time T0 so that the durations of exposure periods $T_{EXP3}$ and $T_{EXP4}$ can be made equal to, respectively, $T_{EXP1}$ and $T_{EXP2}$, to reduce the offset among the digital outputs of PD1-PD4 caused by the non-uniform exposure periods. As shown in FIG. 15B, the start time of exposure periods $T_{EXP3}$ and $T_{EXP4}$ can be at time T1', which is delayed from time T0 by a duration of $2T_{off}+2T_{readout}$, to compensate for the delay of the end time of exposure period $T_{EXP3}$ for accommodating the quantization operations for PD1 and PD2 ($2T_{off}$) and the first and second read out operations ($2T_{readout}$). The arrangements of FIG. 15B allow a pair of channels, such as a pair comprising PD1 and PD2 and another pair comprising PD3 and PD4 to have similar starting and ending time of exposures to reduce offset due to non-uniform exposure periods.

FIG. 15C illustrates another example arrangement of exposure periods for photodiodes PD1-PD4 in which uniform exposure periods among the photodiodes can be achieved. Referring to FIG. 15C, exposure period $T_{EXP1}$ for photodiode PD0 starts at time T0 and ends at time T1, followed by quantization operation and a first read out operation between times T1 and T2'. The total duration between times T1 and T2' is $T_{off}+T_{readout}$.

For PD2, the exposure period $T_{EXP2}$ ends at time T2', and the quantization operation to generate the second digital output also starts at time T2' so that the single memory bank is available to store the second digital output. To make the durations of exposure periods $T_{EXP2}$ and $T_{EXP1}$ equal, the start time of exposure period $T_{EXP2}$ can be delayed from time T0 by $T_{off}+T_{readout}$, at time T0a, to compensate for the delay of the end time of exposure period $T_{EXP2}$. Likewise for PD3 and PD4, the start time of exposure period $T_{EXP3}$ can be delayed from time T0 by $2T_{off}+2T_{readout}$, whereas the start time of exposure period $T_{EXP4}$ can be delayed from time T0 by $3T_{off}+3T_{readout}$, to account for the quantization operation and read out operation by the preceding photodiode.

Figure 16:
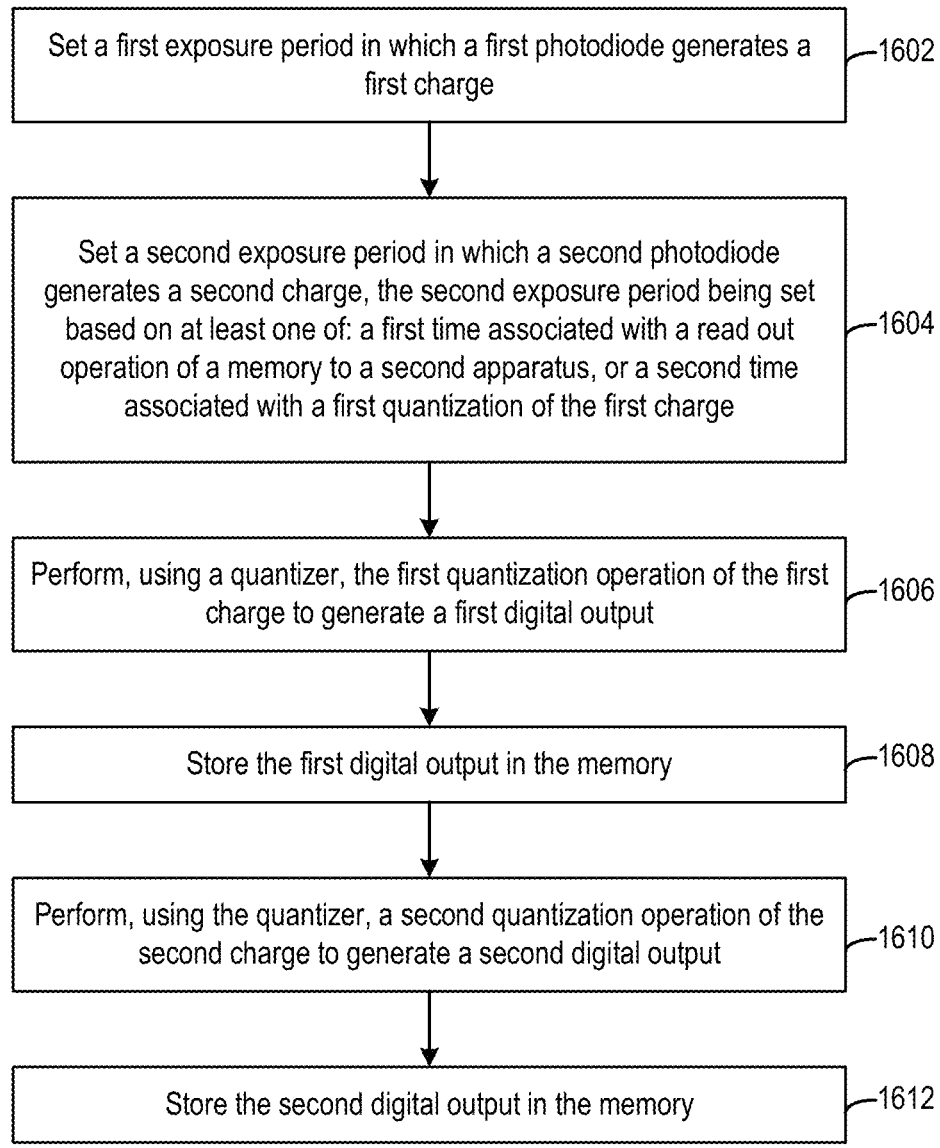
FIG. 16 illustrates a flowchart of an example process for measuring light intensity.

FIG. 16 illustrates a method 1600 for performing a light intensity measurement by multiple photodiodes comprising a first photodiode and a second photodiode. The first photodiode and the second photodiode can be part of an image sensor, such as image sensor 1300 of FIG. 13A, image sensor 1400 of FIG. 14A, etc., each of which can be a pixel cell or can include multiple pixel cells and can include the components of pixel cell 602a as shown in FIG. 8A-FIG. 9. The first photodiode and the second photodiode can be configured to detect incident light components of the same wavelength range or different wavelength ranges. In some examples, the image sensor/pixel cell may include four photodiodes (or more) each configured to detect light of a pre-determined wavelength range.

Each photodiodes can be coupled with a dedicated charge sensing unit, as shown in image sensor 1300 of FIG. 13A, or share a single charge sensing unit, as shown in image sensor 1400 of FIG. 14B-FIG. 14C. Each charge sensing unit comprises a charge storage device (e.g., charge storage device 902) and a switchable buffer (e.g., switchable buffer 904). The charge storage device can include a main capacitor (e.g., $C_{FD}$) and an auxiliary capacitor (e.g., $C_{EXT}$) which can be connected in parallel or disconnected from each other to adjust the capacitance of the charge storage device. The output of the charge sensing unit(s) is coupled with a quantizer (e.g., ADC 616), which can be coupled with a memory which can include one or more memory banks (e.g., memory banks 1304*a*-1304*d*, memory banks 1404*a*-1404*n*, etc.) to store the digital outputs of the quantizer. In some examples, the image sensor can include a sampling capacitor ($C_{sample}$) coupled between the charge sensing unit(s) and the quantizer to sample and hold the output of the charge sensing unit(s) while waiting for the readout of the one or more memory banks to complete, in a case where the one or more memory banks cannot store the digital outputs of all the photodiodes of the image sensor simultaneously. Method 1600 can be performed by a controller such as, for example, controller 1308 and controller 1408 in conjunction with other components of image sensor 1300 or image sensor 1400.

Method 1600 starts with step 1602, in which the controller sets a first exposure period in which the first photodiode generates a first charge. In some examples, as shown in FIG. 13A, the first exposure period can be started based on a combination of setting a bias of the transfer transistor (e.g., M0*a*-*d*) and releasing the reset (e.g., RST0-3) in FIG. 13A. In some examples, as shown in FIG. 14A, a first shutter switch is coupled between the first photodiode and a charge sink, and the first shutter switch can be switched off to expose the first photodiode to the incident light to generate the first charge, and the switching off of the first shutter switch can begin an exposure period. The controller can end the first exposure period by, for example, resetting the first photodiode (via transfer transistors M0*a*-*d*), or enabling the first shutter switch (as in FIG. 14A), etc. The first photodiode can accumulate at least a part of the first charge as first residual charge while transferring the rest of the first charge as first overflow charge to the charge sensing unit.

In step 1604, the controller sets a second exposure period in which the second photodiode generates a second charge. The controller can set the second exposure period based on the first exposure period and at least one of: a first time associated with a read out operation of the memory to a second apparatus, or a second time associated with a quantization operation at the quantizer. The second photodiode can accumulate the second charge as second residual charge. In a case where the second photodiode has a dedicated charge sensing unit separated from the first photodiode, the second photodiode can accumulate at least a part of the second charge as second residual charge while transferring the rest of the second charge as second overflow charge to the charge sensing unit. The controlling of the second exposure period can be based on controlling a second shutter switch and/or resetting of the second photodiode, as described above.

In some examples, as shown in FIG. 13B and FIG. 14D, the controller can set the start time of the second exposure period to be the same as the start time of the first exposure period, while delaying the end time of the second exposure period with respect to the end time of the first exposure period based on the first time ($T_{readout}$ in FIG. 15A-FIG. 15C), the second time ($T_{off}$), or a combination of both.

Specifically, as shown in FIG. 13B, FIG. 14D, and FIG. 15A-FIG. 15B (e.g., first exposure period being $T_{EXP1}$ and second exposure period being $T_{EXP2}$), in a case where the memory includes enough capacity to store the digital outputs of both the first photodiode and the second photodiode simultaneously, or that a sampling capacitor can temporarily hold the output of the charge sensing unit, the delay of the end time of the second exposure period with respect to the end time of the first exposure period can be set based on the second time $T_{off}$, to allow the quantizer to complete the quantization operation for the charge sensing unit output of the first photodiode and storing the digital output at the memory, before ending the second exposure period.

Moreover, as shown in FIG. 14D and FIG. 15A-FIG. 15C (e.g., first exposure period being $T_{EXP2}$ and second exposure period being $T_{EXP3}$), the combination of the memory and/or the sampling capacitor may be unable to store the digital outputs of all the photodiodes of the image sensor. In such a case, the delay of the end time of the second exposure period with respect to the end time of the first exposure period can be set based on a sum of the first time $T_{readout}$ and the second time $T_{off}$, to allow the memory to be read out to free up space for storing the digital output of the second photodiode. In a case where multiple readout operations are performed to the memory prior to the quantization operation of the second photodiode, such as in a case where a number of photodiodes including the first photodiode accesses the quantizer and the memory prior to the second photodiode, as shown in FIG. 15B, the delay can be based on a sum of second time $T_{off}$ and a multiple of first times $T_{readout}$.

In some examples, the controller can also shift the start time of the second exposure period with respect to the first exposure period. In some examples, the shifting can include delaying the start time of the second exposure period with respect to the start time of the first exposure period, to reduce the differences in the durations of the first and second exposure periods, as shown in FIG. 13C, FIG. 15B, and FIG. 15C. The delay in the start time can be based on, for example, the second time, or the sum of the first time and the second time, to match the delay in the end time. In some examples, the controller can also set the start time of the second exposure period to become earlier than the first exposure period, so that the centers of the first exposure period and the second period can be aligned as shown in FIG. 13D. As explained above, by aligning the centers of the exposure periods, it becomes more likely that the digital outputs represent the intensities of light captured by the photodiodes at the same time that corresponds to the centers of the exposure periods, rather than the intensities of light captured at different times. As a result, the motion artifacts caused by the different durations of exposure periods can be reduced or at least mitigated.

In step 1606, the controller can control the quantizer to perform a first quantization operation of the first charge to generate a first digital output. The first quantization operation can be based on quantizing a voltage at the charge sensing unit. The first quantization operation may include, for example, time-to-saturation (TTS) measurement to determine whether the first overflow charge saturates the charge storage device of the charge sensing unit during the first exposure period and a time to saturation, a PD ADC operation to measure a quantity of the first residual charge accumulated by the first photodiode during the first exposure period, and a FD ADC operation to measure a quantity of the first overflow charge. The TTS measurement can be performed during the first exposure period, whereas the PD ADC operation can be performed after the first exposure period. The FD ADC operation can be performed during the first exposure period (as shown in FIG. 12A) or after the first exposure period (as shown in FIG. 12B). A first digital output can be generated from the one of the outputs of the TTS, FD ADC, and PD ADC operation based on whether the first overflow charge (if any) saturates the charge storage device of the charge sensing unit, and whether the first photodiode is saturated by the first residual charge during the first exposure period.

In step 1608, the controller can store the first digital output in the memory. The storage of the first digital output in the memory can be controlled by, for example, the comparator output of the quantizer.

In step 1610, the controller can control the quantizer to perform a second quantization operation of the second charge to generate a digital output. The second quantization operation can be based on quantizing a voltage at the charge sensing unit. In a case where the second photodiode has a dedicated charge sensing unit (e.g., as shown in FIG. 13A), the quantizer can perform FD ADC and PD ADC operation on the second charge. In a case where the second photodiode shares the charge sensing unit with the first photodiode (or other photodiodes), the quantizer can perform PD ADC operation on the second charge. The second quantization operation is performed after the first quantization operation completes.

In step 1612, the controller can store the second digital output in the memory. The storage of the second digital output in the memory can be controlled by, for example, the comparator output of the quantizer. In a case where the memory does not have sufficient capacity to store both the first and second digital output simultaneously, the controller can perform the second quantization operation and store the second digital output in the memory after the read out operation of the memory for the first digital output completes.

Some portions of this description describe the examples of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some examples, a software module is implemented with a computer program product comprising a computer-readable medium containing computer program code, which can be executed by a computer processor for performing any or all of the steps, operations, or processes described.

Examples of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Examples of the disclosure may also relate to a product that is produced by a computing process described herein. Such a product may comprise information resulting from a computing process, where the information is stored on a non-transitory, tangible computer readable storage medium and may include any example of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the examples is intended to be illustrative, but not limiting, of the scope of the disclosure, which is set forth in the following claims.

What is claimed is:

1. An apparatus comprising:
   a first photodiode;
   a second photodiode;
   a quantizer;
   a memory;
   a controller configured to:
      set a first exposure period in which the first photodiode generates a first charge;
      set a second exposure period in which the second photodiode generates a second charge, the second exposure period being set based on:
         the first exposure period; and
         at least one of:
            a first time associated with a read out operation of the memory to a second apparatus, or
            a second time associated with a quantization operation by the quantizer;
      perform, using the quantizer, a first quantization operation of the first charge to generate a first digital output; and
      perform, using the quantizer, a second quantization operation of the second charge to generate a second digital output.

2. The apparatus of claim 1, wherein the memory includes sufficient capacity to store both the first digital output and the second digital output simultaneously; and
   wherein the controller is configured to set an end time of the second exposure period to lag behind an end time of the first exposure period by a delay based on the first time.

3. The apparatus of claim 2, wherein the controller is configured to set a start time of the second exposure period to lag behind a start time of the first exposure period by a delay based on the first time.

4. The apparatus of claim 2, wherein the controller is configured to:
   set a start time of the second exposure period to lead a start time of the first exposure period by a duration based on the first time; and
   set an end time of the second exposure period to lag behind an end time of the first exposure period by a delay based on the first time.

5. The apparatus of claim 1, wherein the controller is configured to set an end time of the second exposure period to lag behind an end time of the first exposure period by a delay based on the first time.

6. The apparatus of claim 1, wherein the memory does not sufficient capacity to store both the first digital output and the second digital output simultaneously; and
  wherein the controller is configured to set an end time of the second exposure period to lag behind an end time of the first exposure period by a delay based on a sum of the first time and the second time.

7. The apparatus of claim 1, wherein the controller is configured to set a start time of the second exposure period to lag a start time of the first exposure period by a delay based on the sum of the first time and the second time.

8. The apparatus of claim 1, wherein:
  the first photodiode and the second photodiode are part of a pixel cell;
  the first photodiode is configured to detect light of a first wavelength range from a spot of a scene;
  the second photodiode is configured to detect light of a second wavelength range from the same spot; and
  the first digital output of the first photodiode and the second digital output of the second photodiode from the same pixel of a first image frame and a second image frame, the first image frame being associated with the first wavelength range and the second image frame being associated with the second wavelength range.

9. A system comprising:
  a head-mounted display, wherein the head-mounted display comprises:
    an image sensor comprising a first photodiode and a second photodiode;
    a quantizer;
    a memory; and
    a controller configured to:
      set a first exposure period in which the first photodiode generates a first charge;
      set a second exposure period in which the second photodiode generates a second charge, the second exposure period being set based on:
        the first exposure period; and
        at least one of:
          a first time associated with a read out operation of the memory to a second apparatus, or
          a second time associated with a quantization operation by the quantizer;
      perform, using the quantizer, a first quantization operation of the first charge to generate a first digital output; and
      perform, using the quantizer, a second quantization operation of the second charge to generate a second digital output.

10. The system of claim 9, wherein the memory includes sufficient capacity to store both the first digital output and the second digital output simultaneously; and
  wherein the controller is configured to set an end time of the second exposure period to lag behind an end time of the first exposure period by a delay based on the first time.

11. The system of claim 10, wherein the controller is configured to set a start time of the second exposure period to lag behind a start time of the first exposure period by a delay based on the first time.

12. The system of claim 10, wherein the controller is configured to:
  set a start time of the second exposure period to lead a start time of the first exposure period by a duration based on the first time; and
  set an end time of the second exposure period to lag behind an end time of the first exposure period by a delay based on the first time.

13. The system of claim 9, wherein the controller is configured to set an end time of the second exposure period to lag behind an end time of the first exposure period by a delay based on the first time.

14. The system of claim 9, wherein the controller is configured to set a start time of the second exposure period to lag a start time of the first exposure period by a delay based on the sum of the first time and the second time.

15. The system of claim 9, wherein the image sensor further includes a third photodiode and a fourth photodiode; and
  wherein the controller is configured to:
    set a start time of the first exposure period and the second exposure period at a third time;
    set an end time of the second exposure period, the end time of the second exposure period being delayed from end time of the first exposure period by duration based on the second time;
    set a start time of a third exposure period in which the third photodiode generates a third charge and a fourth exposure period in which the fourth photodiode generates a fourth charge at a fourth time, the fourth time being delayed from the third time based on a sum of the first time and the second time; and
    set an end time of the fourth exposure period, the end time of the fourth exposure period being delayed from end time of the third exposure period by the duration.

16. The system of claim 9, wherein the image sensor further includes a third photodiode and a fourth photodiode; and
  wherein the controller is configured to:
    set a start time and end time of the second exposure period to be delayed from, respectively, a start time and an end time of the first exposure period by a duration based on a sum of the first time and the second time;
    set a start time and end time of a third exposure period in which the third photodiode generates a third charge to be delayed from, respectively, a start time and an end time of the second exposure period by the duration; and
    set a start time and end time of a fourth exposure period in which the fourth photodiode generates a fourth charge to be delayed from, respectively, a start time and an end time of the third exposure period by the duration.

17. The system of claim 9, wherein:
  the first photodiode and the second photodiode are part of a pixel cell;
  the first photodiode is configured to detect light of a first wavelength range from a spot of a scene;
  the second photodiode is configured to detect light of a second wavelength range from the same spot; and
  the first digital output of the first photodiode and the second digital output of the second photodiode from the same pixel of a first image frame and a second image frame, the first image frame being associated with the first wavelength range and the second image frame being associated with the second wavelength range.

18. A non-transitory computer-readable storage medium storing a plurality of instructions executable by one or more processors, the plurality of instructions when executed by the one or more processors cause the one or more processors to:
- set a first exposure period in which a first photodiode generates a first charge;
- set a second exposure period in which a second photodiode generates a second charge, the second exposure period being set based on:
  - the first exposure period; and
  - at least one of:
    - a first time associated with a read out operation of a memory, or
    - a second time associated with a quantization operation of a quantizer;
- perform, using the quantizer, a first quantization operation of the first charge to generate a first digital output;
- store the first digital output in the memory;
- perform, using the quantizer, a second quantization operation of the second charge to generate a second digital output; and
- store the second digital output in the memory.

19. The non-transitory computer-readable storage medium of claim 18, wherein the memory includes sufficient capacity to store both the first digital output and the second digital output simultaneously; and
- wherein an end time of the second exposure period is set to lag behind an end time of the first exposure period by a duration based on the first time.

20. The non-transitory computer-readable storage medium of claim 19, wherein a start time of the second exposure period is set to lead a start time of the first exposure period by a duration based on the first time.

* * * * *